United States Patent
Wu et al.

(10) Patent No.: US 11,538,862 B2
(45) Date of Patent: Dec. 27, 2022

(54) THREE-DIMENSIONAL MEMORY DEVICE AND MANUFACTURING METHOD THEREOF

(71) Applicant: Taiwan Semiconductor Manufacturing Co., Ltd., Hsin-Chu (TW)

(72) Inventors: Chao-I Wu, Zhubei (TW); Yu-Ming Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 120 days.

(21) Appl. No.: 17/108,243

(22) Filed: Dec. 1, 2020

(65) Prior Publication Data

US 2021/0399048 A1    Dec. 23, 2021

Related U.S. Application Data

(60) Provisional application No. 63/040,798, filed on Jun. 18, 2020.

(51) Int. Cl.
*H01L 27/24* (2006.01)
*H01L 45/00* (2006.01)

(52) U.S. Cl.
CPC ........ *H01L 27/249* (2013.01); *H01L 27/2454* (2013.01); *H01L 45/1683* (2013.01)

(58) Field of Classification Search
CPC ............... H01L 27/249; H01L 27/2454; H01L 45/1683; H01L 45/04; H01L 45/06;
(Continued)

(56) References Cited

U.S. PATENT DOCUMENTS

2003/0213982 A1   11/2003   Kim
2007/0152255 A1    7/2007   Seo et al.
(Continued)

FOREIGN PATENT DOCUMENTS

KR    20020008469 A    1/2002

OTHER PUBLICATIONS

Intermolecular "NVM Memories: A Look at the Advantages of ALD Chalcogenides" The date of publication is unknown. Retrieved online on Jul. 7, 2021 from https://intermolecular.com/company/news/nvm-memories-look-advantages-ald-chalcogenides/.

*Primary Examiner* — Allison Bernstein
(74) *Attorney, Agent, or Firm* — Eschweiler & Potashnik, LLC

(57) ABSTRACT

A three-dimensional memory device includes a stacking structure, memory pillars, and conductive pillars. The stacking structure includes stacking layers stacked along a vertical direction, each stacking layer including a gate layer, a gate dielectric layer, and a channel layer. The gate layer, the gate dielectric layer, and the channel layer extend along a horizontal direction, and the gate dielectric layer is disposed between the gate layer and the channel layer. The memory pillars extend along the vertical direction and are laterally separated and in contact with the channel layer of each stacking layer. Each memory pillar comprises a first electrode, a second electrode, and a switching layer between the first and second electrodes. The conductive pillars extend along the vertical direction and are laterally separated and in contact with the channel layer of each stacking layer. The memory pillars and the conductive pillars are alternately arranged along the horizontal direction.

20 Claims, 29 Drawing Sheets

(58) Field of Classification Search
CPC . H01L 45/1226; H01L 45/144; H01L 45/146; H01L 27/2436; H01L 27/11587; H01L 27/1159; H01L 27/11597; H01L 27/2481; H01L 27/10805; H01L 45/1206; H01L 45/122; H01L 45/16
See application file for complete search history.

(56) References Cited

U.S. PATENT DOCUMENTS

| | | |
|---|---|---|
| 2010/0237312 A1 | 9/2010 | Seol et al. |
| 2014/0016403 A1 | 1/2014 | Wu et al. |
| 2015/0295012 A1 | 10/2015 | Ito et al. |
| 2017/0125484 A1 | 5/2017 | Pellizzer |
| 2017/0271402 A1 | 9/2017 | Chen et al. |
| 2020/0083225 A1 | 3/2020 | Ma et al. |
| 2020/0161309 A1 | 5/2020 | Asami |
| 2021/0399014 A1* | 12/2021 | Wu .................. H01L 27/11587 |
| 2022/0028930 A1* | 1/2022 | Wu .................. H01L 27/11507 |

* cited by examiner

US 11,538,862 B2

THREE-DIMENSIONAL MEMORY DEVICE AND MANUFACTURING METHOD THEREOF

REFERENCE TO RELATED APPLICATION

This Application claims the benefit of U.S. Provisional Application No. 63/040,798, filed on Jun. 18, 2020. The contents of the above-referenced application are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional (3D) memory device has been introduced to replace a planar memory device. However, 3D memory device has not been entirely satisfactory in all respects, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 13A are schematic top views of structures produced at various stages of a manufacturing method of a three-dimensional memory device in accordance with some embodiments of the disclosure.

FIG. 1B to FIG. 13B are schematic cross-sectional views along the lines A-A' shown in FIG. 1A to FIG. 13A, respectively.

FIG. 4C to FIG. 13C are schematic plan views along the lines B-B' shown in FIG. 4B to FIG. 13B, respectively.

FIG. 8D to FIG. 13D are schematic cross-sectional views along the lines D-D' shown in FIG. 8A to FIG. 13A, respectively.

DETAILED DESCRIPTION

Figure 1A:
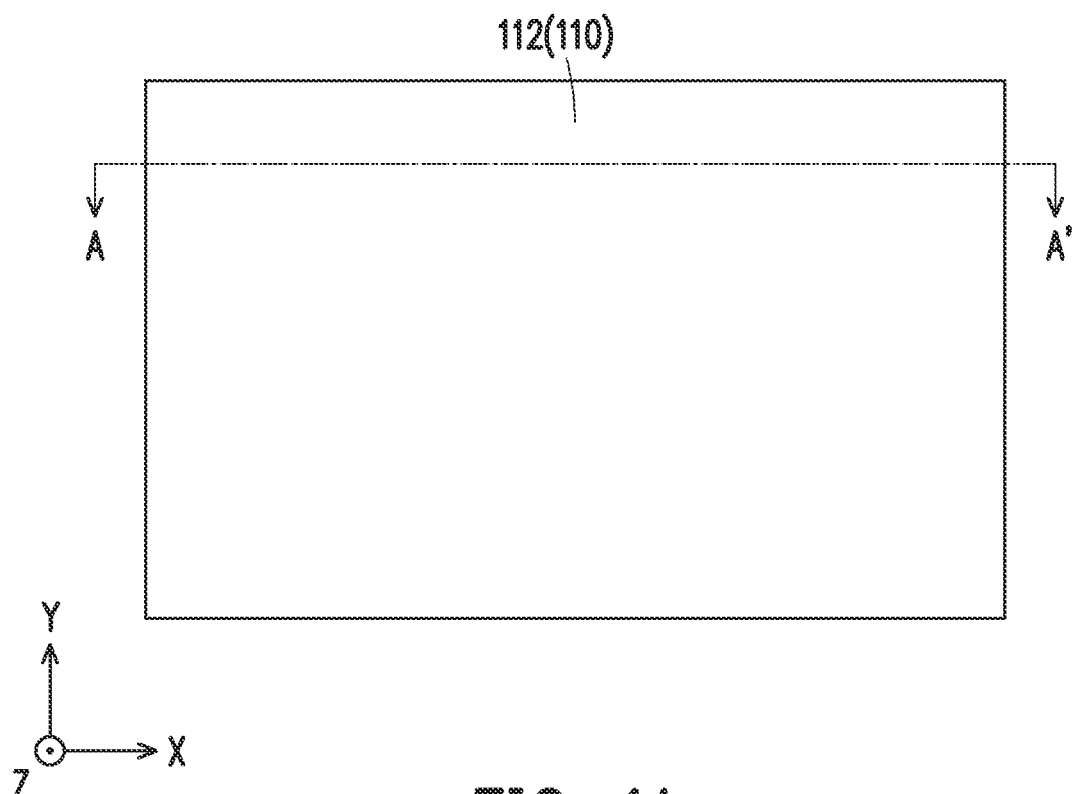

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 13A are schematic top views of structures produced at various stages of a manufacturing method of a three-dimensional memory device 10 in accordance with some embodiments of the disclosure. FIG. 1B to FIG. 13B are schematic cross-sectional views along the lines A-A' shown in FIG. 1A to FIG. 13A, respectively. FIG. 4C to FIG. 13C are schematic plan views along the lines B-B' shown in FIG. 4B to FIG. 13B, respectively. FIG. 8D to FIG. 13D are schematic cross-sectional views along the lines D-D' shown in FIG. 8A to FIG. 13A, respectively.

Figure 1B:
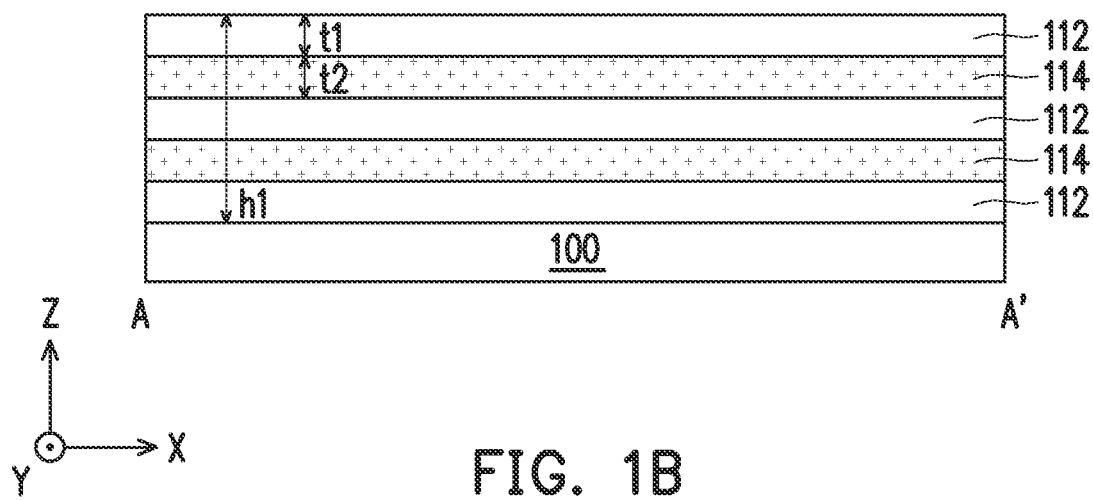

Referring to FIG. 1A and FIG. 1B, a multilayer stack 110 is formed on the substrate 100. The multilayer stack 110 includes insulating layers 112 and sacrificial layers 114. As shown in FIG. 1B, the insulating layers 112 and the sacrificial layers 114 are alternately stacked on the substrate 100 along a direction Z. That is to say, the insulating layers 112 and the sacrificial layers 114 are vertically alternately stacked on the substrate 100. In detail, the insulating layers 112 are spaced apart from one another by the sacrificial layers 114 along the direction Z. That is to say, the insulating layers 112 are vertically spaced apart from one another by the sacrificial layers 114. From another point of view, each sacrificial layer 114 is sandwiched between an underlying insulating layer 112 and an overlying insulating layer 112. Further, the sacrificial layers 114 will be replaced by gate layers 118 in the subsequent steps to be described with reference to FIGS. 11A-11D and FIGS. 12A-12D. Although three insulating layers 112 and two sacrificial layers 114 are presented in FIG. 1B for illustrative purposes, those skilled in the art can understand that the number of the insulating layers 112 and the number of the sacrificial layers 114 may be more than what are depicted in FIG. 1B, and may be designated based on demand and/or design layout.

In some embodiments, the material of the insulating layers 112 has a sufficient etching selectivity with respect to the material of the sacrificial layers 114, such that the insulating layers 112 could remain substantially intact during removal of the sacrificial layers 114 in the subsequent step as to be described with reference to FIGS. 11A-11D. In some embodiments, the insulating layers 112 are made of silicon oxide, while the sacrificial layers 114 are made of silicon nitride. However, those skilled in the art may select other suitable materials for the insulating layers 112 and the sacrificial layers 114 according to process requirements. In some alternative embodiments, the material of the insulating layers 112 may be selected from silicon nitride, silicon oxynitride, phosphosilicate glass (PSG), borosilicate glass (BSG) or boron-doped phosphosilicate glass (BPSG), and the material of the sacrificial layers 114 may be selected from silicon oxide, silicon oxynitride, PSG, BSG or BPSG. In some embodiments, the insulating layers 112 have the same dielectric material, such as silicon oxide. However, the embodiments of the present disclosure are not limited thereto. In some alternative embodiments, the insulating layers 112 may have different dielectric materials. Similarly, in some embodiments, the sacrificial layers 114 have the same dielectric material, such as silicon nitride. However, the embodiments of the present disclosure are not limited thereto. In some alternative embodiments, the sacrificial layers 114 may have different dielectric materials. In some embodiments, the method for forming each of the insulating layers 112 and the sacrificial layers 114 includes a deposition process, such as a chemical vapor deposition (CVD) process, or an atomic layer deposition (ALD) process.

In some embodiments, the substrate 100 is an etching stop layer formed over a complementary metal-oxide-semiconductor (CMOS) integrated circuit. In these embodiments, the material of the substrate 100 has a sufficient etching selectivity with respect to the materials in the multilayer stack 110. In these embodiments, the material of the substrate 100 includes silicon carbide, silicon oxynitride, silicon oxycarbide, silicon carbonitride, silicon oxide, or silicon nitride. In some embodiments where the insulating layers 112 and the sacrificial layers 114 are made of silicon oxide and silicon nitride, the material of the substrate 100 is formed of silicon carbide. However, the disclosure is not limited thereto. In some alternative embodiments, the substrate 100 is a semiconductor wafer or a semiconductor-on-insulator (SOI) wafer.

In some embodiments, along the direction Z, the insulating layers 112 has a thickness t1 in the range of about 15 nm to about 90 nm, and the sacrificial layers 114 has a thickness t2 in the range of about 15 nm to about 90 nm. In some embodiments, the insulating layers 112 are formed to a different thickness than the sacrificial layers 114. In some alternative embodiments, the insulating layers 112 are formed to the same thickness as the sacrificial layers 114. For example, the thickness t2 of the sacrificial layers 114 is from about 50% to about 200% greater than or less than the thickness t1 of the insulating layers 112. In some embodiments, the multilayer stack 110 has an overall height h1 in the range of about 1000 nm to about 10000 nm along the direction Z.

Figure 2A:
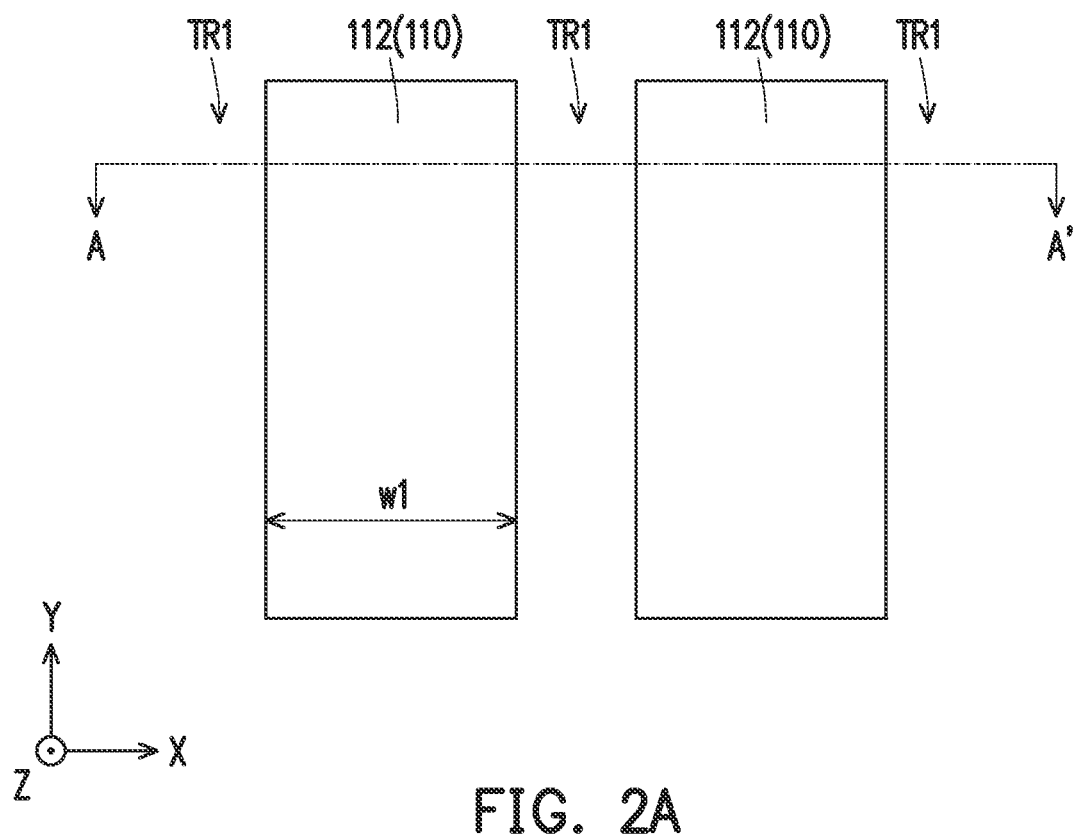
Figure 2B:
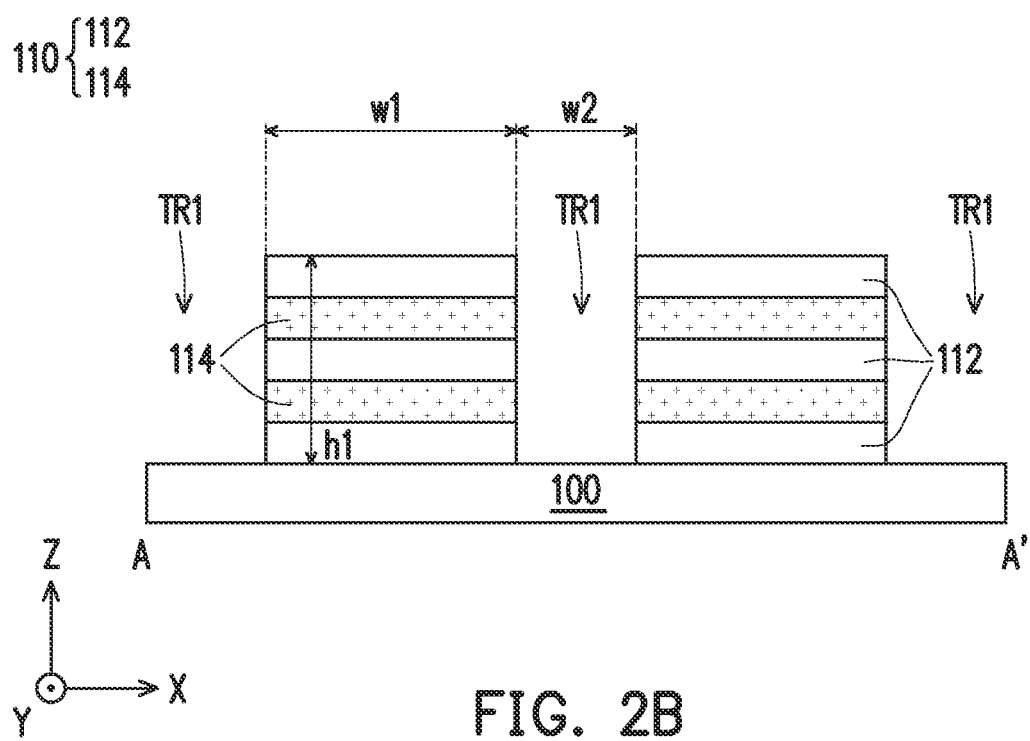

Referring to FIG. 2A and FIG. 2B, trenches TR1 are formed in the multilayer stack 110. As shown in FIG. 2B, the trenches TR1 penetrate through the multilayer stack 110 along the direction Z. That is to say, the trenches TR1 vertically extend in the multilayer stack 110. In the illustrated embodiment, the trenches TR1 vertically extend through all layers (i.e., all the insulating layers 112 and sacrificial layers 114) of the multilayer stack 110 and expose the substrate 100. That is to say, the bottom surfaces of the trenches TR1 are defined by the substrate 100. In other words, the substrate 100 is exposed at the bottoms of the trenches TR1. However, the disclosure is not limited thereto. In some alternative embodiments, the trenches TR1 vertically extend through some but not all layers of the multilayer stack 110. For example, the trenches TR1 may vertically extend through all of the sacrificial layers 114 and expose the bottommost insulating layer 112. Although three trenches TR1 are presented in FIG. 2A and FIG. 2B for illustrative purposes, those skilled in the art can understand that the number of the trenches TR1 may be more than what is depicted in FIG. 2A and FIG. 2B, and may be designated based on demand and/or design layout.

As shown in the top view of FIG. 2A, the trenches TR1 vertically penetrating through the multilayer stack 110 laterally extend along a direction Y perpendicular to the direction Z and are arranged along a direction X perpendicular to the direction Y and the direction Z. Accordingly, the multilayer stack 110 is cut into multiple strip portions by the trenches TR1. In such case, the multiple strip portions are referred to as the remaining portions of the multilayer stack 110 hereinafter. Further, after forming the trenches TR1, each remaining portion of the multilayer stack 110 is disposed between two adjacent trenches TR1 along the direction X. That is to say, two adjacent remaining portions of the multilayer stack 110 are spaced apart from each other by the corresponding trench TR1. In some embodiments, the remaining portion of the multilayer stack 110 has a width w1 in the range of about 70 nm to about 400 nm along the direction X, and has the overall height h1 discussed with respect to FIG. 1A and FIG. 1B. In some embodiments, the trench TR1 has a width w2 in the range of about 70 nm to about 400 nm along the direction X. The aspect ratio (AR) of each remaining portion of the multilayer stack 110 is the ratio of the overall height h1 to the width of the narrowest feature of the remaining portion of the multilayer stack 110, which is the width w1 at this step of processing. In addition, as shown in FIG. 2B, the trenches TR1 expose the side surfaces of the remaining portions of the multilayer stack 110. That is to say, the sidewalls of the trenches TR1 are defined by the remaining portions of the multilayer stack 110. In the illustrated embodiment, the trenches TR1 completely expose the side surfaces of the remaining portions of the multilayer stack 110. That is to say, the trenches TR1 expose the side surfaces of all layers (i.e., all the insulating layers 112 and sacrificial layers 114) in the remaining portions of the multilayer stack 110. However, the disclosure is not limited thereto. In some alternative embodiments, the trenches TR1 partially expose the side surfaces of the remaining portions of the multilayer stack 110. In some embodiments, the side surfaces of the insulating layers 112 are substantially coplanar or flush with the side surfaces of the sacrificial layers 114 in the current step.

In some embodiments, the method for forming the trenches TR1 includes a lithography process and an etching process (e.g., an anisotropic etching process). Since the substrate 100 has sufficient etching selectivity with respect to the materials in the multilayer stack 110, the substrate 100 may remain substantially intact during the etching process. In some embodiments where the substrate 100 is formed of silicon carbide, the insulating layers 112 are formed of silicon oxide, and the sacrificial layers 114 are formed of silicon nitride, the trenches TR1 are formed by a dry etch using a fluorine-based gas (e.g., $C_4F_6$) mixed with hydrogen ($H_2$) or oxygen ($O_2$) gas.

Figure 3A:
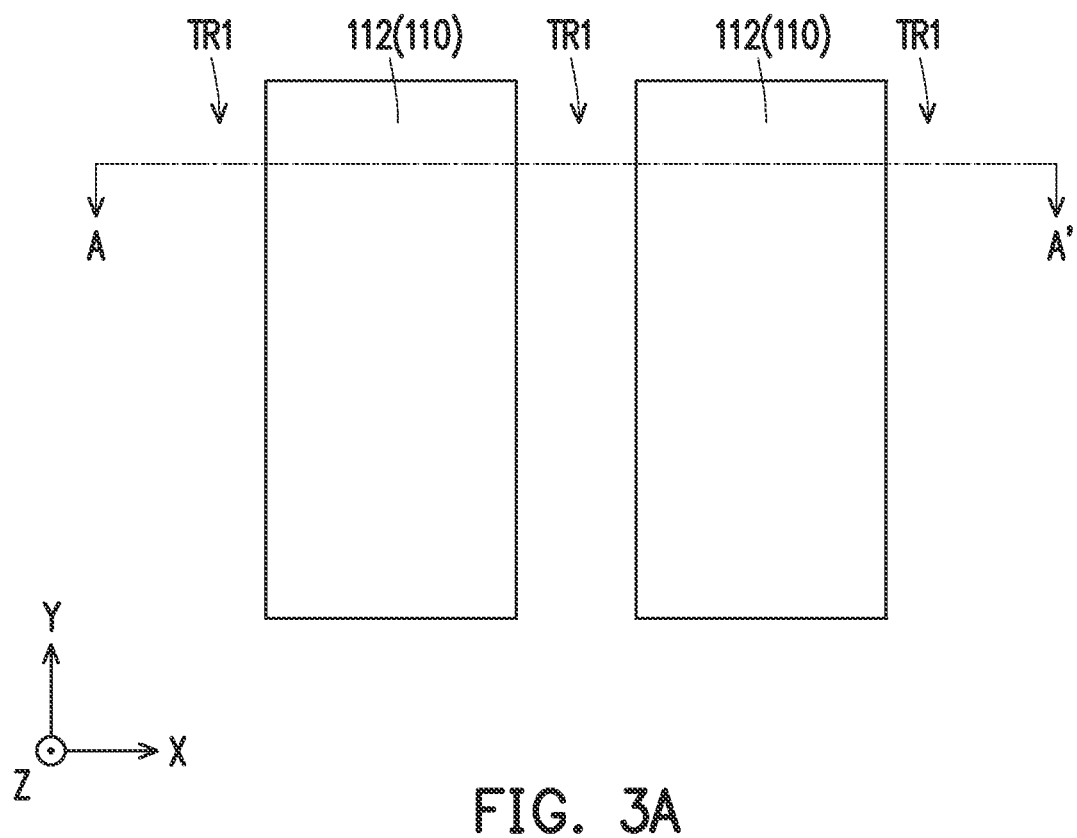
Figure 3B:
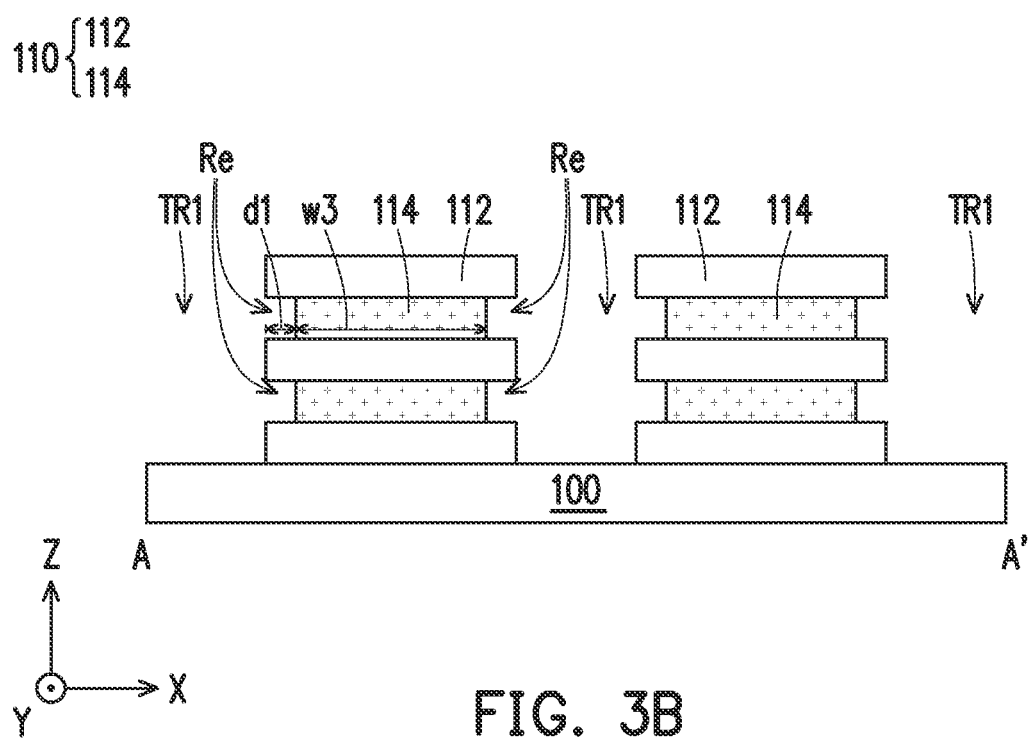

Referring to FIG. 3A and FIG. 3B, the sacrificial layers 114 in the remaining portions of the multilayer stack 110 are laterally recessed with respect to the insulating layers 112 in the remaining portions of the multilayer stack 110. As shown in FIG. 3B, portions of the sacrificial layers 114 exposed by the trenches TR1 are removed to form recesses Re. Each of the recesses Re is formed between two adjacent insulating layers 112. Each of the recesses Re is connected to (e.g., in spatial communication with) the corresponding trench TR1. From another point of view, as shown in FIG. 3B, the side surfaces of the sacrificial layers 114 are exposed by the recesses Re and the trenches TR1, and the exposed side surfaces of the sacrificial layers 114 are no longer coplanar with the exposed side surfaces of the insulating layers 112, but are laterally recessed from the exposed side surfaces of the insulating layers 112. Although the exposed side surfaces of the sacrificial layers 114 are illustrated in FIG. 3B as being straight, the sidewalls may be concave or convex.

In some embodiments, a method for laterally recessing the sacrificial layers 114 includes an etching process, such as an isotropic etching process. During such etching process, the insulating layers 112 may be barely etched as having sufficient etching selectivity with respect to the sacrificial layers 114. That is to say, the etching process used to form the recesses Re is one that is selective to the material of the sacrificial layers 114 (e.g., selectively etches the material of the sacrificial layers 114 at a faster rate than the material of the insulating layers 112). From another point of view, since the substrate 100 has sufficient etching selectivity with respect to the materials in the multilayer stack 110, the substrate 100 may remain substantially intact during such etching process. In some embodiments where the substrate 100 is formed of silicon carbide, the insulating layers 112 are formed of silicon oxide, and the sacrificial layers 114 are formed of silicon nitride, the trenches TR1 are expanded to form the recesses Re by a wet etch using phosphoric acid ($H_3PO_4$). However, the embodiments of the disclosure are not limited thereto. In some alternative embodiments, a dry etch selective to the material of the sacrificial layers 114 may be used.

After formation, each of the recesses Re has a depth d1 extending past the exposed side surfaces of the corresponding insulating layers 112 along the direction X. Timed etching processes may be used to stop the etching of the recesses Re after the recesses Re reach a desired depth d1. In some embodiments, the depth d1 of the recess Re is in the range of about 10 nm to about 20 nm. From another point of view, forming the recesses Re reduces the width of the sacrificial layers 114. In some embodiments, each of the sacrificial layers 114 has a width w3 in the range of about 20 nm to about 360 nm along the direction X after forming the recesses Re. As noted above, the aspect ratio (AR) of each remaining portion of the multilayer stack 110 is the ratio of the overall height h1 to the width of the narrowest feature of the remaining portion of the multilayer stack 110, which is the width w3 at this step of processing. Forming the recesses Re thus increases the aspect ratio of each remaining portion of the multilayer stack 110.

Figure 4A:
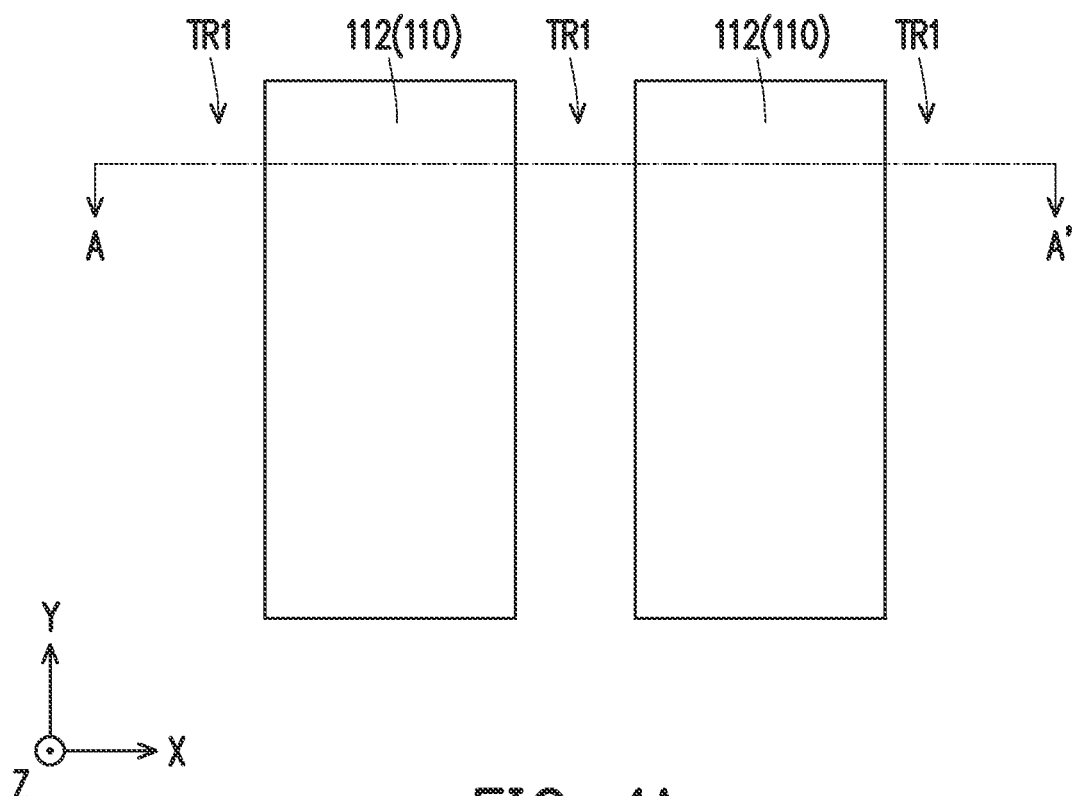
Figure 4B:
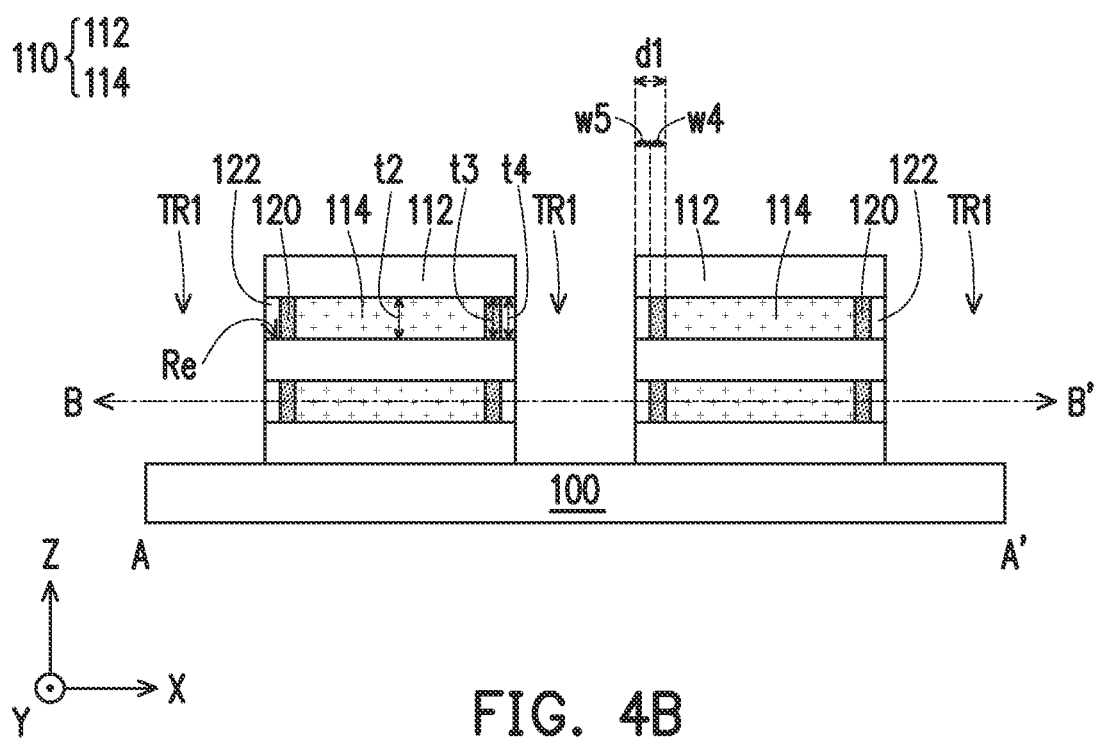
Figure 4C:
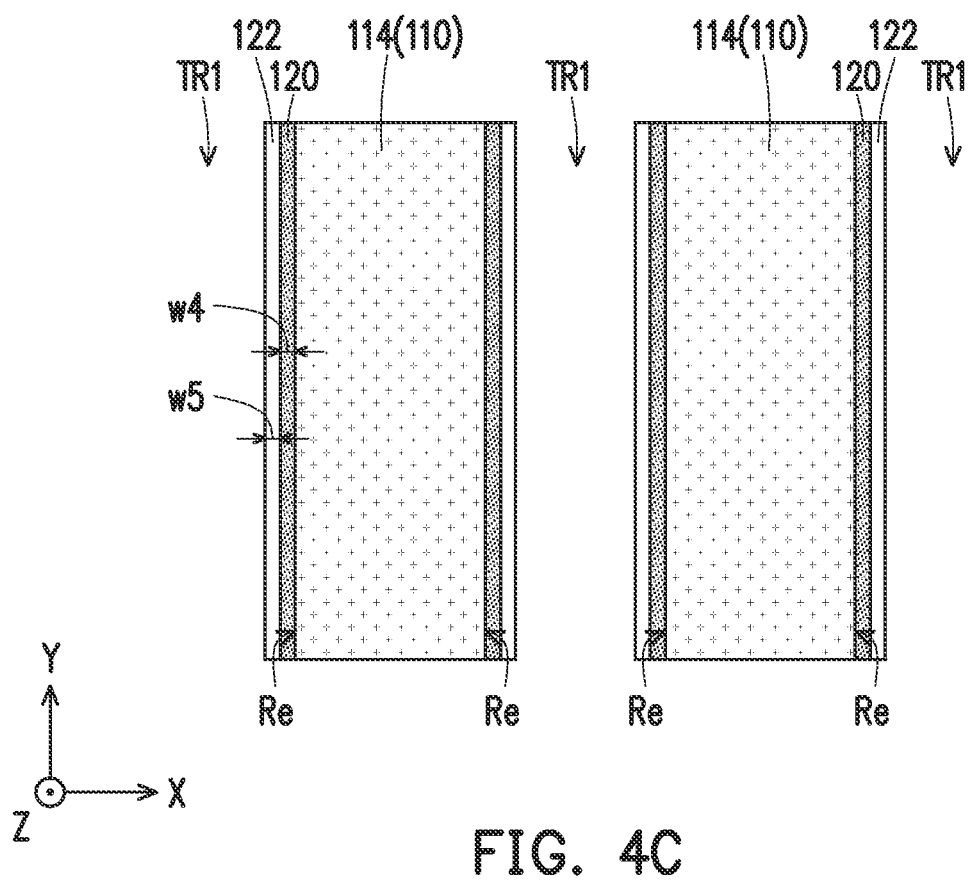

Referring to FIG. 4A, FIG. 4B and FIG. 4C, gate dielectric layers 120 are formed in the recesses Re. In detail, as shown in FIG. 4B and FIG. 4C, each of the gate dielectric layers 120 is formed within one of the recesses Re in a one-to-one relationship. The gate dielectric layer 120 is formed to cover or contact the side surface of the sacrificial layer 114 exposed by the corresponding recess Re. As such, in each remaining portion of the multilayer stack 110, the adjacent gate dielectric layers 120 along the direction X are laterally spaced apart from each other by the corresponding sacrificial layer 114. Further, as shown in FIG. 4B, one of the sacrificial layers 114 and the corresponding gate dielectric layers 120 are at substantially the same level in each remaining portion of the multilayer stack 110. Herein, when elements are described as "at substantially the same level", the elements are formed at substantially the same height. From another point of view, as shown in FIG. 4B, a gate dielectric layer 120 is embedded between two adjacent insulating layers 112. In other words, the gate dielectric layers 120 along the direction Z are vertically spaced apart from each other by the corresponding insulating layers 112.

In some embodiments, the gate dielectric layers 120 are formed by the following steps. First, a gate dielectric material is formed over the substrate 100 to fill in the recesses Re between the insulating layers 112. In some embodiments, the gate dielectric material not only fills the recesses Re, but also further covers the side surfaces of the insulating layers 112 exposed by the trenches TR1, the top surface of the topmost insulating layer 112, and the top surface of the substrate 100 exposed by the trenches TR1. In some embodiments, the method for forming the gate dielectric material includes a deposition process, such as a CVD process, or ALD process. Thereafter, the portions of the gate dielectric material covering the side surfaces of the insulating layers 112 exposed by the trenches TR1, the top surface of the topmost insulating layer 112, and the top surface of the substrate 100 exposed by the trenches TR1 are removed, so as to form the separate and disconnected gate dielectric layers 120. In some embodiments, the method for removing some portions of the gate dielectric material includes performing an isotropic etching process. However, the disclosure is not limited thereto. In some alternative embodiments, an anisotropic etching process is performed followed by performing an isotropic etching process to remove some portions of the gate dielectric material.

In some embodiments, the gate dielectric material of the gate dielectric layers 120 includes a high-k material having a dielectric constant (k) greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or a combination thereof. In some embodiments, the gate dielectric layers 120 optionally includes a silicate such as HfSiO, LaSiO, AlSiO, or a combination thereof.

As shown in the plan view of FIG. 4C, the gate dielectric layers 120 laterally extend along the direction Y. In some embodiments, the gate dielectric layers 120 have a thickness t3 substantially the same as the thickness t2 of the sacrificial layers 114 along the direction Z, as shown in FIG. 4B. In some embodiments, the thickness t3 of the gate dielectric layers 120 is in the range of about 15 nm to about 90 nm. In some embodiments, along the direction X, the gate dielectric layers 120 have a width w4 less than the depth d1 of the recesses Re. That is to say, a recess Re is partially occupied by the corresponding gate dielectric layer 120. Timed etching processes may be used to stop the etching of the gate dielectric material after the gate dielectric layers 120 reach a desired width w4. In some embodiments, the width w4 of the gate dielectric layers 120 is in the range of about 5 nm to about 10 nm along the direction X.

With continued reference to FIG. 4B and FIG. 4C, channel layers 122 are formed in the recesses Re. In detail, as shown in FIG. 4B and FIG. 4C, each of the channel layers 122 is formed within one of the recesses Re in a one-to-one relationship. The channel layer 122 is formed to cover or contact the side surface of the corresponding gate dielectric layer 120 exposed by the corresponding recess Re. As such, in each remaining portion of the multilayer stack 110, the channel layers 122 along the direction X are laterally spaced apart from each other by the corresponding gate dielectric layers 120 and the corresponding sacrificial layer 114. Further, as shown in FIG. 4B, one of the sacrificial layers 114, the corresponding gate dielectric layers 120 and the corresponding channel layers 122 are at substantially the same level in each remaining portion of the multilayer stack 110. From another point of view, as shown in FIG. 4B, a channel layer 122 is embedded between two adjacent insulating layers 112. In other words, the channel layers 122 along the direction Z are vertically spaced apart from each other by the corresponding insulating layers 112.

In some embodiments, the channel layers 122 are formed by the following steps. First, a channel material is formed over the substrate 100 to fill in the recesses Re between the insulating layers 112. In some embodiments, the channel material not only fills up the recesses Re, but also further covers the side surfaces of the insulating layers 112 exposed by the trenches TR1, the top surface of the topmost insulating layer 112, and the top surface of the substrate 100 exposed by the trenches TR1. In some embodiments, the method for forming the channel material includes a deposition process, such as a CVD process, or ALD process. Thereafter, the portions of the channel material covering the side surfaces of the insulating layers 112 exposed by the trenches TR1, the top surface of the topmost insulating layer 112, and the top surface of the substrate 100 exposed by the trenches TR1 are removed, so as to form the separate and disconnected channel layers 122. In some embodiments, the method for removing some portions of the channel material includes performing an anisotropic etching process.

In some embodiments, the channel material of the channel layers 122 includes a metal oxide (or oxide semiconductor), such as an indium-based oxide material (e.g., indium gallium zinc oxide (IGZO), indium tin oxide (ITO), indium gallium zinc tin oxide (IGZTO)). Other suitable materials for the channel layers 122 include zinc oxide (ZnO), indium tungsten oxide (InWO), tungsten oxide (WO), tantalum oxide (TaO), and molybdenum oxide (MoO).

As shown in the plan view of FIG. 4C, the channel layers 122 laterally extend along the direction Y, and each of the gate dielectric layers 120 is disposed between the corresponding channel layer 122 and the corresponding sacrificial layer 114. In some embodiments, the channel layers 122 have a thickness t4 substantially the same as the thickness t2 of the sacrificial layers 114 along the direction Z, as shown in FIG. 4B. In some embodiments, the thickness t4 of the channel layers 122 is in the range of about 20 nm to about 100 nm. In some embodiments, along the direction X, the channel layers 122 have a width w5 less than the depth d1 of the recesses Re. In some embodiments, the width w5 of the channel layers 122 is in the range of about 5 nm to about 10 nm along the direction X.

In some embodiments, as shown in FIG. 4B, the side surface of each channel layer 122 exposed by the corresponding trench TR1 is substantially coplanar or level with the side surfaces of the adjacent insulating layers 112 exposed by the corresponding trench TR1. In such case, a sum of the width w4 of the gate dielectric layers 120 and the width w5 of the channel layers 122 is substantially the same as the depth d1 of the recesses Re. However, the disclosure is not limited thereto. In some alternative embodiments, the side surface of each channel layer 122 exposed by the corresponding trench TR1 is slightly recessed from the side surfaces of the adjacent insulating layers 112 exposed by the corresponding trench TR1 by a non-zero distance. The non-zero distance ranges from about 1 nm to about 5 nm, for example.

Figure 5A:
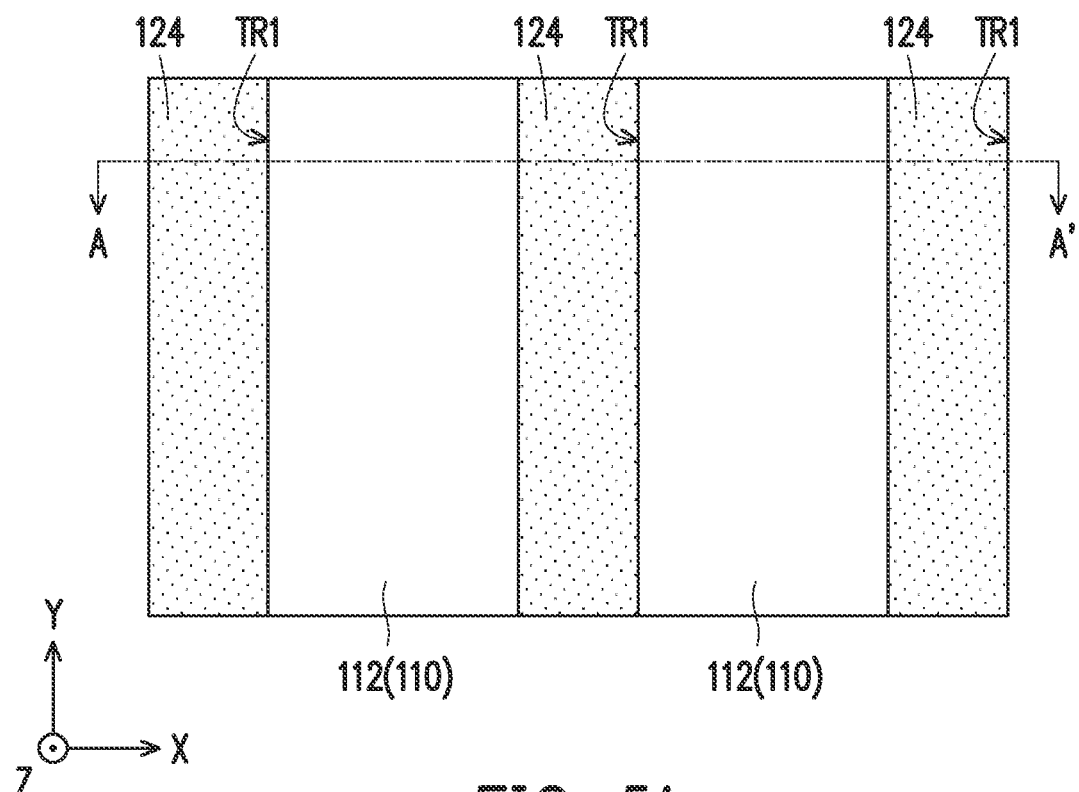
Figure 5B:
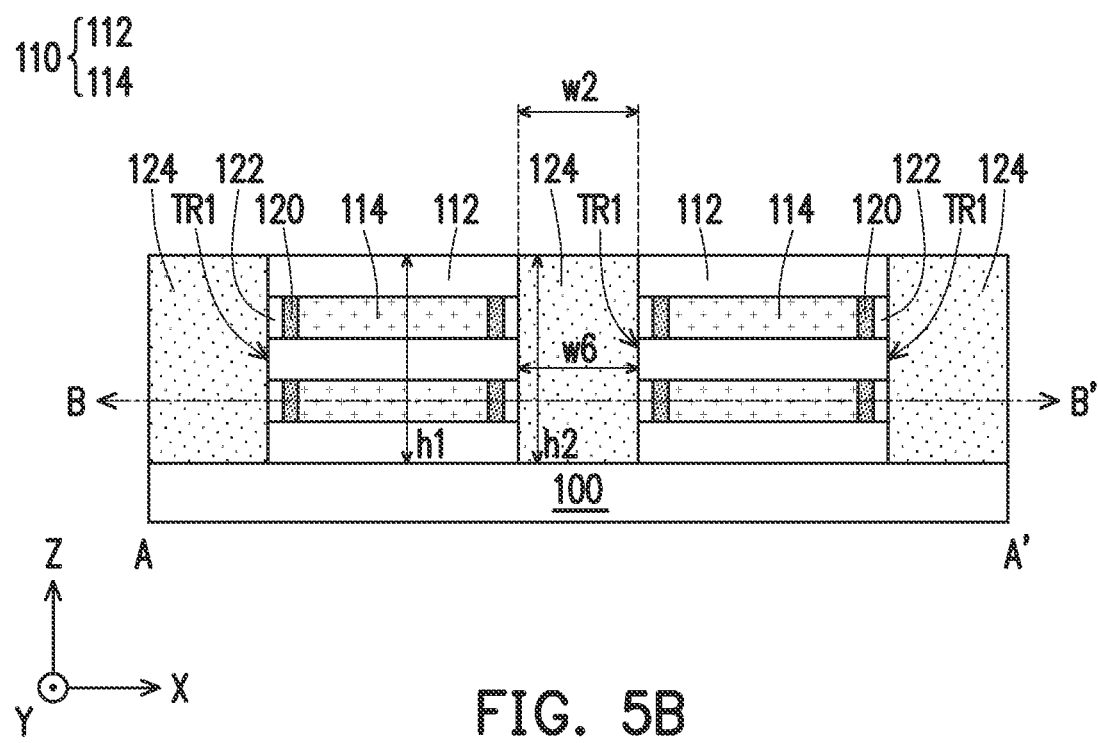
Figure 5C:
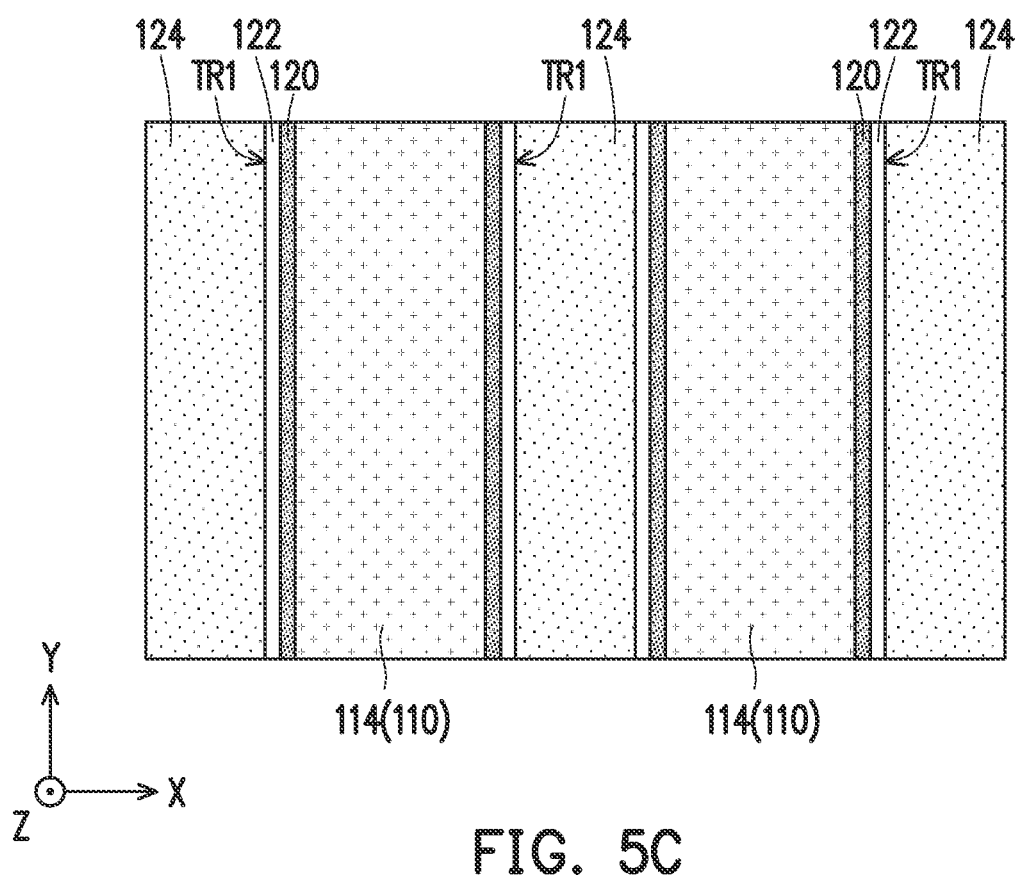

Referring to FIG. 5A, FIG. 5B and FIG. 5C, after forming the channel layers 122, dielectric walls 124 are formed to fill up the trenches TR1. As shown in FIG. 5A, FIG. 5B and FIG. 5C, the dielectric walls 124 are in contact with the side surfaces of the insulating layers 112 exposed by the trenches TR1 and the side surfaces of the channel layers 122 exposed by the trenches TR1. In some embodiments where the side surface of each channel layer 122 exposed by the corresponding trench TR1 is substantially coplanar or level with the side surfaces of the adjacent insulating layers 112 exposed by the corresponding trench TR1, each side surface of the dielectric wall 124 in contact with the side surfaces of the insulating layers 112 and the side surfaces of the channel layers 122 exposed by the corresponding trench TR1 has a substantially smooth profile. In some embodiments, as shown in FIG. 5A, FIG. 5B and FIG. 5C, each side surface of the dielectric wall 124 in contact with the side surfaces of the insulating layers 112 and the side surfaces of the channel layers 122 exposed by the corresponding trench TR1 is substantially straight. However, the disclosure is not limited thereto. In some embodiments where the side surface of each channel layer 122 exposed by the corresponding trench TR1 is slightly recessed from the side surfaces of the adjacent insulating layers 112 exposed by the corresponding trench TR1, each side surface of the dielectric wall 124 in contact with the side surfaces of the insulating layers 112 and the side surfaces of the channel layers 122 exposed by the corresponding trench TR1 has an uneven profile. In such embodiments, the dielectric wall 124 may have laterally protruding portions in contact with the side surfaces of the corresponding channel layers 122 exposed by the corresponding trench TR1.

In some embodiments, as shown in FIG. 5B, the bottom surfaces of the dielectric walls 124 are in contact with the top surface of the substrate 100 exposed by the trenches TR1. However, the disclosure is not limited thereto. In embodiments where the trenches TR1 vertically extend through some but not all layers of the multilayer stack 110, the bottom surfaces of the dielectric walls 124 are in contact with the remaining portions of the multilayer stack 110.

In some embodiments, the dielectric walls 124 are formed by the following steps. After forming the channel layers 122, a dielectric material is formed to fill up in the trenches TR1. The dielectric material may include silicon nitride, silicon oxide, silicon oxynitride, phosphosilicate glass (PSG), borosilicate glass (BSG), boron-doped phosphosilicate glass (BPSG), or the like, or a combination thereof, and may be formed by a suitable deposition process such as a CVD process, or an ALD process. After the dielectric material is formed, a planarization process, such as a chemical mechanical planarization (CMP) process, an etching process or a combination thereof, may be performed to remove portions of the dielectric material outside the trenches TR1. In some embodiments, the portions of the dielectric material removed by the planarization process are over the top surface of the topmost insulating layer 112. That is to say, the planarization process exposes the multilayer stack 110 such that the top surface of the multilayer stack 110 (e.g., the top surface of the topmost insulating layer 112) and the top surfaces of the remaining portions of the dielectric material are substantially coplanar or level with one another after the planarization process is complete. The remaining portions of the dielectric material in the trenches TR1 form the dielectric walls 124.

As shown in the plan view of FIG. 5C, the dielectric walls 124 laterally extend along the direction Y, and each of the channel layers 122 is disposed between the corresponding dielectric wall 124 and the corresponding gate dielectric layer 120. In some embodiments, the dielectric walls 124 have a height h2 substantially the same as the overall height h1 of the multilayer stack 110 along the direction Z, as shown in FIG. 5B. In some embodiments, the height h2 of the dielectric walls 124 is in the range of about 1000 nm to about 10000 nm. In some embodiments, the dielectric walls 124 have a width w6 substantially the same as the width w2 of the trenches TR1 along the direction X. In some embodiments, the width w6 of the dielectric walls 124 is in the range of about 70 nm to about 400.

Figure 6A:
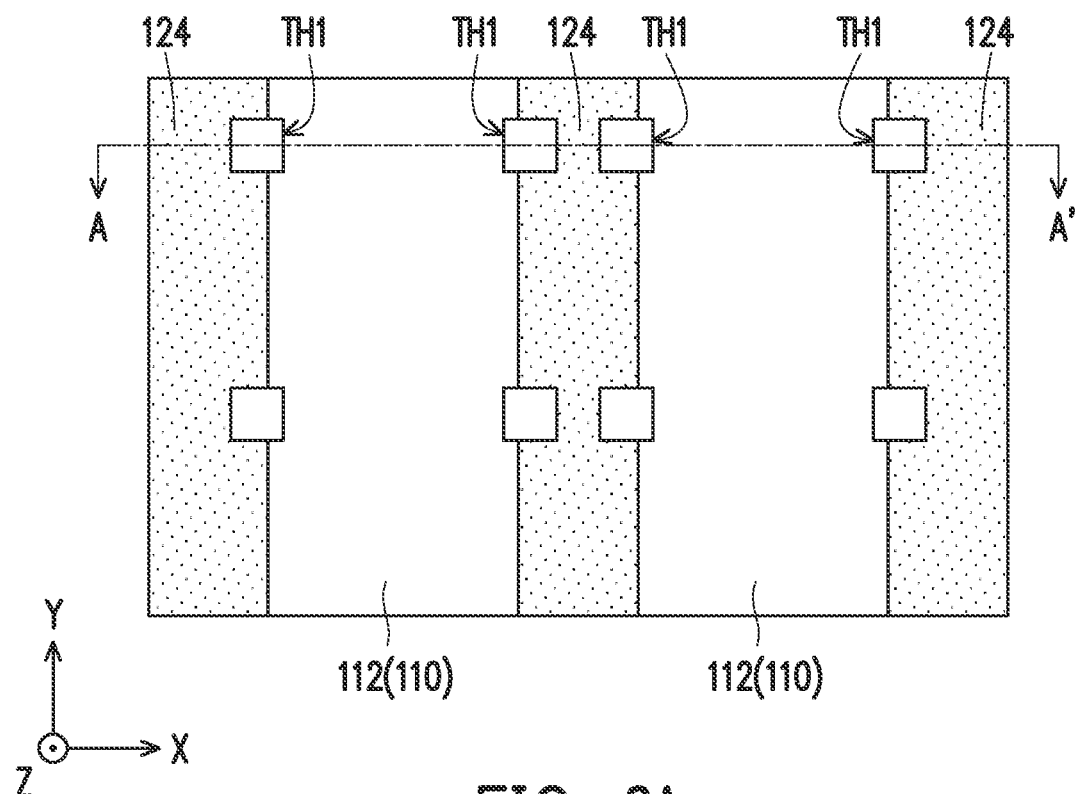
Figure 6B:
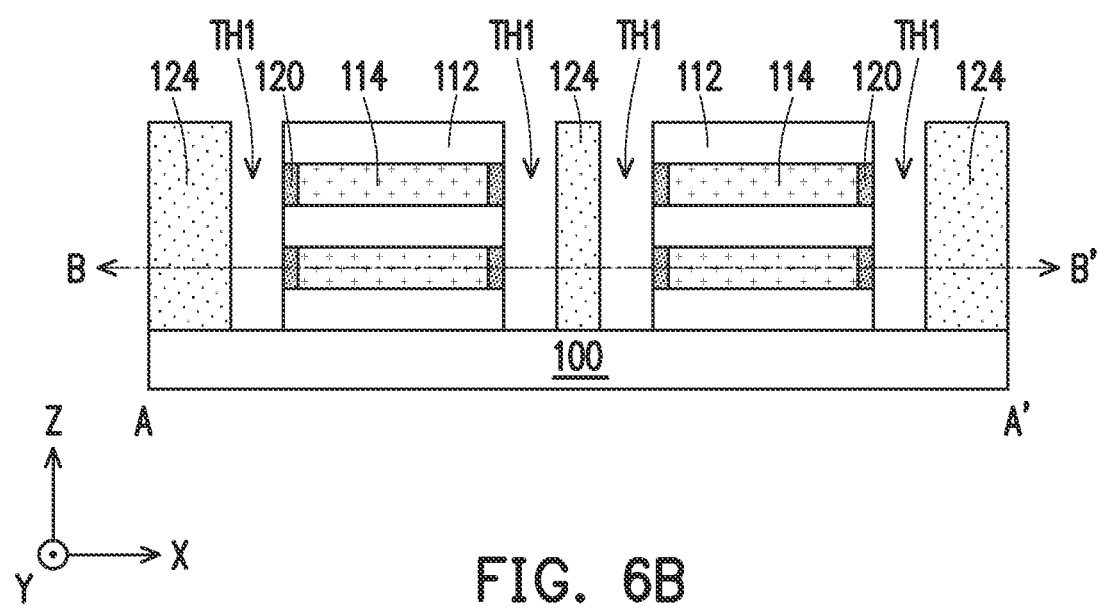
Figure 6C:
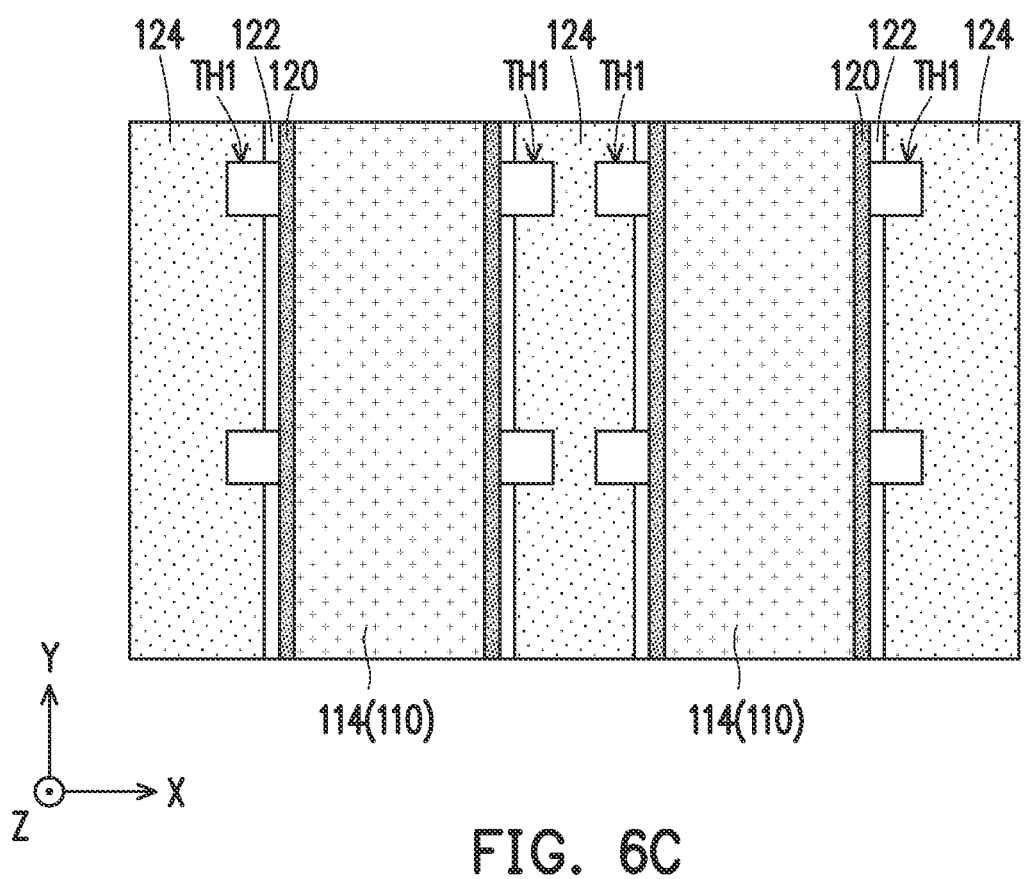

Referring to FIG. 6A, FIG. 6B and FIG. 6C, through holes TH1 are formed in the dielectric walls 124, the insulating layers 112 and the channel layers 122. In detail, as shown in FIG. 6A, FIG. 6B and FIG. 6C, each through hole TH1 penetrates through the corresponding dielectric wall 124, the corresponding insulating layers 112 and the corresponding channel layers 122 along the direction Z to expose the substrate 100. That is to say, each through hole TH1 vertically extends through the corresponding dielectric wall 124, the corresponding insulating layers 112 and the corresponding channel layers 122. Further, as shown in FIG. 6C, the through holes TH1 penetrate through the channel layers 122 to cut off the channel layers 122, such that each of the channel layers 122 is rendered as a discontinuous channel layer. However, the disclosure is not limited thereto. In some alternative embodiments, the through holes TH1 may penetrate through the channel layers 122 without cutting off the channel layers 122. In such case, each of the channel layers 122 still is a continuous channel layer. In addition, as shown in FIG. 6B, after forming the through holes TH1, the side surfaces of the gate dielectric layers 120 in contact with the channel layers 122 are exposed by the through holes TH1. However, the disclosure is not limited thereto. In embodiments where the through holes TH1 penetrate through the channel layers 122 without cutting off the channel layers 122, the gate dielectric layers 120 are not exposed by the through holes TH1. Although eight through holes TH1 are presented in FIG. 6A for illustrative purposes, those skilled in the art can understand that the number of the through holes TH1 may be more than what is depicted in FIG. 6A, and may be designated based on demand and/or design layout.

In some embodiments, the through holes TH1 are laterally separated from one another. As shown in FIG. 6A, FIG. 6B and FIG. 6C, the through holes TH1 arranged in the same dielectric wall 124 are laterally separated from one another by such dielectric wall 124, the corresponding insulating layers 112 and the corresponding channel layers 122. From another point of view, as shown in FIG. 6A and FIG. 6C, the through holes TH1 are separately arranged as having multiple columns extending along the direction Y, and two adjacent columns of the through holes TH1 are spaced apart from each other along the direction X. The through holes TH1 in the same column are laterally separated from each other by the corresponding dielectric wall 124, the corresponding insulating layers 112 and the corresponding channel layers 122. The through holes TH1 in one of the adjacent columns of the through holes TH1 arranged in the same dielectric wall 124 are laterally separated from the through holes TH1 in another one of such adjacent columns by such dielectric wall 124.

In some embodiments, the through holes TH1 are formed by using a lithography process and an etching process. A mask pattern, such as a patterned photoresist, may be formed over the multilayer stack 110. The etching process may then be performed by using the mask pattern as an etching mask to remove portions of the dielectric walls 124, the insulating layers 112 and the channel layers 122 so as to form the through holes TH1. After the etching process is finished, the mask pattern (e.g., patterned photoresist) may be removed by a suitable removal process, such as ashing or stripping. In some embodiments, the etching process is an anisotropic etching process.

Figure 7A:
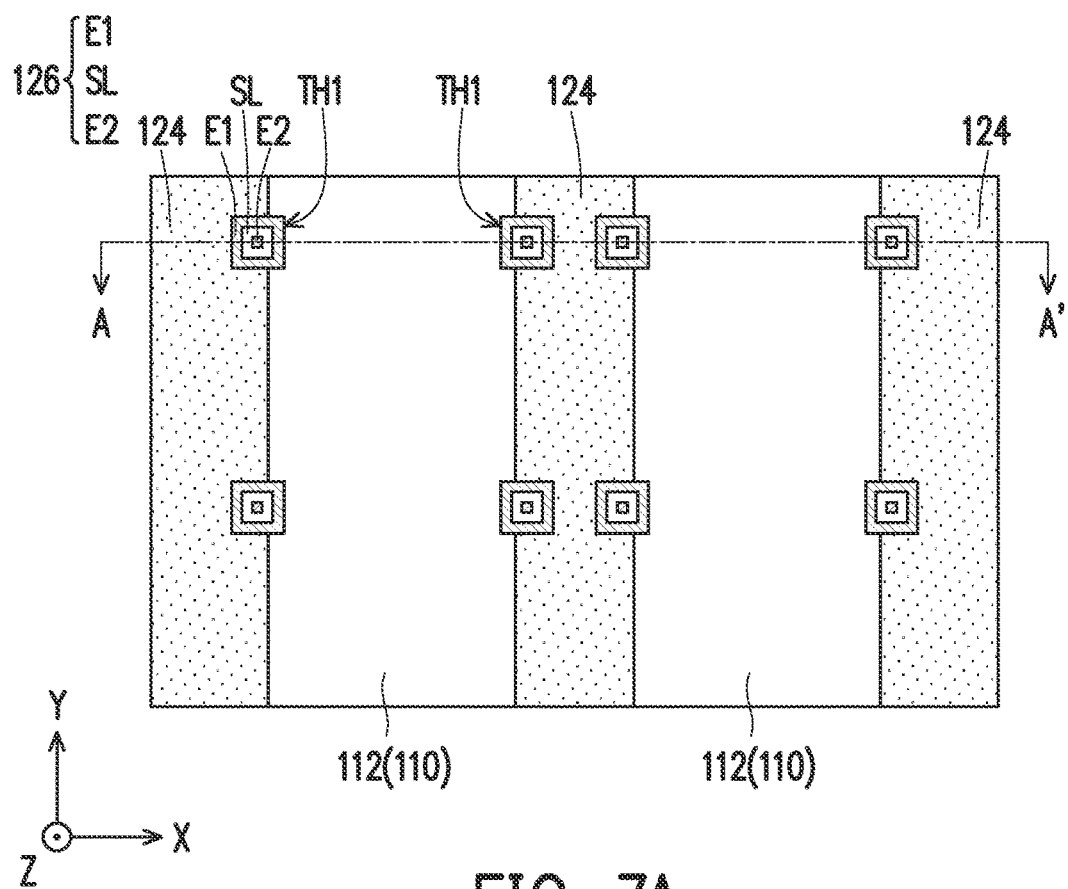
Figure 7B:
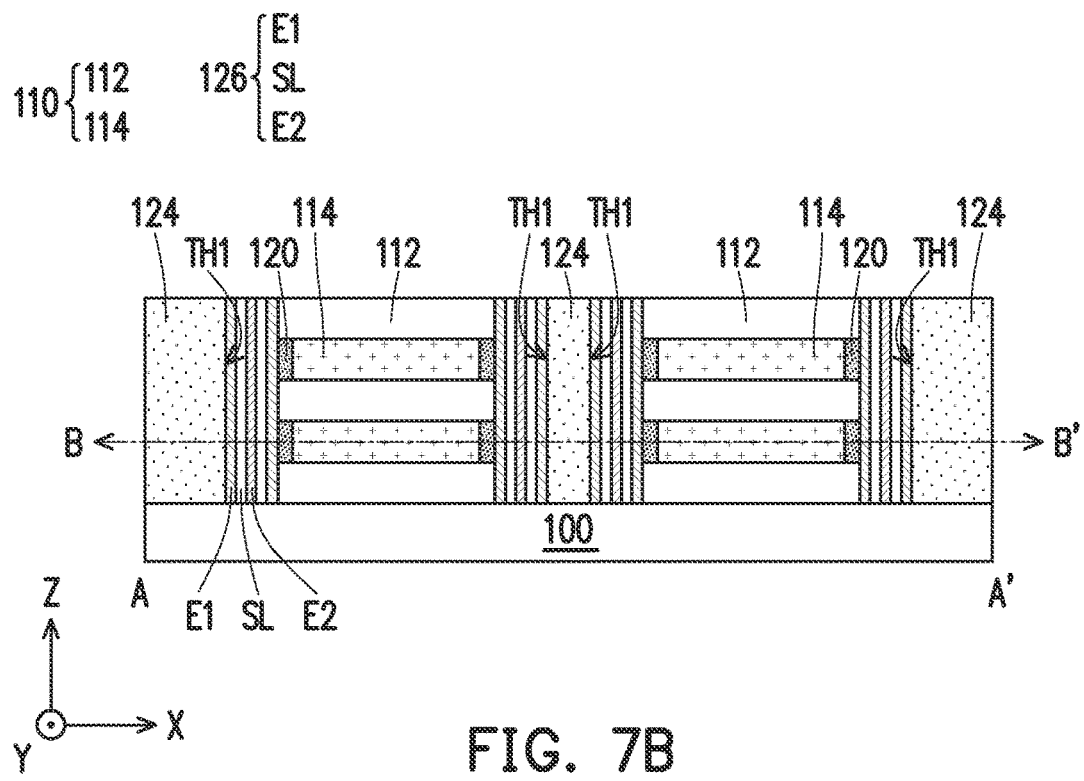
Figure 7C:
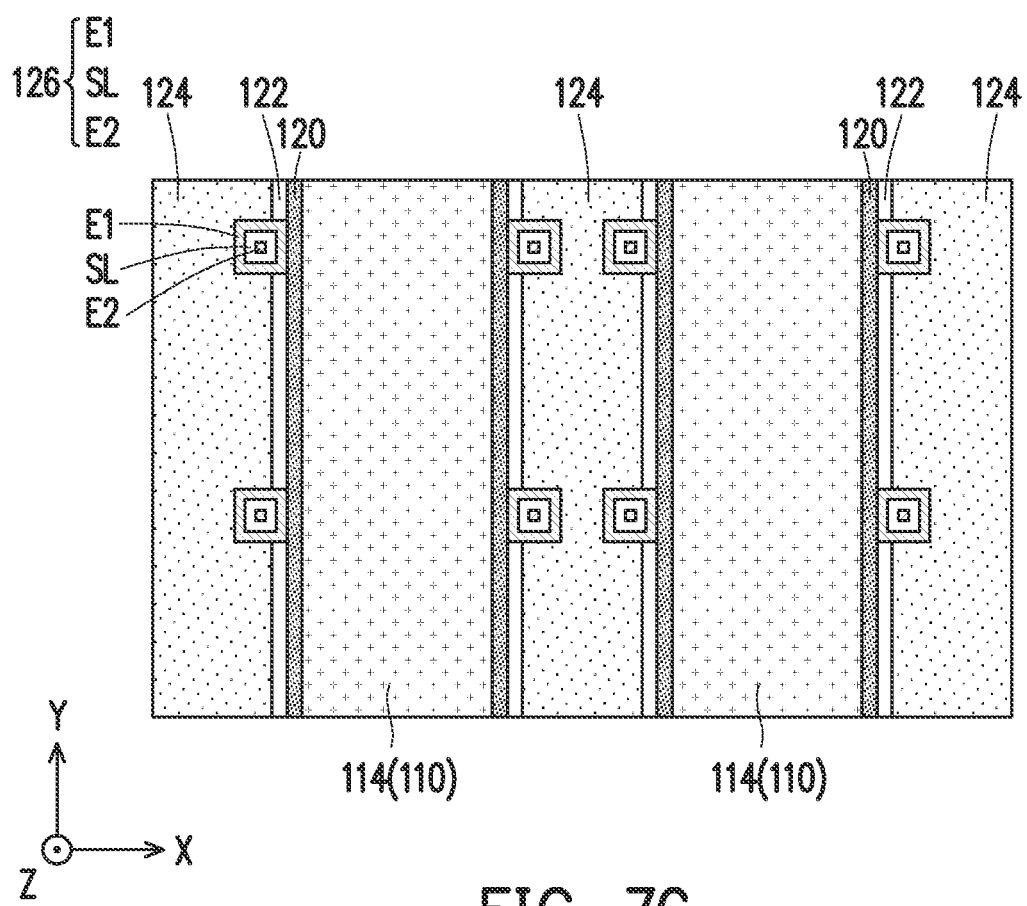

Referring to FIG. 7A, FIG. 7B and FIG. 7C, memory pillars 126 are formed to fill up the through holes TH1. In detail, as shown in FIG. 7A, FIG. 7B and FIG. 7C, each memory pillar 126 penetrates through the corresponding dielectric wall 124, the corresponding insulating layers 112 and the corresponding channel layers 122 along the direction Z and reaches to the top surface of the substrate 100 exposed by the corresponding through hole TH1. That is to say, each memory pillar 126 vertically extends through the corresponding dielectric wall 124, the corresponding insulating layers 112 and the corresponding channel layers 122. In some embodiments, each memory pillar 126 is formed to be in lateral contact with one of the corresponding channel layers 122 through more than one side surfaces. In the illustrated embodiment, as shown in FIG. 7C, since the through holes TH1 cut off the channel layers 122 to expose the side surfaces of the gate dielectric layers 120, two side surfaces of each memory pillar 126 filling up the corresponding through hole TH1 are in lateral contact with one of the corresponding channel layers 122. From another point of view, the memory pillars 126 filling up the through holes TH1 are in contact with the side surfaces of the gate dielectric layers 120 exposed by the through holes TH1. However, the disclosure is not limited thereto. In embodiments where the through holes TH1 penetrate through the channel layers 122 without cutting off the channel layers 122, portions of each memory pillar 126 are embedded in the corresponding channel layers 122. In such case, three side surfaces of each memory pillar 126 filling up the corresponding through hole TH1 are in lateral contact with one of the corresponding channel layers 122. Although eight memory pillars 126 are presented in FIG. 7A for illustrative purposes, those skilled in the art can understand that the number of the memory pillars 126 may be more than what is depicted in FIG. 7A, and may be designated based on demand and/or design layout.

In some embodiments, the memory pillars 126 are laterally separated from one another. As shown in FIG. 7A, FIG. 7B and FIG. 7C, the memory pillars 126 arranged in the same dielectric wall 124 are laterally separated from one another by such dielectric wall 124, the corresponding insulating layers 112 and the corresponding channel layers 122. From another point of view, as shown in FIG. 7A and FIG. 7C, the memory pillars 126 are separately arranged in an array of rows and columns. In detail, the memory pillars 126 are separately arranged as having multiple columns extending along the direction Y, and adjacent columns of the memory pillars 126 are spaced apart from each other along the direction X. The memory pillars 126 in the same column are laterally separated from one another by the corresponding dielectric wall 124, the corresponding insulating layers 112 and the corresponding channel layers 122. The memory pillars 126 in one of the adjacent columns of the memory pillars 126 arranged in the same dielectric wall 124 are laterally separated from the memory pillars 126 in another one of such adjacent columns by such dielectric wall 124.

In some embodiments, each of the memory pillars 126 includes an electrode E1, a switching layer SL and an electrode E2. In the illustrated embodiment, as shown in FIG. 7A, FIG. 7B and FIG. 7C, in each memory pillar 126, the switching layer SL is disposed between the electrode E1 and the electrode E2. In detail, as shown in the top view of FIG. 7A, in each memory pillar 126, the inner side surfaces of the switching layer SL are in contact with the side surfaces of the electrode E2, and the inner side surfaces of the electrode E1 are in contact with the outer side surfaces of the switching layer SL. That is to say, in each memory pillar 126, the switching layer SL wraps around the electrode E2, and the electrode E1 wraps around the switching layer SL. In other words, in each memory pillar 126, the switching layer SL is sandwiched between and in physical contact with the electrode E1 and the electrode E2. From another point of view, as shown in FIG. 7A, FIG. 7B and FIG. 7C, since each memory pillar 126 penetrates through the corresponding dielectric wall 124, the corresponding insulating layers 112 and the corresponding channel layers 122 along the direction Z, the outer side surfaces of the electrode E1 in each memory pillar 126 are in contact with the corresponding dielectric wall 124, the corresponding insulating layers 112 and the corresponding channel layers 122.

In some embodiments, the memory pillars 126 are formed by the following steps. First, the electrodes E1 are formed by depositing a conductive material that conformally covers the bottom surfaces and the sidewalls of the through holes TH1, the top surface of the topmost insulating layer 112 and the top surfaces of the dielectric walls 124; and then performing an anisotropic etching process to remove portions of the conductive material on the bottom surfaces of the through holes TH1, the top surface of the topmost insulating layer 112 and the top surfaces of the dielectric walls 124. In this case, the electrodes E1 may have a rounded or curved top surface adjacent to the topmost insulating layer 112. In some embodiments, the electrodes E1 may have a flat top surface, as shown in FIG. 7B. The conductive material of the electrodes E1 may be deposited by a CVD process, or an ALD process. After forming the electrodes E1, the switching layers SL are formed by depositing a switching material that conformally covers the bottom surfaces of the through holes TH1, the top surfaces and the side surfaces of the electrodes E1, the top surface of the topmost insulating layer 112 and the top surfaces of the dielectric walls 124; and then performing an anisotropic etching process to remove portions of the switching material on the bottom surfaces of the through holes TH1, the top surfaces of the electrodes E1, the top surface of the topmost insulating layer 112 and the top surfaces of the dielectric walls 124. In this case, the switching layers SL may have a rounded or curved top surface. In some embodiments, the switching layers SL may have a flat top surface, as shown in FIG. 7B. The switching material of the switching layers SL may be deposited by CVD process, or ALD process. After forming the switching layers SL, a conductive material is formed to fill up in the through holes TH1. The conductive material may be formed by a deposition process (e.g., a CVD process, an ALD process or a physical vapor deposition (PVD) process), a plating process or a combination thereof. After the conductive material is formed, a planarization process, such as a CMP process, an etching process or a combination thereof, may be performed to remove portions of the conductive material outside the through holes TH1. In some embodiments, the portions of the conductive material removed by the planarization process are over the top surfaces of the electrodes E1, the top surfaces of the switching layers SL, the top surface of the topmost insulating layer 112 and the top surfaces of the dielectric walls 124. In some embodiments, the planarization process exposes the multilayer stack 110 and the dielectric walls 124, such that the top surface of the multilayer stack 110 (e.g., the top surface of the topmost insulating layer 112), the top surfaces of the dielectric walls 124 and the top surfaces of the remaining portions of the conductive material are substantially coplanar or level with one another after the planarization process is complete. The remaining portions of the conductive material in the through holes TH1 form the electrodes E2.

In some embodiments, each switching layer SL is able to be switched between multiple resistance states by applying an appropriate voltage difference across the switching layer SL. As such, the switching layer SL can be configured to store multiple logic states. In some embodiments, the switching material of the switching layer SL is a phase change material that is capable of switching between two different crystallinities by applying an appropriate voltage difference across the switching layer SL. For example, the crystallinity of the switching layer SL changes due to joule heating resulted from the voltage difference between the electrode E1 and the electrode E2. In some embodiments, the phase change material is a chalcogenide material. In these embodiments, the chalcogenide material may include one or more of Ge, Te and Sb. For instance, the chalcogenide material may be GeSbTe, such as $Ge_2Sb_2Te_5$ (GST225), $Ge_4Sb_2Te_4$ (GST424) or so forth. In certain cases, the chalcogenide material may be doped with N, Si, C, In, Ga or the like, and an example of such chalcogenide material may be doped $Ge_6Sb_1Te_2$ (GST612). In embodiments where the switching layer SL is formed of a phase change material, the materials of the electrode E1 and the electrode E2 respectively include W, TiN, Ru, TaN or other metallic materials.

In alternative embodiments, the switching of the switching layer SL between multiple resistance states is determined by whether a conductive filament is formed in the switching layer SL. In these alternative embodiments, the switching material of the switching layer SL may be a variable resistance material in which a conductive filament may be formed, including metal oxide (such as $HfO_2$, $ZrO_2$, HfZrO, HfAlO, HfSiO, HfSrO or HfYO), metal oxynitride (such as HfON), or oxidized metal (such as $WO_x$, $HfO_x$, or $AlO_x$). And, in these alternative embodiments, the materials of the electrode E1 and the electrode E2 are respectively include W, TiN, Ru, TaN or other conductive materials.

Figure 8A:
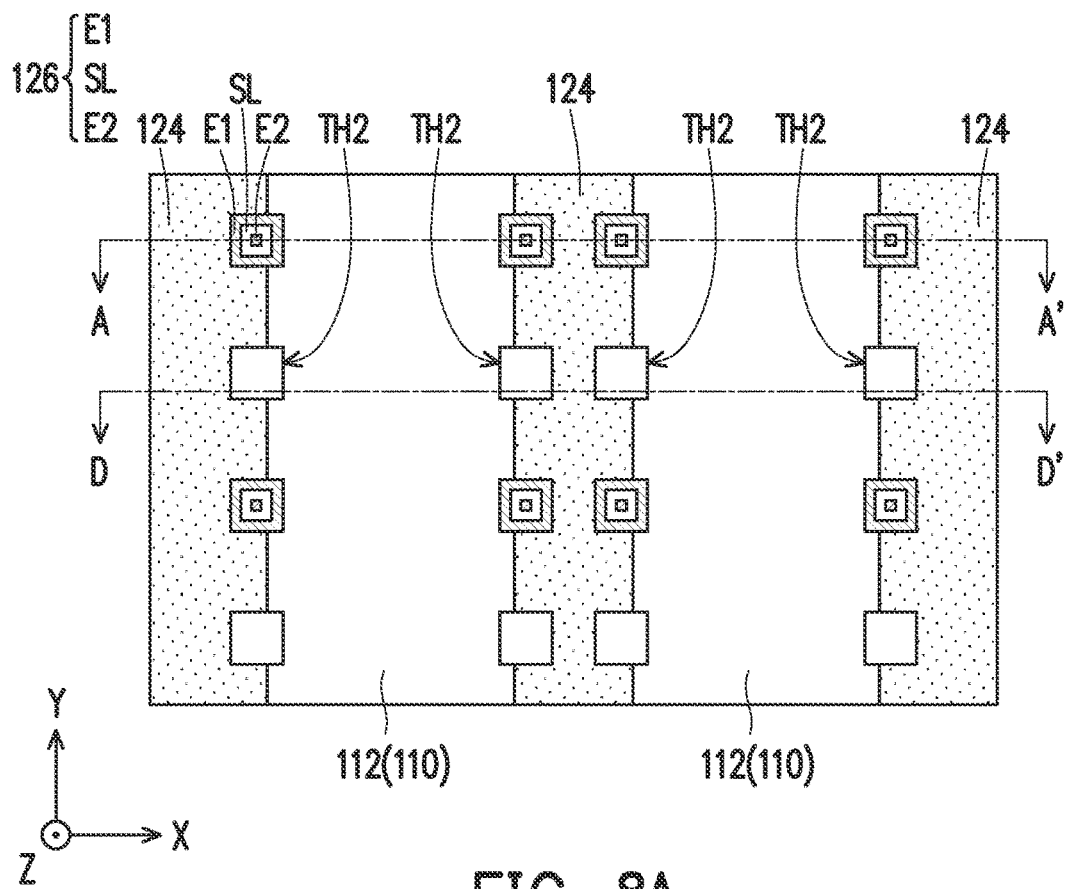
Figure 8B:
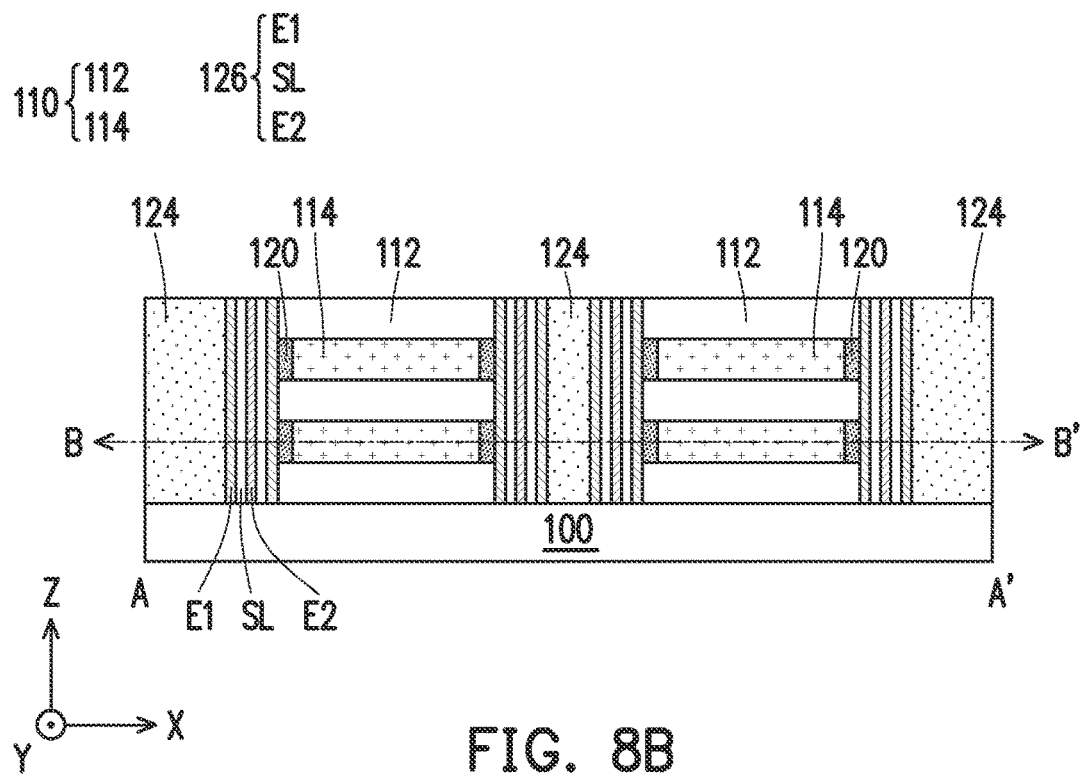
Figure 8C:
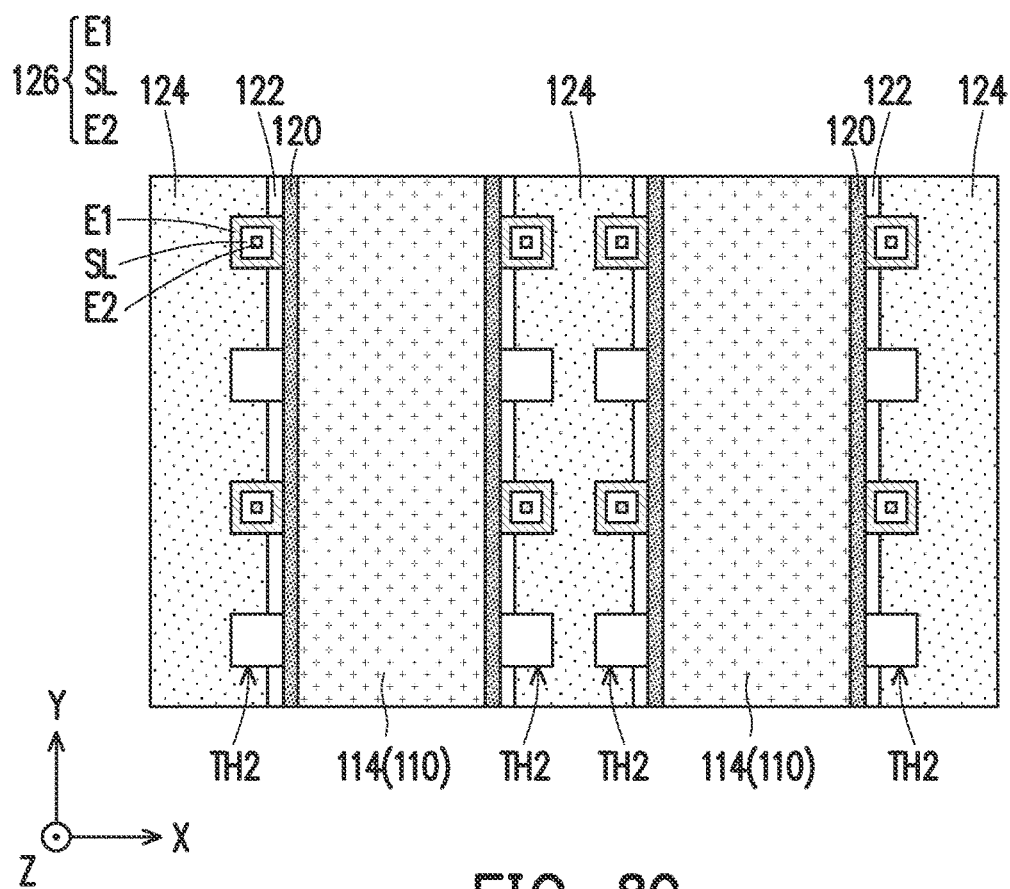
Figure 8D:
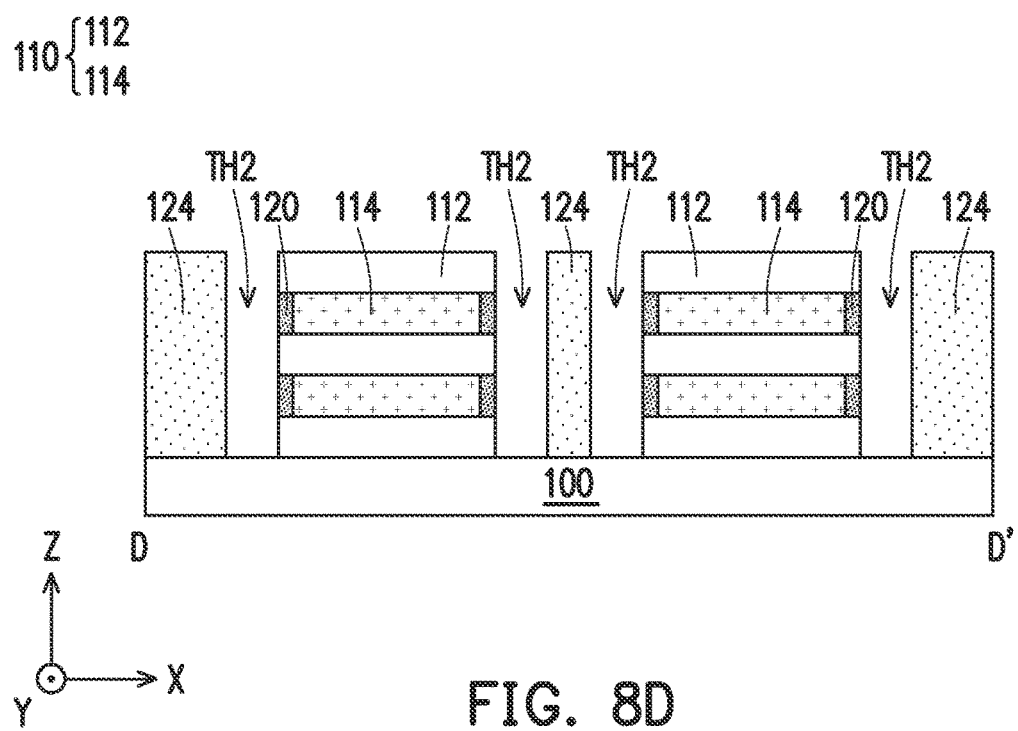

Referring to FIG. 8A, FIG. 8B, FIG. 8C and FIG. 8D, through holes TH2 are formed in the dielectric walls 124, the insulating layers 112 and the channel layers 122. In detail, as shown in FIG. 8A, FIG. 8C and FIG. 8D, each through hole TH2 penetrates through the corresponding dielectric wall 124, the corresponding insulating layers 112 and the corresponding channel layers 122 along the direction Z to expose the substrate 100. That is to say, each through hole TH2 vertically extends through the corresponding dielectric wall 124, the corresponding insulating layers 112 and the corresponding channel layers 122. Further, as shown in FIG. 8C, the through holes TH2 penetrate through the channel layers 122 to cut off the channel layers 122, such that each of the channel layers 122 is rendered as a discontinuous channel layer with more discontinuous segments than that after the through holes TH1 are formed. However, the disclosure is not limited thereto. In some alternative embodiments, the through holes TH2 may penetrate through the channel layers 122 without cutting off the channel layers 122. In addition, as shown in FIG. 8D, after forming the through holes TH2, the side surfaces of the gate dielectric layers 120 in contact with the channel layers 122 are exposed by the through holes TH2. However, the disclosure is not limited thereto. In embodiments where the through holes TH2 penetrate through the channel layers 122 without cutting off the channel layers 122, the gate dielectric layers 120 are not exposed by the through holes TH2. Although eight through holes TH2 are presented in FIG. 8A for illustrative purposes, those skilled in the art can understand that the number of the through holes TH2 may be more than what is depicted in FIG. 8A, and may be designated based on demand and/or design layout.

In some embodiments, the through holes TH2 are laterally separated from one another. As shown in FIG. 8A and FIG. 8C, the through holes TH2 are separately arranged as having multiple columns extending along the direction Y, and two adjacent columns of the through holes TH2 are spaced apart from each other along the direction X. The through holes TH2 in one of the adjacent columns of the through holes TH2 arranged in the same dielectric wall 124 are laterally separated from the through holes TH2 in another one of such adjacent columns by such dielectric wall 124. Further, as shown in FIG. 8A, FIG. 8C and FIG. 8D, the through holes TH2 in the same column are laterally separated from each other by the corresponding dielectric wall 124, the corresponding insulating layers 112, the corresponding channel layers 122 and the corresponding memory pillar 126. From another point of view, as shown in FIG. 8A and FIG. 8C, the memory pillars 126 and the through holes TH2 are separately arranged in an array of rows and columns. In detail, the memory pillars 126 and the through holes TH2 in the same column are alternately arranged along the direction Y. That is to say, the memory pillars 126 and the through holes TH2 in the same column are laterally separated from one another by the corresponding dielectric wall 124, the corresponding insulating layers 112 and the corresponding channel layers 122.

In some embodiments, the through holes TH2 are formed by using a lithography process and an etching process. A mask pattern, such as a patterned photoresist, may be formed over the multilayer stack 110. The etching process may then be performed by using the mask pattern as an etching mask to remove portions of the dielectric walls 124, the insulating layers 112 and the channel layers 122 so as to form the through holes TH2. After the etching process is finished, the mask pattern (e.g., patterned photoresist) may be removed by a suitable removal process, such as ashing or stripping. In some embodiments, the etching process is an anisotropic etching process.

Figure 9A:
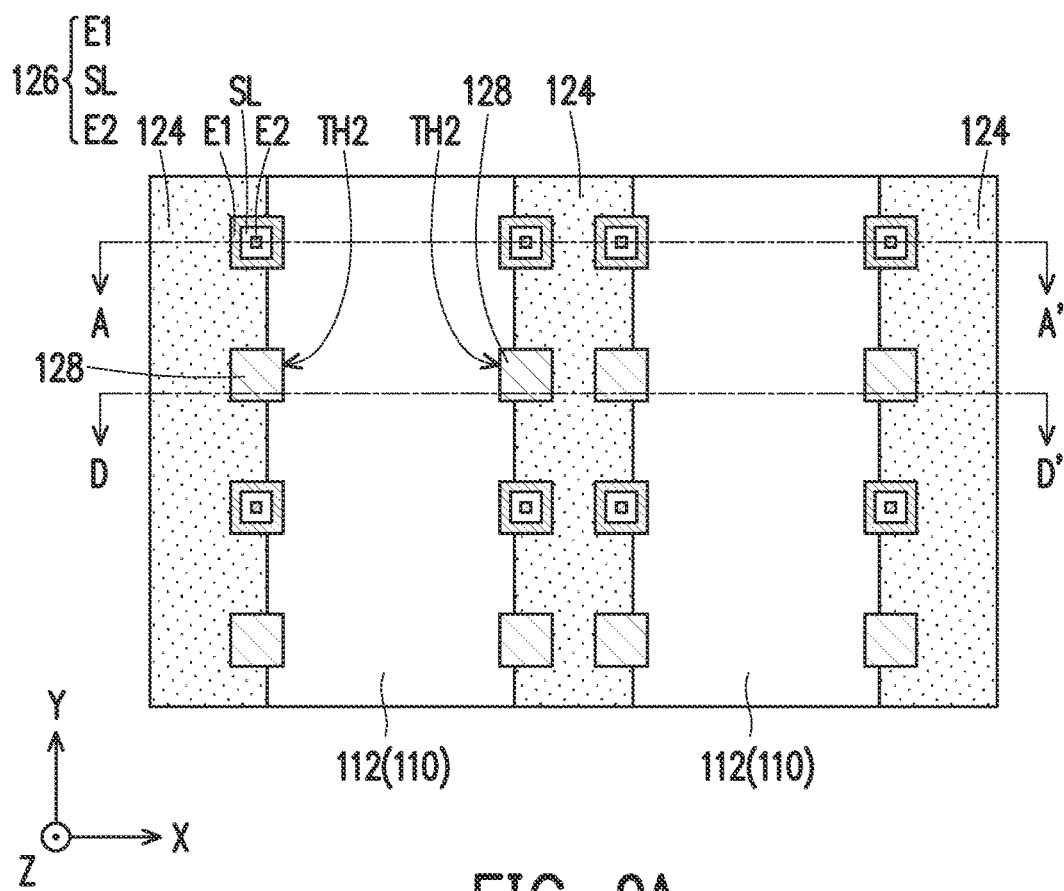
Figure 9B:
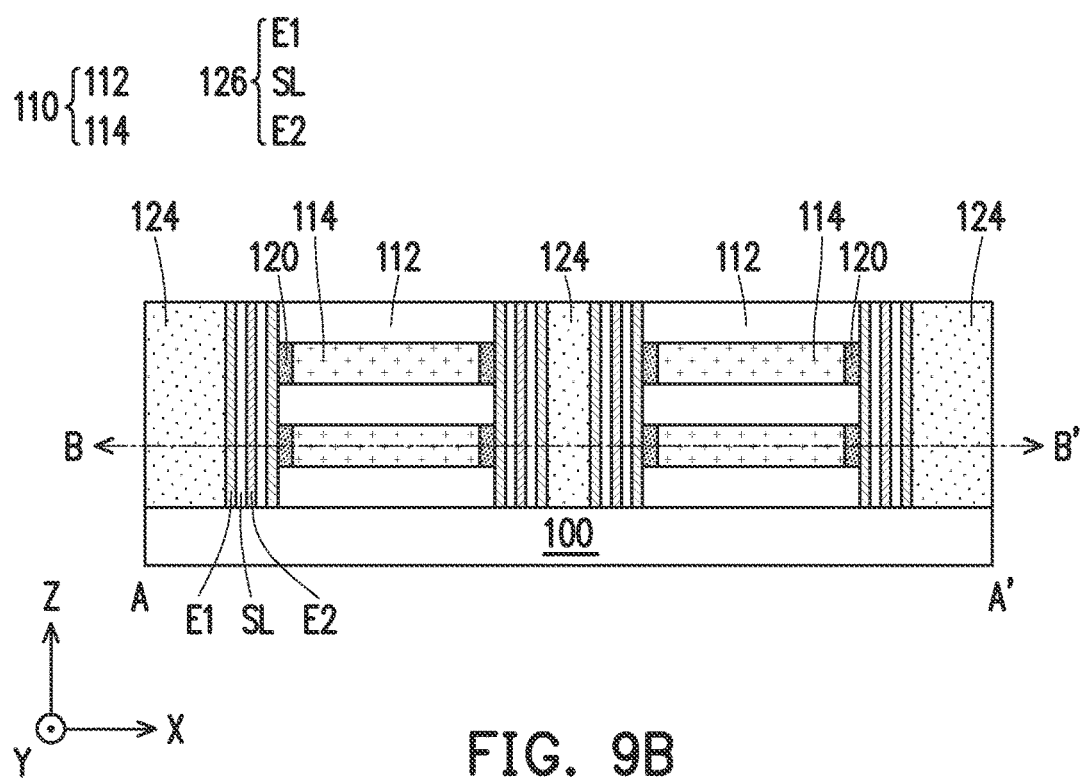
Figure 9C:
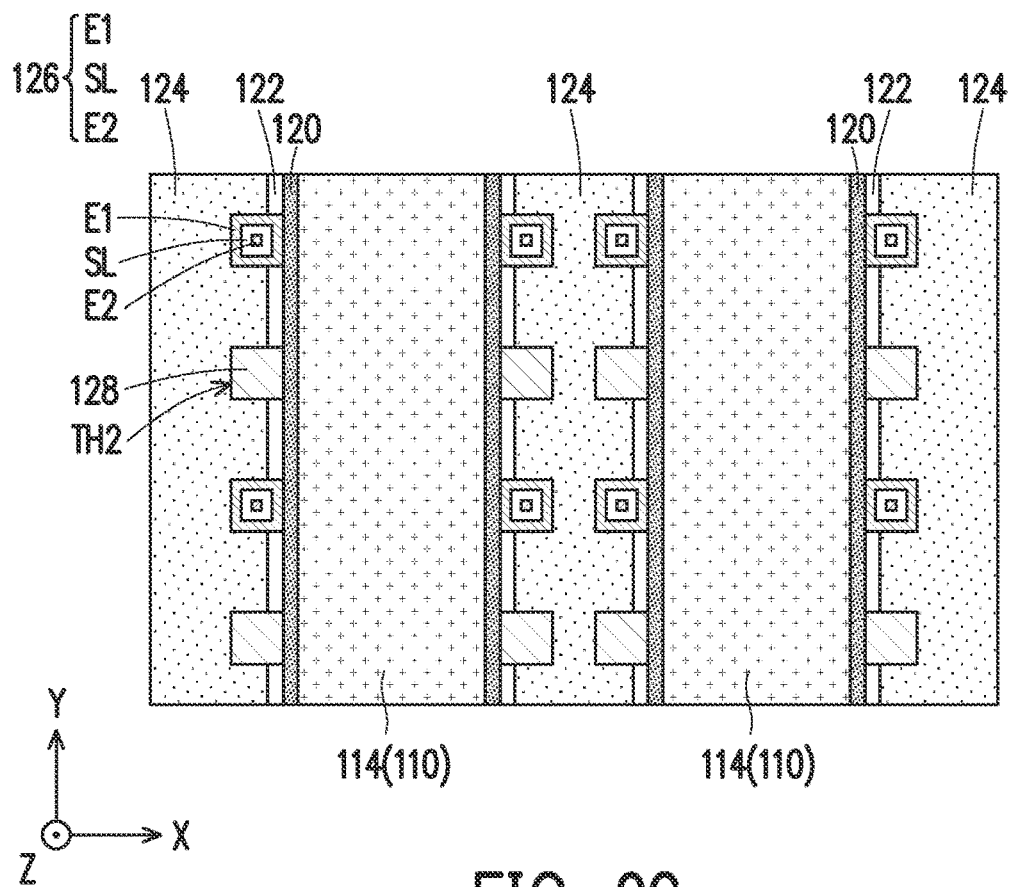
Figure 9D:
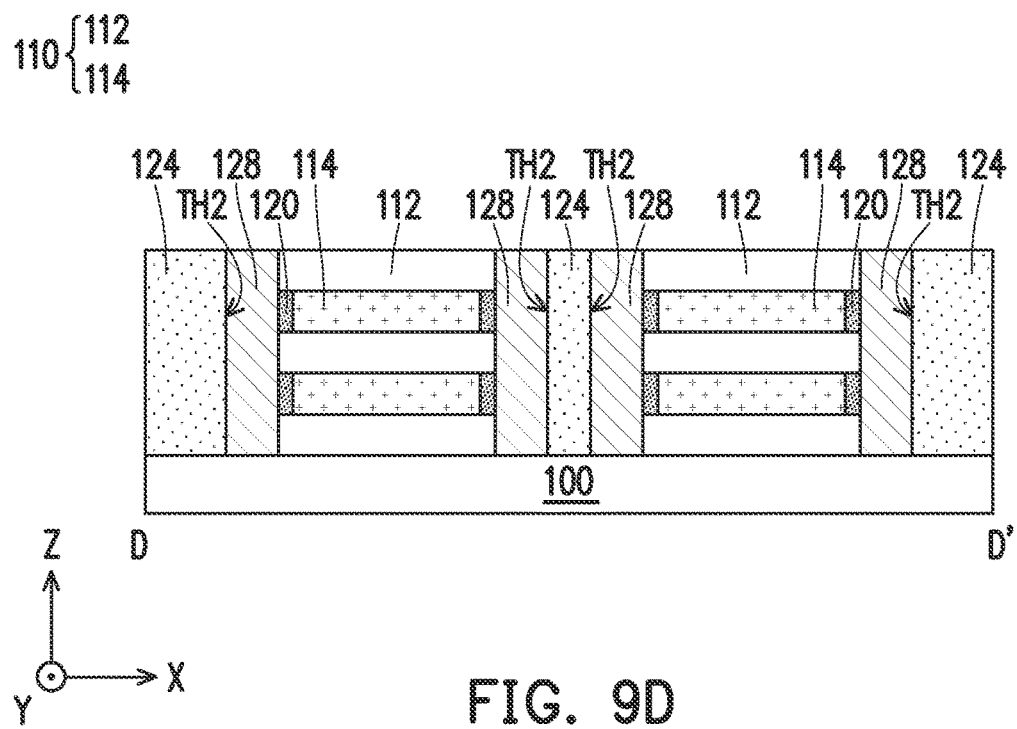

Referring to FIG. 9A, FIG. 9B, FIG. 9C and FIG. 9D, conductive pillars 128 are formed to fill up the through holes TH2. In detail, as shown in FIG. 9A, FIG. 9C and FIG. 9D, each conductive pillar 128 penetrates through the corresponding dielectric wall 124, the corresponding insulating layers 112 and the corresponding channel layers 122 along the direction Z and reaches to the top surface of the substrate 100 exposed by the corresponding through hole TH2. That is to say, each conductive pillar 128 vertically extends through the corresponding dielectric wall 124, the corresponding insulating layers 112 and the corresponding channel layers 122. In some embodiments, each conductive pillar 128 is formed to be in lateral contact with one of the corresponding channel layers 122 through more than one side surfaces. In the illustrated embodiment, as shown in FIG. 9C, since the through holes TH2 cut off the channel layers 122 to expose the side surfaces of the gate dielectric layers 120, two side surfaces of each conductive pillar 128 filling up the corresponding through hole TH2 are in lateral contact with one of the corresponding channel layers 122. From another point of view, the conductive pillars 128 filling up the through holes TH2 are in contact with the side surfaces of the gate dielectric layers 120 exposed by the through holes TH2. However, the disclosure is not limited thereto. In embodiments where the through holes TH2 penetrate through the channel layers 122 without cutting off the channel layers 122, portions of each conductive pillar 128 are embedded in the corresponding channel layers 122. In such case, three side surfaces of each conductive pillar 128 filling up the corresponding through hole TH2 are in lateral contact with one of the corresponding channel layers 122. Although eight conductive pillars 128 are presented in FIG. 9A for illustrative purposes, those skilled in the art can understand that the number of the conductive pillars 128 may be more than what is depicted in FIG. 9A, and may be designated based on demand and/or design layout.

In some embodiments, the conductive pillars 128 are laterally separated from one another. As shown in FIG. 9A and FIG. 9C, the conductive pillars 128 are separately arranged as having multiple columns extending along the direction Y, and two adjacent columns of the conductive pillars 128 are spaced apart from each other along the direction X. The conductive pillars 128 in one of the adjacent columns of the conductive pillars 128 arranged in the same dielectric wall 124 are laterally separated from the conductive pillars 128 in another one of such adjacent columns by such dielectric wall 124. Further, as shown in FIG. 9A, FIG. 9C and FIG. 9D, the conductive pillars 128 in the same column are laterally separated from each other by the corresponding dielectric wall 124, the corresponding insulating layers 112, the corresponding channel layers 122 and the corresponding memory pillar 126. From another point of view, as shown in FIG. 9A and FIG. 9C, the memory pillars 126 and the conductive pillars 128 are separately arranged in an array of rows and columns. In detail, the memory pillars 126 and the conductive pillars 128 in the same column are alternately arranged along the direction Y. That is to say, the memory pillars 126 and the conductive pillars 128 in the same column are laterally separated from one another by the corresponding dielectric wall 124, the corresponding insulating layers 112 and the corresponding channel layers 122.

In some embodiments, the conductive pillars 128 are formed by the following steps. After forming the through holes TH2, a conductive material is formed to fill up in the through holes TH2. The conductive material may include copper, titanium, titanium nitride, tantalum, tantalum nitride, tungsten, ruthenium, aluminum, combinations thereof, or the like, and may be formed by a deposition process (e.g., a CVD process, a ALD process or a PVD process), a plating process or a combination thereof. After the conductive material is formed, a planarization process, such as a CMP process, an etching process or a combination thereof, may be performed to remove portions of the conductive material outside the through holes TH2. In some embodiments, the portions of the conductive material removed by the planarization process are over the top surface of the topmost insulating layer 112, the top surfaces of the dielectric walls 124 and the top surfaces of the memory pillars 126. In some embodiments, the planarization process exposes the multilayer stack 110 and the dielectric walls 124, such that the top surface of the multilayer stack 110 (e.g., the top surface of the topmost insulating layer 112), the top surfaces of the dielectric walls 124 and the top surfaces of the remaining portions of the conductive material are substantially coplanar or level with one another after the planarization process is complete. The remaining portions of the conductive material in the through holes TH2 form the conductive pillars 128.

As shown in FIG. 6A to FIG. 9A, FIG. 6B to FIG. 9B, FIG. 6C to FIG. 9C and FIG. 8D to FIG. 9D, the conductive pillars 128 are formed after the memory pillars 126 are already formed, i.e., the step for forming the memory pillars 126 precedes the step for forming the conductive pillars 128. However, the disclosure is not limited thereto. In some alternative embodiments, the step for forming the conductive pillars 128 may precede the step for forming the memory pillars 126.

After forming the conductive pillars 128 in contact with the channel layers 122, the sacrificial layers 114 are subsequently replaced with gate layers 118 by a replacement process, which will be described in details in FIG. 10A to FIG. 12A, FIG. 10B to FIG. 12B, FIG. 10C to FIG. 12C and FIG. 10D to FIG. 12D.

Referring to FIG. 10A, FIG. 10B, FIG. 10C and FIG. 10D, trenches TR2 are formed in the multilayer stack 110. In the illustrated embodiment, the trenches TR2 penetrate through the remaining portions of the multilayer stack 110 rendered after forming the recesses Re (as described with reference to FIG. 3A and FIG. 3B) along the direction Z. To avoid clutter and for ease of discussion, the remaining portions of the multilayer stack 110 rendered after forming the recesses Re are referred to as the remaining portions of the multilayer stack 110 in the discussion hereinafter. In detail, each of the trenches TR2 is formed in one of the remaining portions of the multilayer stack 110 in a one-to-one relationship. From another point of view, in the illustrated embodiment, each of the trenches TR2 vertically extends through all layers (i.e., all the insulating layers 112 and sacrificial layers 114) of the corresponding remaining portion of the multilayer stack 110 to expose the substrate 100. That is to say, each remaining portion of the multilayer stack 110 can be regarded as being cut into two half portions by the corresponding trench TR2. However, the disclosure is not limited thereto. In some alternative embodiments, the trenches TR2 vertically extend through some but not all layers of the remaining portions of the multilayer stack 110. For example, the trenches TR2 may extend through all of the sacrificial layers 114 and expose the bottommost insulating layer 112.

Figure 10A:
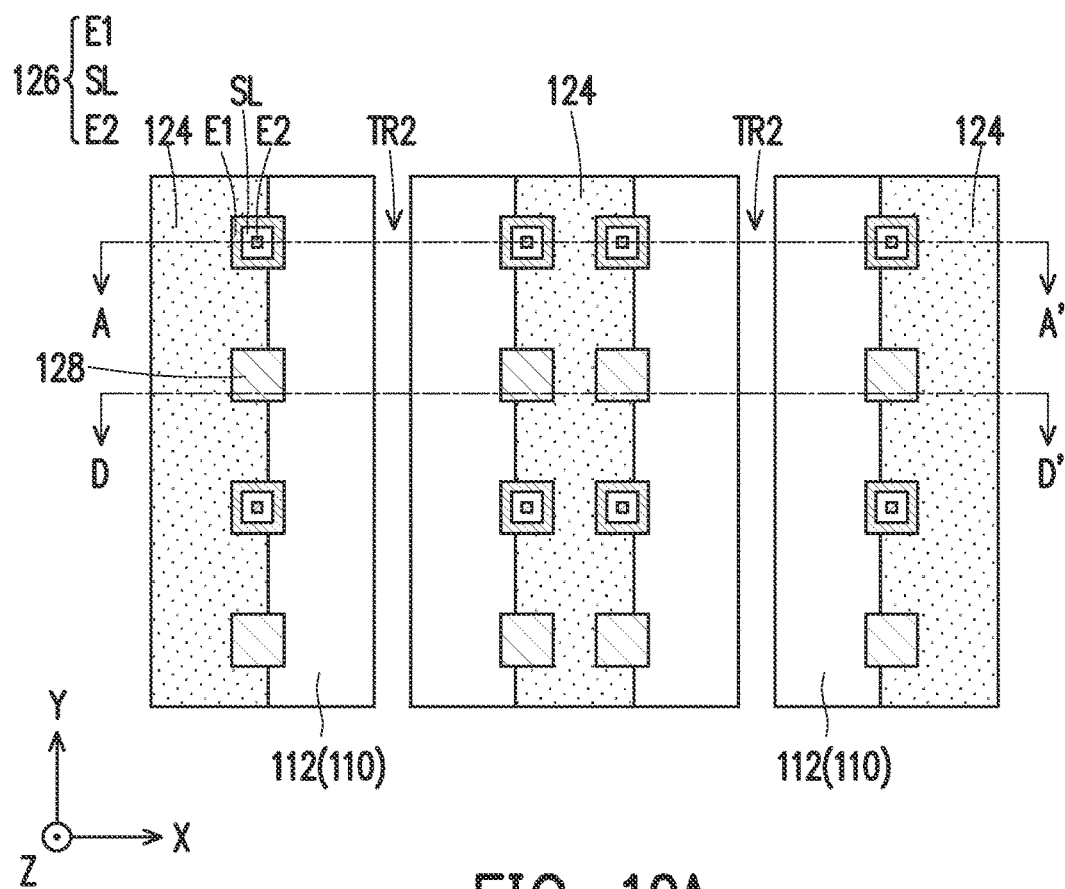
Figure 10B:
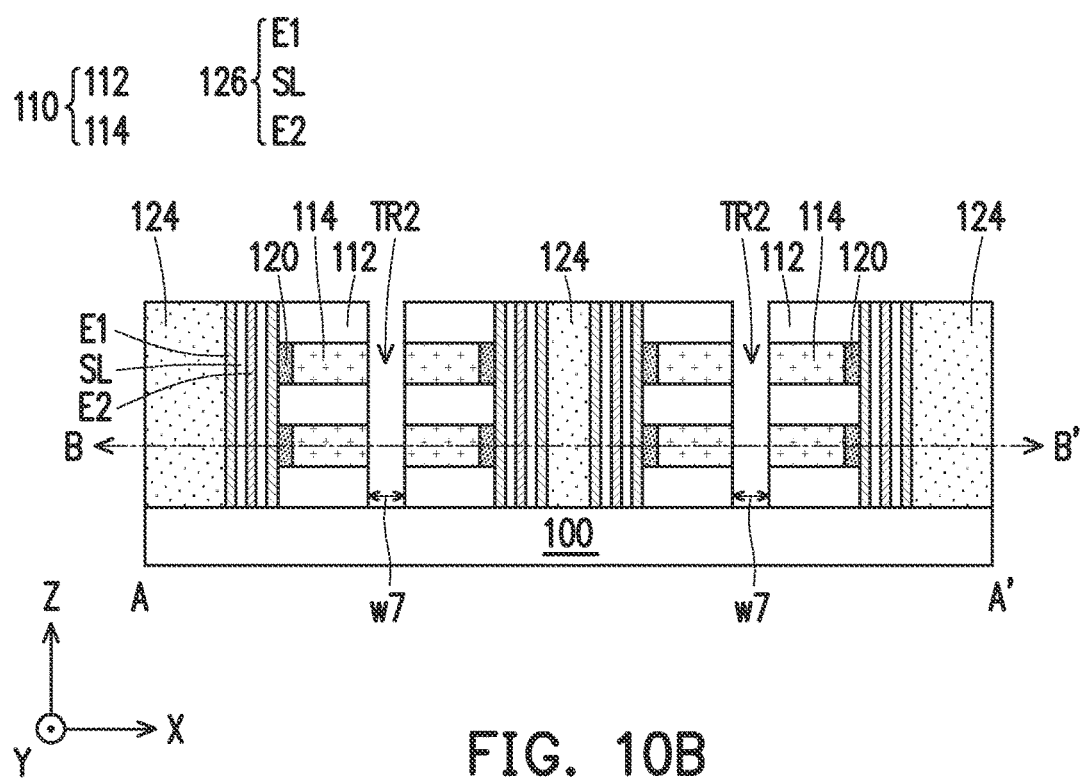
Figure 10C:
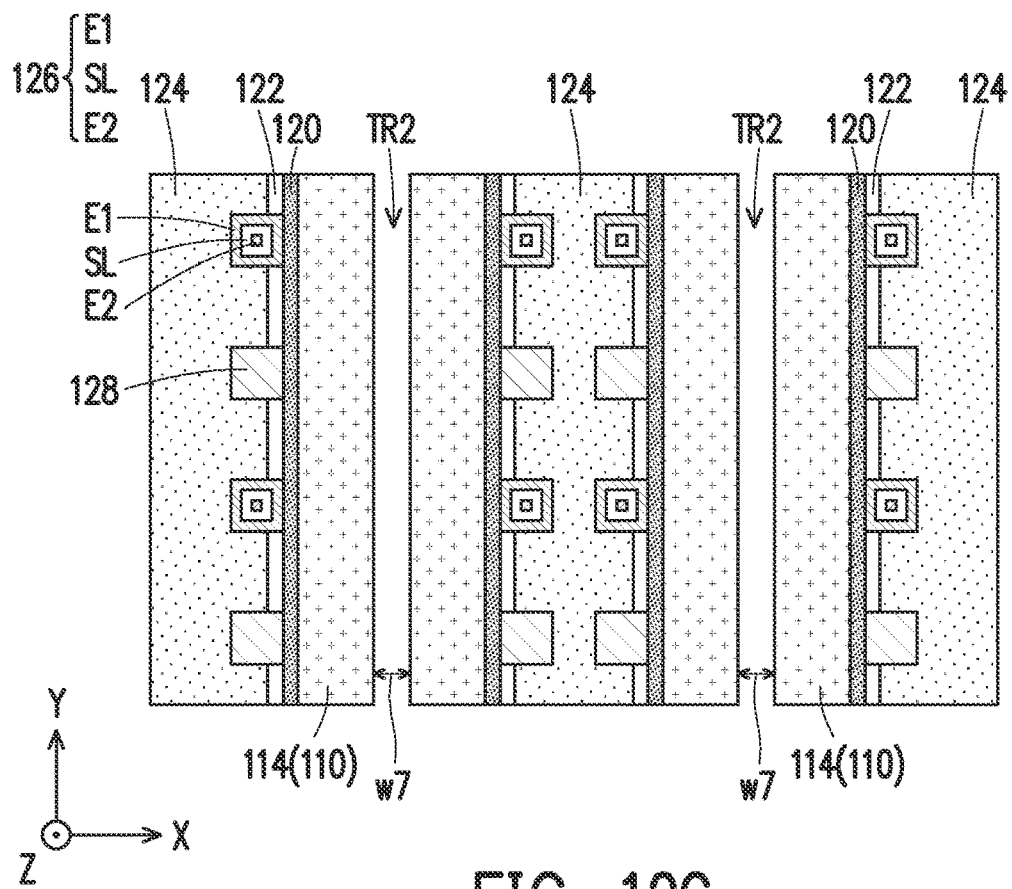
Figure 10D:
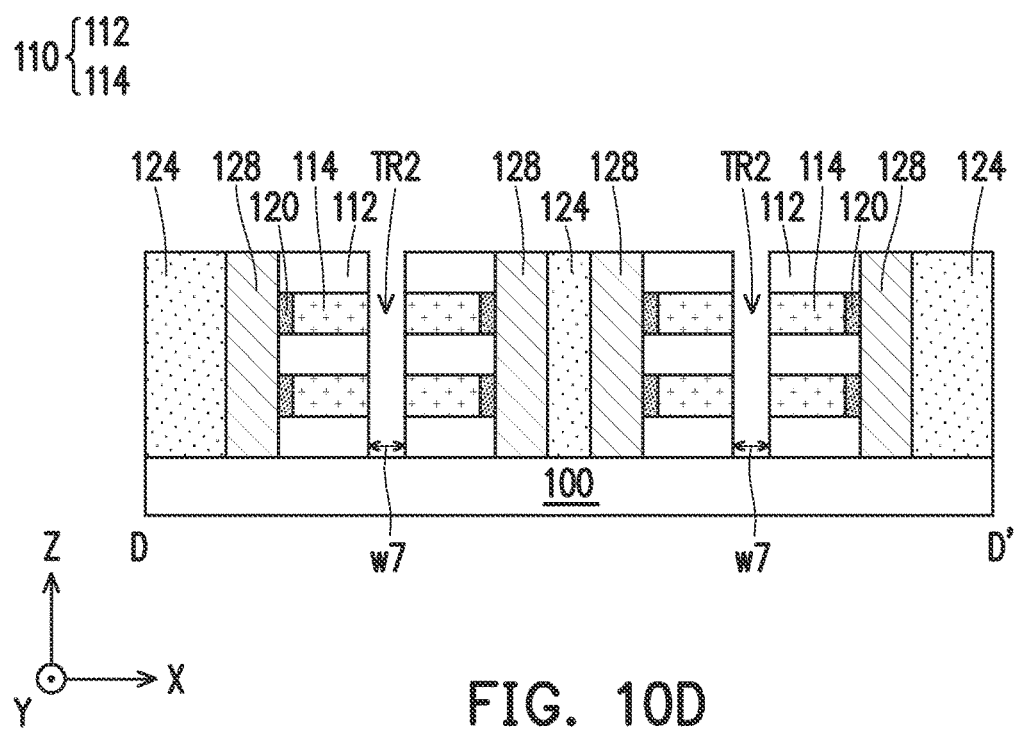
Figure 11A:
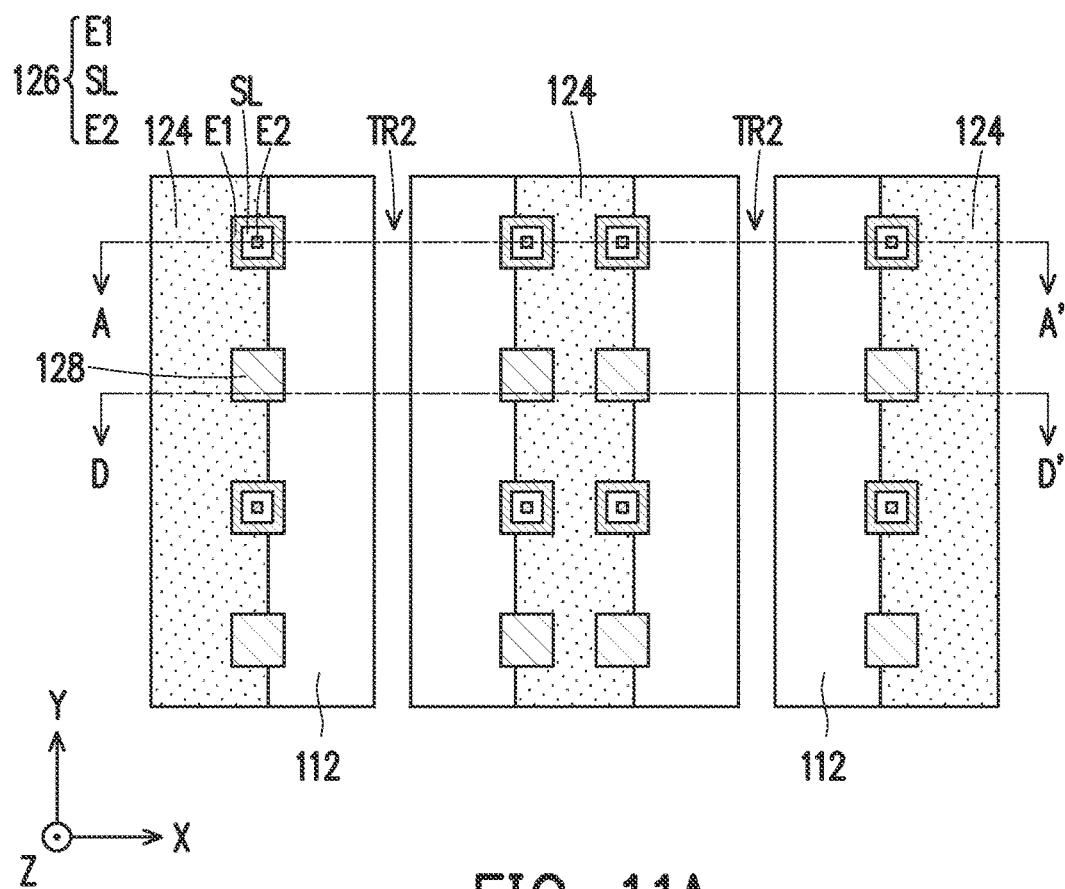
Figure 11B:
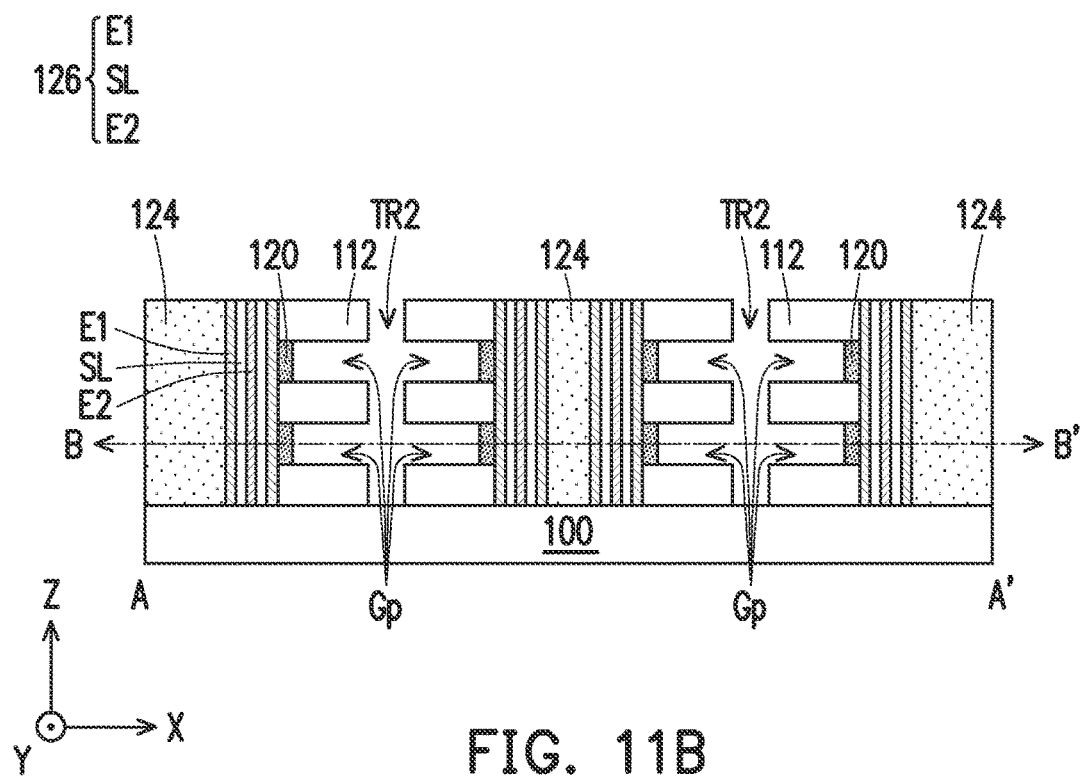
Figure 11C:
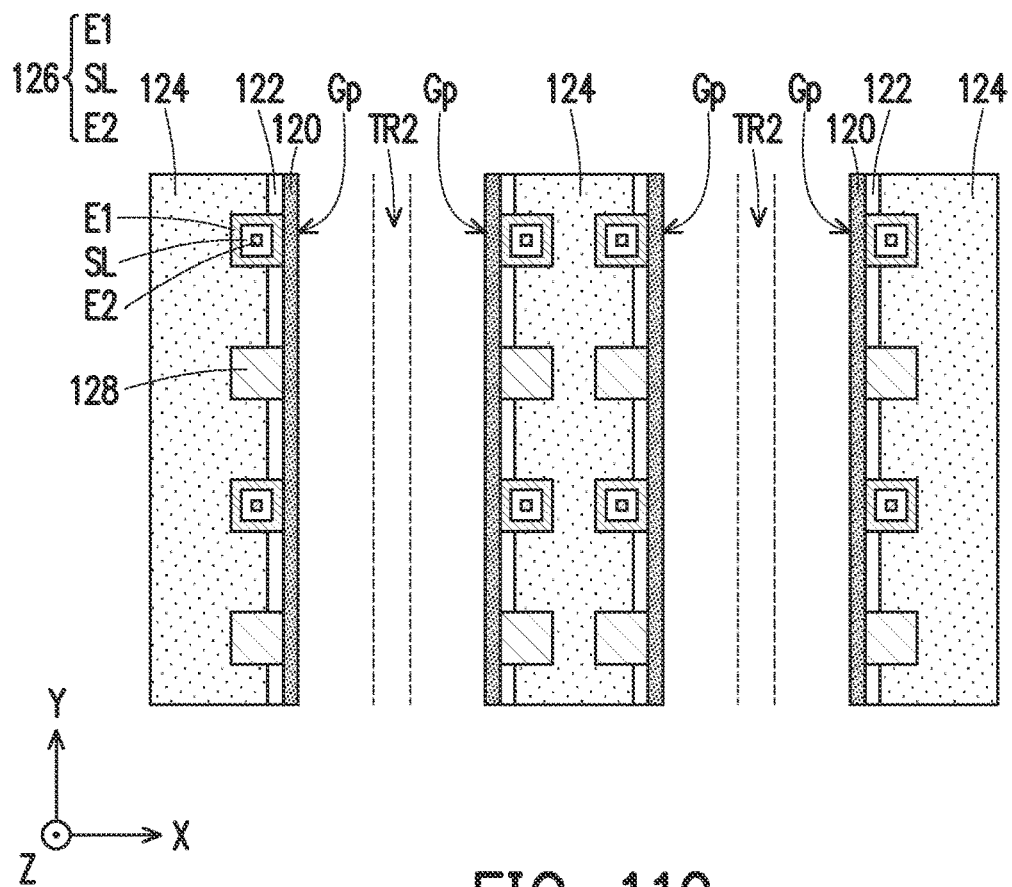
Figure 11D:
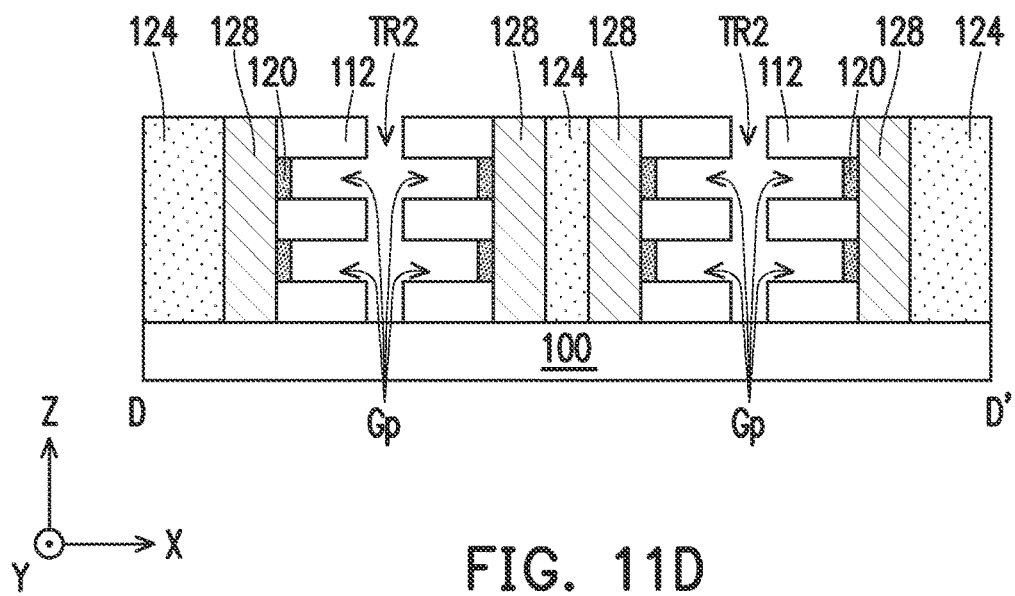

As shown in the top view of FIG. 10A and the plan view of FIG. 10C, the trenches TR2 laterally extend along the direction Y and are arranged along the direction X. Further, after forming the trenches TR2, the two half portions of each remaining portion of the multilayer stack 110 are laterally spaced apart from each other by one of the trenches TR2. In some embodiments, the trenches TR2 have a width w7 in the range of about 5 nm to about 10 nm along the direction X. That is to say, the two half portions of a remaining portion of the multilayer stack 110 are laterally spaced apart from each other by the separation distance equal to the width w7 of the trenches TR2. In addition, as shown in FIG. 10B, each trench TR2 exposes the remaining sacrificial layers 114 in each half portion of the corresponding remaining portion of the multilayer stack 110.

In some embodiments, the method for forming the trenches TR2 includes a lithography process and an etching process (e.g., an anisotropic etching process). Since the substrate 100 has sufficient etching selectivity with respect to the materials in the multilayer stack 110, the substrate 100 may remain substantially intact during the etching process. In some embodiments where the substrate 100 is formed of silicon carbide, the insulating layers 112 are formed of silicon oxide, and the sacrificial layers 114 are formed of silicon nitride, the trenches TR2 are formed by a dry etch using a fluorine-based gas (e.g., $C_4F_6$) mixed with hydrogen ($H_2$) or oxygen ($O_2$) gas. In some embodiments, the etching process for forming the trenches TR2 may be similar to the etching process used to form the trenches TR1 described with respect to FIG. 2A and FIG. 2B.

Referring to FIG. 11A, FIG. 11B, FIG. 11C and FIG. 11D, the remaining sacrificial layers 114 are selectively removed to form gaps Gp between the insulating layers 112. By removing the remaining sacrificial layers 114 via the trenches TR2, the surfaces of the insulating layers 112 and the gate dielectric layers 120 previously in contact with the sacrificial layers 114 are currently exposed by the gaps Gp. In addition, since the gate dielectric layers 120, the dielectric walls 124, the memory pillars 126 and the conductive pillars 128 are connected to the insulating layers 112, the gate dielectric layers 120, the dielectric walls 124, the memory pillars 126 and the conductive pillars 128 can provide support for the insulating layers 112, and prevent the insulating layers 112 from collapsing after removal of the remaining sacrificial layers 114. In some embodiments, the method for removing the remaining sacrificial layers 114 includes an isotropic etching process. Since the substrate 100, the insulating layers 112 and the gate dielectric layers 120 may have sufficient etching selectivity with respect to the sacrificial layers 114, the sacrificial layers 114 can be selectively removed during such isotropic etching process.

Referring to FIG. 12A, FIG. 12B, FIG. 12C and FIG. 12D, gate layers 118 are formed in the gaps Gp previously occupied by the sacrificial layers 114. In other words, the previously existing sacrificial layers 114 in each half portion of the remaining portions of the multilayer stack 110 are currently replaced by the gate layers 118. After forming the gate layers 118, stacking structures ST each including the insulating layers 112 and the gate layers 118 vertically alternately stacked on the substrate 100 are formed. That is to say, after performing the replacement process on the remaining portions of the multilayer stack 110 as described with respect to FIG. 10A to FIG. 12A, FIG. 10B to FIG. 12B, FIG. 10C to FIG. 12C and FIG. 10D to FIG. 12D, the remaining portions of the multilayer stack 110 turn into the stacking structures ST. In detail, as shown in FIG. 10B, FIG. 10D, FIG. 12B and FIG. 12D, after performing the replacement process, each remaining portion of the multilayer stack 110 turns into two stacking structures ST. Since the sacrificial layer 114, the corresponding gate dielectric layers 120 and the corresponding channel layers 122 are at substantially the same level in each remaining portion of the multilayer stack 110 as described with reference to FIG. 4A, FIG. 4B and FIG. 4C, the gate layer 118 taking the place of the sacrificial layer 114 in the stacking structure ST is at substantially the same level with the corresponding gate dielectric layer 120 and the corresponding channel layer 122.

In some embodiments, the stacking structures ST are laterally spaced apart from one another. In detail, as shown in FIG. 12A, FIG. 12B, FIG. 12C and FIG. 12D, two adjacent stacking structures ST at opposite sides of one of the trenches TR2 are laterally spaced apart from each other by the one of the trenches TR2. In some embodiments, the two adjacent stacking structures ST at opposite sides of one of the trenches TR2 are laterally spaced apart from each other by the separation distance equal to the width w7 of the trenches TR2 described with respect to FIG. 10A, FIG. 10B, FIG. 10C and FIG. 10D. Further, as shown in FIG. 12A, FIG. 12B, FIG. 12C and FIG. 12D, two adjacent stacking structures ST at opposite sides of one of the dielectric walls 124 are laterally spaced apart from each other by the one of the dielectric walls 124, the corresponding gate dielectric layers 120, the corresponding channel layers 122, the corresponding memory pillars 126 and the corresponding conductive pillars 128. As shown in the top view of FIG. 12A and the plan view of FIG. 12C, the stacking structures ST laterally extend along the direction Y and are arranged along the direction X. In some embodiments, the gate layers 118 of the stacking structure ST have a thickness t5 substantially the same as the thickness t3 of the gate dielectric layers 120 along the direction Z. In some embodiments, the thickness t5 of the gate layers 118 is in the range of about 15 nm to about 90 nm. In some embodiments, along the direction X, the gate layers 118 have a width w8 in the range of about 10 nm to about 160 nm.

Figure 12A:
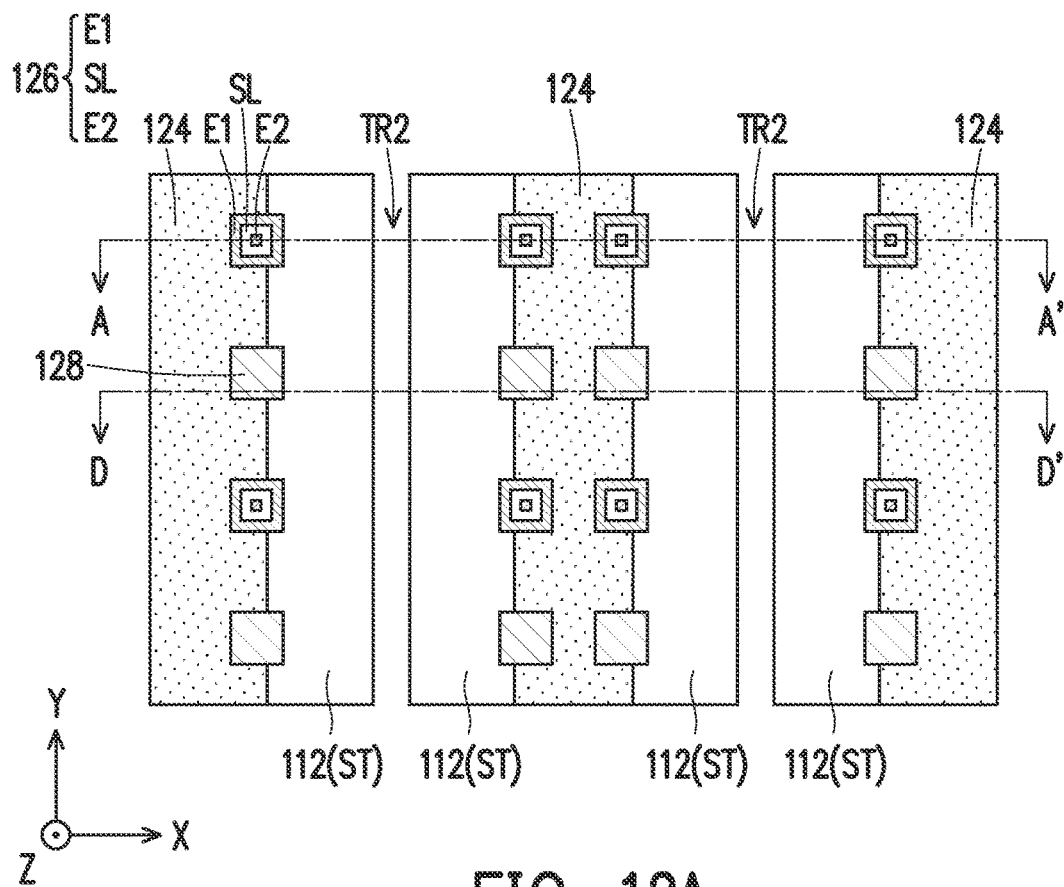
Figure 12B:
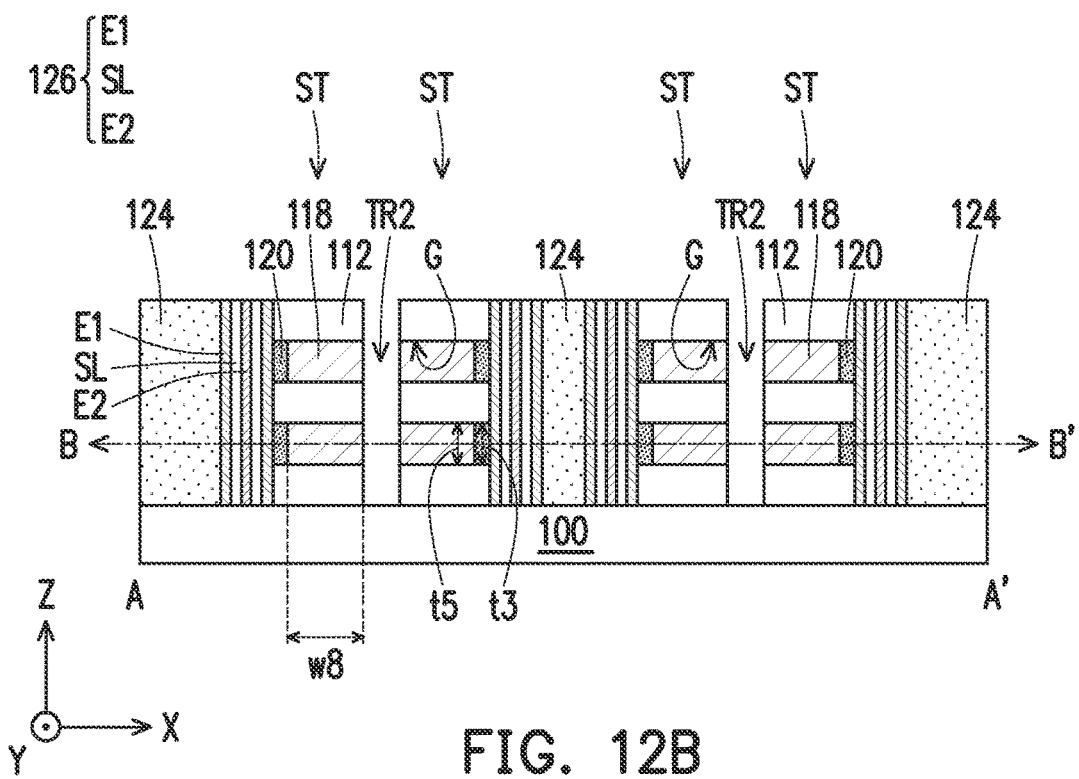
Figure 12C:
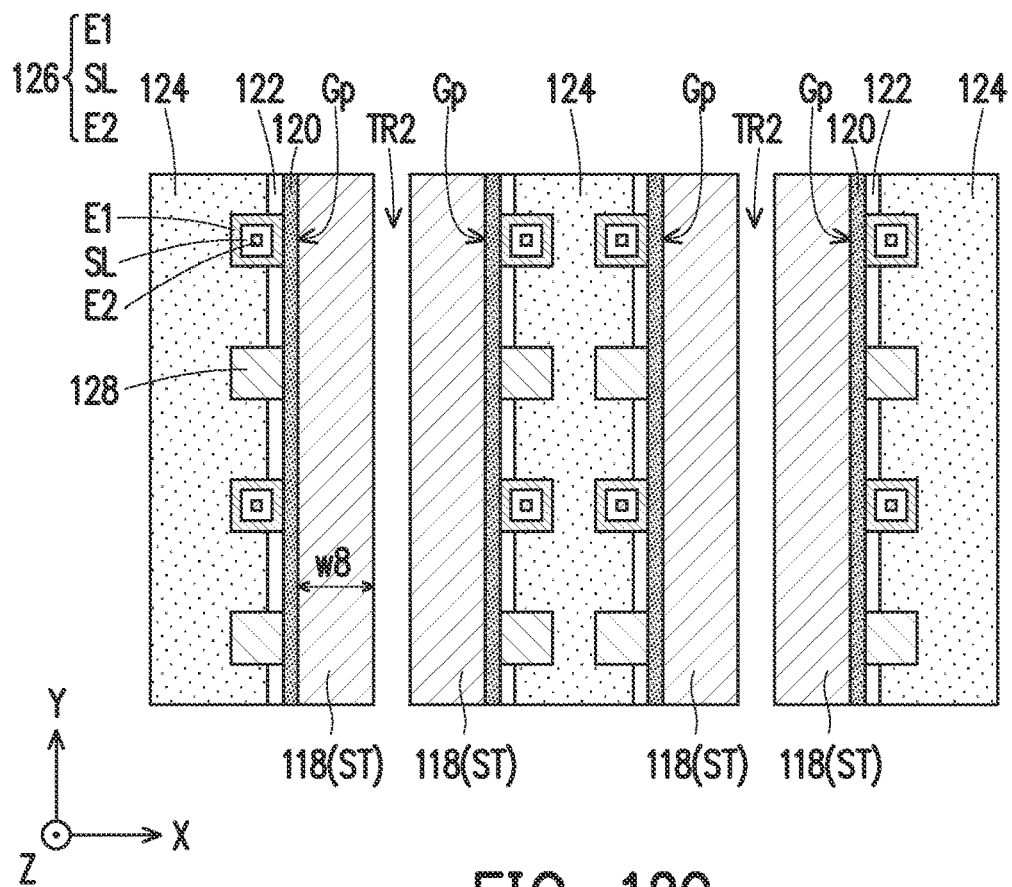
Figure 12D:
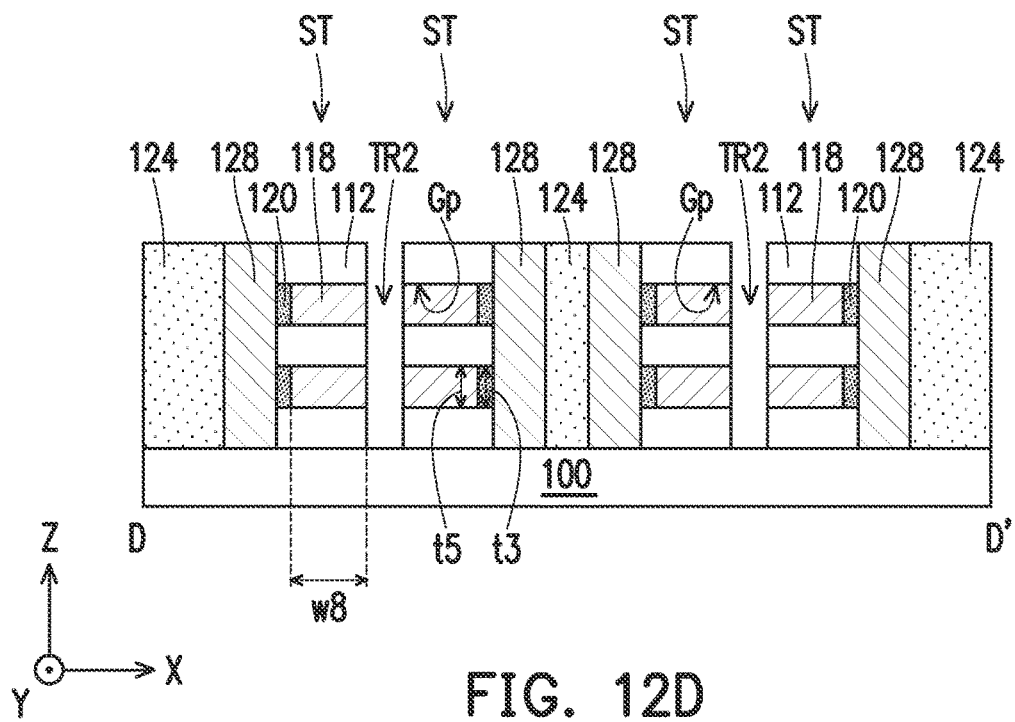

In some embodiments, each of the gate layers 118 is formed within one of the gaps Gp in a one-to-one relationship. As shown in FIG. 12B, FIG. 12C and FIG. 12D, the gate layer 118 is formed to cover or contact the side surface of the gate dielectric layer 120 exposed by the corresponding gap Gp. That is to say, the gate layer 118 is formed to cover or contact the side surface of the gate dielectric layer 120 which is opposite to the another side surface of the gate dielectric layer 120 in contact with the corresponding channel layer 122, the corresponding memory pillars 126 and the corresponding conductive pillars 128. In some embodiments, the side surfaces of the gate layers 118 exposed by the trenches TR2 are substantially coplanar or level with the side surfaces of the adjacent insulating layers 112 exposed by the trenches TR2, as shown in FIG. 10B. However, the disclosure is not limited thereto. In some alternative embodiments, the side surface of each gate layer 118 exposed by the corresponding trench TR2 is slightly recessed from the side surfaces of the adjacent insulating layers 112 exposed by the corresponding trench TR2 by a non-zero distance. The non-zero distance ranges from about 1 nm to about 5 nm, for example.

In some embodiments, the gate layers 118 are formed by the following steps. First, a gate material is formed over the substrate 100 to fill up the trenches TR2 and the gaps Gp between the insulating layers 112. In some embodiments, the gate material not only fills up the gaps Gp and the trenches TR2, but also further covers the top surfaces of the topmost insulating layers 112 in the stacking structures ST, the top surfaces of the memory pillars 126, the top surfaces of the conductive pillars 128 and the top surfaces of the dielectric walls 124. In some embodiments, the method for forming the gate material includes a deposition process, such as a CVD process, or ALD process. The gate material may include copper, tungsten, cobalt, aluminum, tungsten nitride, ruthenium, silver, gold, rhodium, molybdenum, nickel, cadmium, zinc, alloys thereof, combinations thereof, and the like. Thereafter, the portions of the gate material not covered by the insulating layers 112 in the stacking structures ST are removed by an etching process, such as an anisotropic etching process. The remaining portions of the gate material form the gate layers 118. In other words, the insulating layers 112 in the stacking structures ST may be functioned as shadow masks during such etching process, and such patterning of the gate material can be considered as a self-aligning process. In some alternative embodiments, barrier layers may be formed between the gate layers 118 and the adjacent insulating layers 112, so as to prevent the metal elements of the gate layers 118 from diffusing to the adjacent insulating layers 112. The barrier layers may also provide the function of increasing the adhesion between the gate layers 118 and the adjacent insulating layers 112, and may be referred to as glue layers in some examples. The barrier layers may include a metal nitride, such as titanium nitride, tantalum nitride, molybdenum nitride, zirconium nitride, or hafnium nitride. In some other embodiments, the barrier layers and the gate layers 118 have different date materials. For example, the gate layers 118 are made of tungsten, and the barrier layers are made of titanium nitride.

Figure 13A:
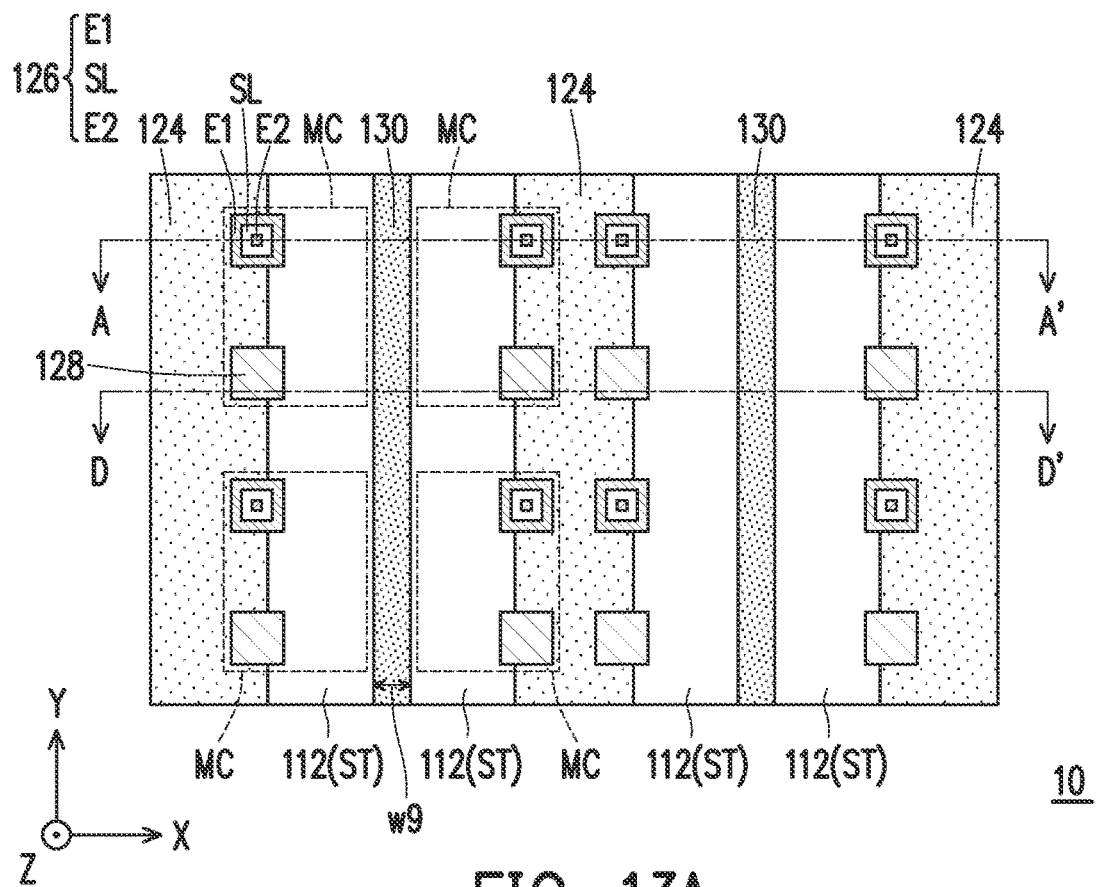
Figure 13B:
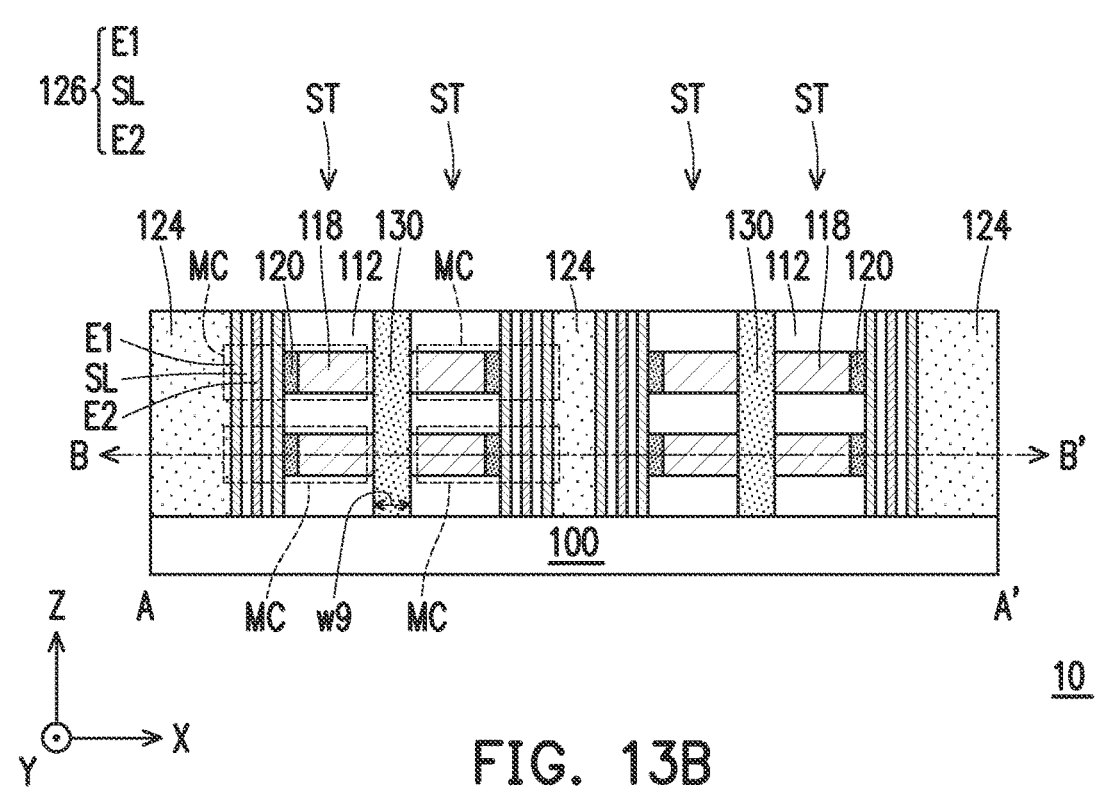
Figure 13C:
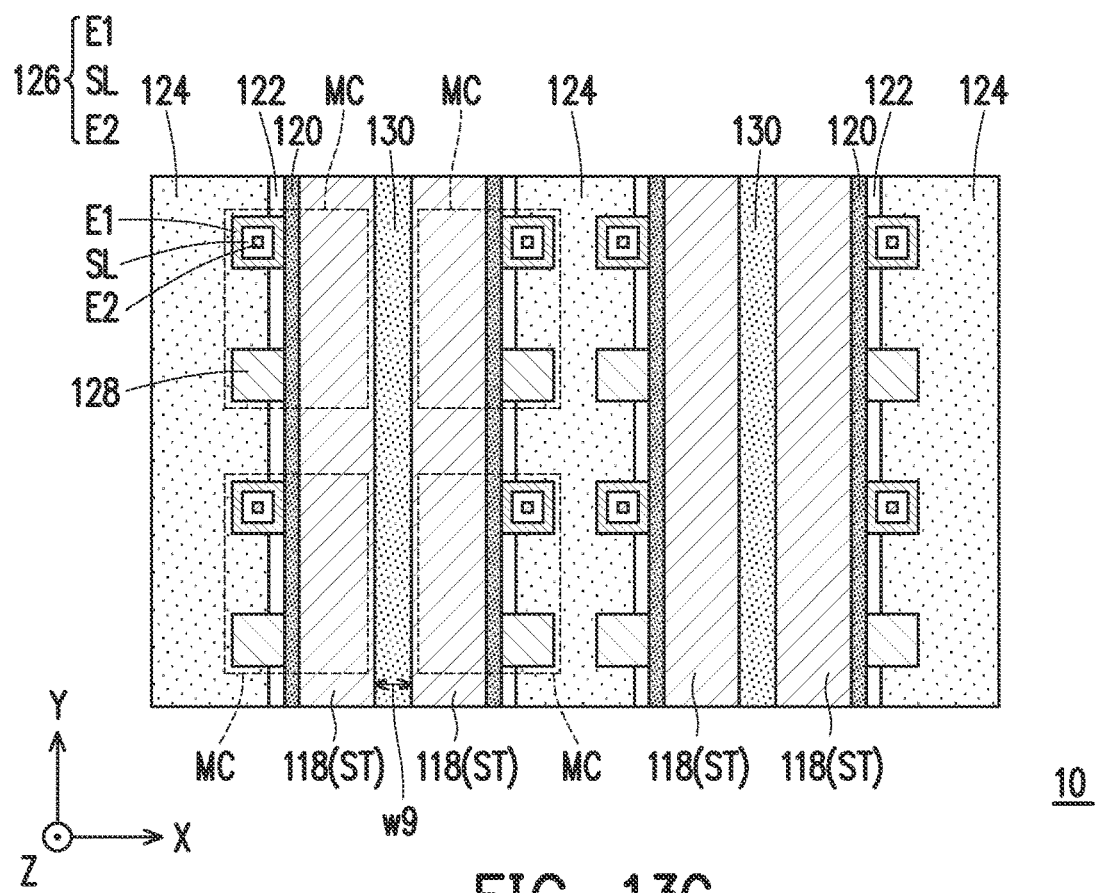
Figure 13D:
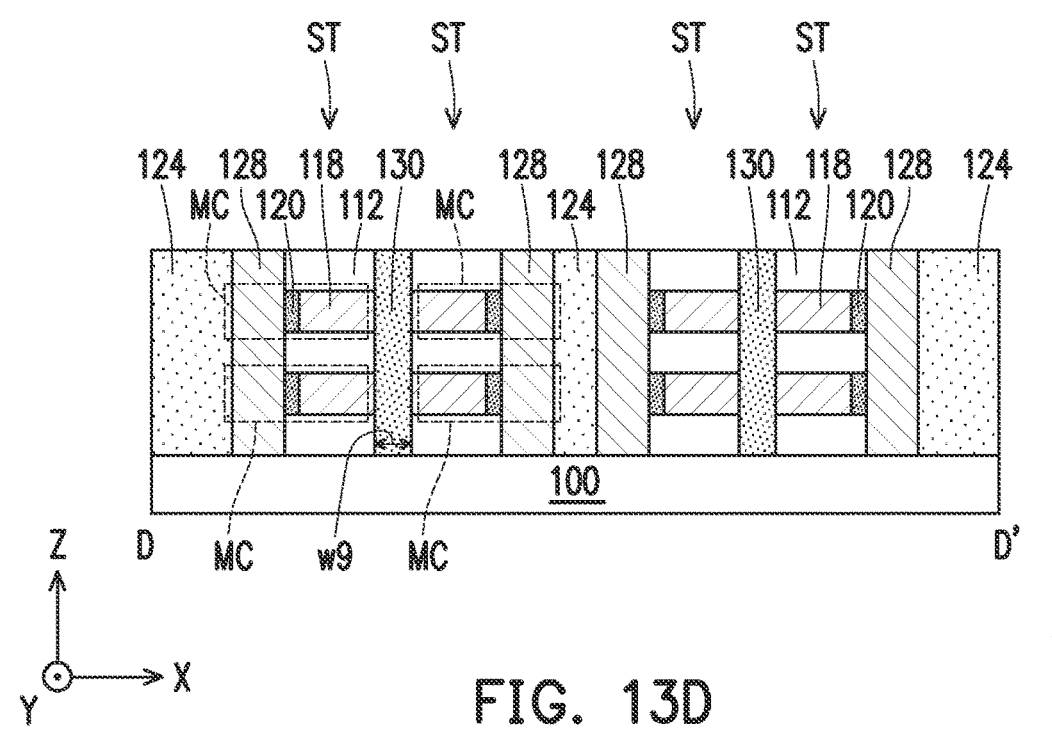

Referring to FIG. 13A, FIG. 13B, FIG. 13C and FIG. 13D, dielectric walls 130 are formed to fill up the trenches TR2. As shown in FIG. 13A, FIG. 13B, FIG. 13C and FIG. 13D, the dielectric walls 130 are in contact with the side surfaces of the insulating layers 112 exposed by the trenches TR2 and the side surfaces of the gate layers 118 exposed by the trenches TR2. That is to say, a dielectric wall 130 is in contact with the side surface of the corresponding insulating layer 112 which is opposite to the another side surface of the corresponding insulating layer 112 in contact with the dielectric wall 124, and in contact with the side surface of the corresponding gate layer 118 which is opposite to the another side surface of the corresponding gate layer 118 in contact with the gate dielectric layer 120. In embodiments where the side surface of each gate layer 118 exposed by the corresponding trench TR2 is substantially coplanar or level with the side surfaces of the adjacent insulating layers 112 exposed by the corresponding trench TR2, each side surface of the dielectric wall 130 in contact with the side surfaces of the insulating layers 112 and the side surfaces of the gate layers 118 exposed by the corresponding trench TR2 has a substantially smooth profile. In some embodiments, as shown in FIG. 13A, FIG. 13B, FIG. 13C and FIG. 13D, each side surface of the dielectric wall 130 in contact with the side surfaces of the insulating layers 112 and the side surfaces of the gate layers 118 exposed by the corresponding trench TR2 is substantially straight. However, the disclosure is not limited thereto. In embodiments where the side surface of each gate layer 118 exposed by the corresponding trench TR2 is slightly recessed from the side surfaces of the adjacent insulating layers 112 exposed by the corresponding trench TR2, each side surface of the dielectric wall 130 in contact with the side surfaces of the insulating layers 112 and the side surfaces of the gate layers 118 exposed by the corresponding trench TR2 has an uneven profile. In such case, the dielectric wall 130 may have laterally protruding portions in contact with the side surfaces of the corresponding gate layers 118 exposed by the corresponding trench TR2. In some embodiments, as shown in FIG. 13B and FIG. 13D, the bottom surfaces of the dielectric walls 130 are in contact with the top surface of the substrate 100 exposed by the trenches TR2. However, the disclosure is not limited thereto. In some alternative embodiments, the bottom surfaces of the dielectric walls 130 are not in contact with the top surface of the substrate 100 exposed by the trenches TR2. For example, the bottom surfaces of the dielectric walls 130 may in contact with the bottommost insulating layer 112.

In some embodiments, the dielectric walls 130 are formed by the following steps. A dielectric material is formed to fill up in the trenches TR2. The dielectric material may include silicon nitride, silicon oxide, silicon oxynitride, phosphosilicate glass (PSG), borosilicate glass (BSG), boron-doped phosphosilicate glass (BPSG), or the like, or a combination thereof, and may be formed by a suitable deposition process such as a CVD process, or an ALD process. After the dielectric material is formed, a planarization process, such as a CMP process, an etching process or a combination thereof, may be performed to remove portions of the dielectric material outside the trenches TR2. In some embodiments, the portions of the dielectric material removed by the planarization process are over the top surfaces of the topmost insulating layers 112 in the stacking structures ST. That is to say, the planarization process exposes the stacking structures ST such that the top surfaces of the stacking structures ST (e.g., the top surfaces of the topmost insulating layers 112) and the top surfaces of the remaining portions of the dielectric material are substantially coplanar or level with one another after the planarization process is complete. The remaining portions of the dielectric material in the trenches TR2 form the dielectric walls 130.

As shown in the top view of FIG. 13A and the plan view of FIG. 13C, the dielectric walls 130 laterally extend along the direction Y. In addition, as shown in the top view of FIG. 13A and the plan view of FIG. 13C, each of the dielectric walls 130 is disposed between two adjacent stacking structures ST. That is to say, two adjacent stacking structures ST at opposite sides of one of the dielectric walls 130 are laterally separated from each other by the one of the dielectric walls 130. In some embodiments, along the direction X, the dielectric walls 130 have a width w9 substantially the same as the width w7 of the trenches TR2 described with respect to FIG. 10A to FIG. 10D. In some embodiments, the width w9 of the dielectric walls 130 is in the range of about 5 nm to about 10 nm.

Up to here, the three-dimensional memory device 10 according to some embodiments of the present disclosure has been formed. Referring to FIG. 13A, FIG. 13B, FIG. 13C and FIG. 13D, the three-dimensional memory device 10 includes the stacking structures ST laterally spaced apart from one another, wherein each of the stacking structures ST includes the insulating layers 112 and the gate layers 118 vertically alternately stacked on the substrate 100. In detail, the stacking structures ST are laterally spaced apart from one another by dielectric walls (e.g., the dielectric walls 124 and dielectric walls 130). Further, the three-dimensional memory device 10 also includes the gate dielectric layers 120 between two adjacent insulating layers 112 in each of the stacking structures ST, and the channel layers 122 between two adjacent insulating layers 112 in each of the stacking structures ST. As shown in FIG. 13B, FIG. 13C and FIG. 13D, one of the gate layers 118 in each stacking structure ST is at substantially the same level with one of the gate dielectric layers 120 and one of the channel layers 122. That is to say, in each stacking structure ST, one gate layer 118, one gate dielectric layer 120 and one channel layer 122 are together sandwiched between the same underlying insulating layer 112 and the same overlying insulating layer 112. As such, the gate layer 118, the gate dielectric layer 120 and the channel layer 122 at substantially the same level can be collectively referred to as a stacking layer of the stacking structure ST. In view of this, the stacking structure ST can be regarded as including stacking layers (each including one gate layer 118, one gate dielectric layer 120 and one channel layer 122) and insulating layer 112 alternately stacked on the substrate 100 along the direction Z. From another point of view, as shown in FIG. 13B, FIG. 13C and FIG. 13D, in each stacking structure ST, the side surface of the gate layer 118 in contact with the corresponding gate dielectric layer 120 is laterally recessed from the side surfaces of the adjacent insulating layers 112 in contact with the corresponding dielectric wall 124. Further, the three-dimensional memory device 10 also includes the memory pillars 126 vertically extending from the top surface of the substrate 100 and laterally separated from one another, and the conductive pillars 128 vertically extending from the top surface of the substrate 100 and laterally separated from one another, wherein each of the memory pillars 126 includes the electrode E2, the switching layer SL wrapping around the electrode E2, and the electrode E1 wrapping around the switching layer SL.

In a stacking structure ST, a field effect transistor (FET) is collectively formed by: a portion of the gate layer 118; closest portions of the gate dielectric layer 120 and the channel layer 122, which are in the same stacking layer as the said gate layer 118 and are laterally adjacent to the said portion of the gate layer 118; a closest portion of the electrode E1 of the memory pillar 126 laterally adjacent to the said portion of the gate layer 118; and a closest portion of the conductive pillar 128, which is adjacent to said memory pillar 126 and laterally adjacent to the said portion of the gate layer 118. That is to say, one field effect transistor in the stacking structure ST can be regarded as including one gate layer 118, one gate dielectric layer 120, one channel layer 122, one conductive pillar 128, and the electrode E1 of one memory pillar 126. In some embodiments, in one field effect transistor, the gate layer 118 functions as a gate terminal of the field effect transistor, the electrode E1 of the memory pillar 126 functions as a drain terminal of the field effect transistor, and the conductive pillar 128 functions as a source terminal of the field effect transistor. However, the disclosure is not limited thereto. In some alternative embodiments, in one field effect transistor, the electrode E1 of the memory pillar 126 functions as a source terminal of the field effect transistor, and the conductive pillar 128 functions as a drain terminal of the field effect transistor. Further, as mentioned above, the switching layer SL can be configured to store multiple logic states by creating the voltage difference between the electrode E1 and the electrode E2, such that in one memory pillar 126, a portion of the electrode E1 connected to one field effect transistor, a closest portion of the switching layer SL laterally adjacent to the said portion of the electrode E1, and a closest portion of the electrode E2 laterally adjacent to the said portion of the electrode E1 collectively form a storage element. As such, as shown in FIG. 13C, one field effect transistor and one storage element connected to the one field effect transistor collectively form a memory cell MC. In detail, in one memory cell MC, the field effect transistor and the storage element are connected with each other via the electrode E1 of the corresponding memory pillar 126. That is to say, in one memory cell MC, the electrode E1 of the memory pillar 126 is shared by the field effect transistor and the storage element. From another point of view, the memory cell MC having one field effect transistor and one storage element is typically known as a 1-transistor 1-resistor (1T1R) configuration. That is to say, the memory cell MC can be regarded as a 1T1R memory cell.

In those embodiments where the switching layers SL are formed of a phase change material, as crystallinity of a switching layer SL is changed due to joule heating resulting from the voltage difference between the electrode E1 and the electrode E2, the switching layer SL is able to be switched between multiple resistance states. In these embodiments, in the memory cell MC, the switching of the field effect transistor affects the voltage of one terminal (i.e., the electrode E1) of the storage element, such that the field effect transistor can determine access to the storage element. As such, the field effect transistor in the memory cell MC can be regarded as an access transistor. In these embodiments, the memory cell MC is regarded as a phase change random access memory (PCRAM) cell.

In those embodiments where the switching layers SL are formed of a variable resistance material in which a conductive filament may be formed, as the conductive filament is formed or not formed in a switching layer SL due to an electric field resulting from creating the voltage difference between the electrode E1 and the electrode E2, the switching layer SL is able to be switched between multiple resistance states. In these embodiments, in the memory cell MC, the switching of the field effect transistor affects the voltage of one terminal (i.e., the electrode E1) of the storage element, such that the field effect transistor can determine access to the storage element. As such, the field effect transistor in the memory cell MC can be regarded as an access transistor. In these embodiments, the memory cell MC is regarded as a resistive random access memory (RRAM) cell.

Further, as shown in FIG. 13B, FIG. 13C and FIG. 13D, a stack of memory cells MC is formed by: the stacking layers (each including one gate layer 118, one gate dielectric layer 120 and one channel layer 122) stacked along the direction Z (i.e., the vertical direction) in each stacking structure ST; and one memory pillar 126 and one conductive pillar 128, which are adjacent to each other and said stacking layers. In addition, as shown in FIG. 13A, FIG. 13B, FIG. 13C and FIG. 13D, multiple stacks of the memory cells MC are arranged along the direction X (i.e., the horizontal direction) and the direction Y (i.e., the horizontal direction). That is to say, the multiple stacks of the memory cells MC are separately arranged in an array of rows and columns. In detail, the multiple stacks of the memory cells MC are separately arranged as having multiple columns extending along the direction Y and multiple rows extending along the direction X.

As shown in FIG. 13B, FIG. 13C and FIG. 13D, a channel layer 122 is shared by the corresponding column of memory cells MC along the direction Y, and thus conductive channels of these memory cells MC are formed in different sections of the channel layer 122. In addition, as shown in FIG. 13B, FIG. 13C and FIG. 13D, laterally adjacent memory cells MC at opposite sides of one of the dielectric walls 130 are separated from each other by the one of the dielectric walls 130. That is to say, the gate layers 118 of the laterally adjacent memory cells MC at opposite sides of one of the dielectric walls 130 are physically and electrically separate from each other. In other words, the laterally adjacent memory cells MC at opposite sides of one of the dielectric walls 130 include two separate, independent gate layers 118. Consequently, in the three-dimensional memory device 10, the disturbance between the laterally adjacent memory cells at opposite sides of one of the dielectric walls 130 can be effectively prevented. Further, as shown in FIG. 13B, FIG. 13C and FIG. 13D, laterally adjacent memory cells MC at opposite sides of one of the dielectric walls 124 are separated from each other by the one of the dielectric walls 124. That is to say, the memory pillar 126 and the conductive pillar 128 in one memory cell MC at one side of one of the dielectric walls 124 are physically and electrically separate from the memory pillar 126 and the conductive pillar 128 in another memory cell MC laterally adjacent to the one memory cell MC and at another side of the one of the dielectric walls 124. In other words, the laterally adjacent memory cells MC at opposite sides of one of the dielectric walls 124 respectively have their own pair of source and drain terminals. Consequently, in the three-dimensional memory device 10, the disturbance between the laterally adjacent memory cells at opposite sides of one of the dielectric walls 124 can be effectively prevented.

In addition, although not shown, the three-dimensional memory device 10 further includes bit lines and source lines electrically connected to the memory pillars 126 and the conductive pillars 128. In some embodiments, the electrode E2 of the memory pillar 126 and the conductive pillar 128 in each stack of memory cells MC are connected to one of the bit lines and one of the source lines, respectively. However, the disclosure is not limited thereto. In some alternative embodiments, the electrode E2 of the memory pillar 126 and the conductive pillar 128 in each stack of memory cells MC are connected to one of the source lines and one of the bit lines, respectively. In some embodiments, the bit lines and the source lines extend along the direction X. In some embodiments, the electrodes E2 of the memory pillars 126 and the conductive pillars 128 in adjacent stacks of memory cells MC may be connected to different bit lines and different source lines. Accordingly, the memory cells MC in adjacent stacks of memory cells MC can be controlled by different bit lines and different source lines, whereby disturbance between the memory cells MC in adjacent stacks of memory cells MC can be reduced. In embodiments where the electrodes E2 of the memory pillars 126 and the conductive pillars 128 in adjacent stacks of memory cells MC are connected to different bit lines and different source lines, the bit lines and the source lines are disposed at opposite sides of the substrate 100. For example, the source lines extend below the substrate 100, while the bit lines extend above the stacking structures ST. As another example, the source lines extend above the stacking structures ST, while the bit lines extend below the substrate 100. However, the disclosure is not limited thereto. In some alternative embodiments, the bit lines and the source lines may be disposed at the same side of the substrate 100. In such embodiments, the bit lines and the source lines are alternately arranged along the direction Y, wherein each of the bit lines is electrically connected to the electrodes E2 of the memory pillars 126 in the same row, and each of the source lines is electrically connected to the conductive pillars 128 in the same row.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 14:
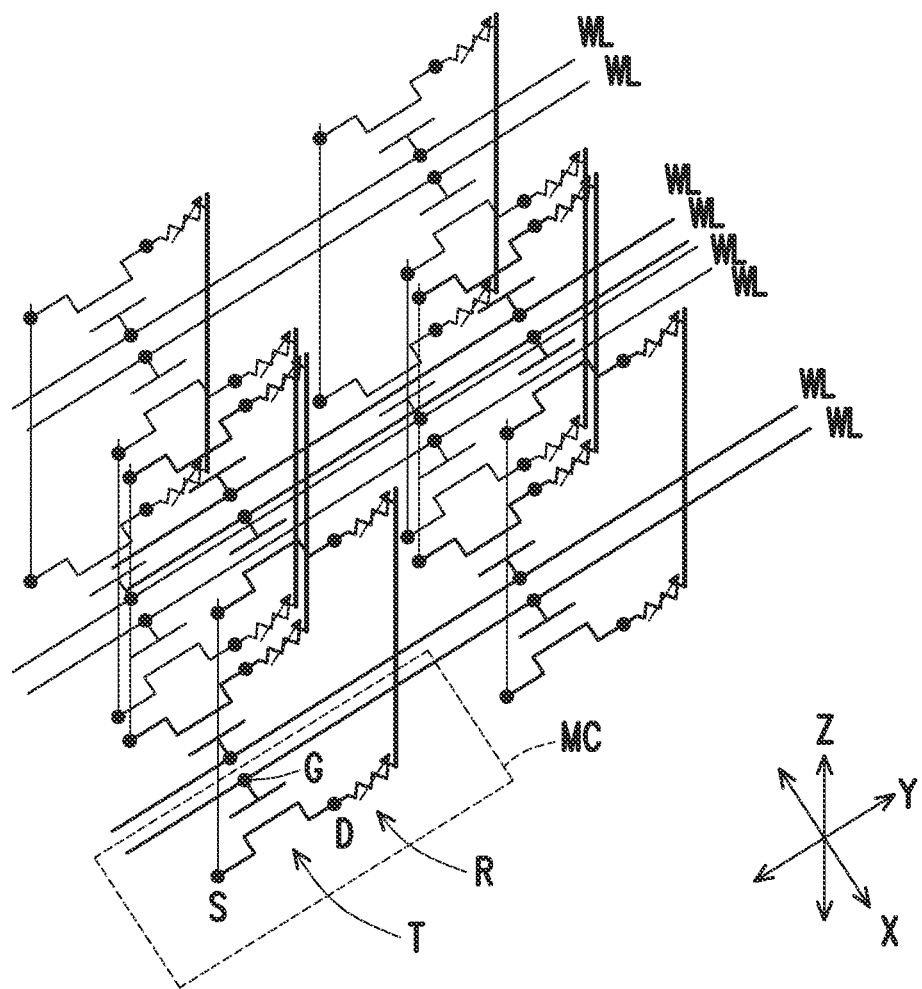
FIG. 14 is an equivalent circuit diagram of the three-dimensional memory device shown in FIG. 13A, FIG. 13B and FIG. 13C.

FIG. 14 is an equivalent circuit diagram of the three-dimensional memory device shown in FIG. 13A, FIG. 13B, FIG. 13C and FIG. 13D.

Referring to FIG. 13B, FIG. 13C, FIG. 13D and FIG. 14, the gate layers 118 in each stacking structure ST shown in FIG. 13B, FIG. 13C, FIG. 13D function as word lines WL as shown in FIG. 14. The field effect transistor including the gate layer 118, the gate dielectric layer 120, the channel layer 122, the conductive pillar 128, and the electrode E1 of the memory pillar 126 in one of the memory cells MC shown in FIG. 13B, FIG. 13C, FIG. 13D is illustrated as a transistor T in FIG. 14. In some embodiments, the gate layer 118 of the field effect transistor in one of the memory cells MC shown in FIG. 13B, FIG. 13C, FIG. 13D functions as a gate terminal G of the transistor T as shown in FIG. 14, the electrode E1 of the memory pillar 126 of the field effect transistor in one of the memory cells MC shown in FIG. 13B, FIG. 13C, and FIG. 13D may function as a drain terminal D of the transistor T as shown in FIG. 14, and the conductive pillar 128 of the field effect transistor in one of the memory cells MC shown in FIG. 13B, FIG. 13C, and FIG. 13D may function as a source terminal S of the transistor T as shown in FIG. 14. As shown in FIG. 14, each word line WL connects gate terminals G of the corresponding column of transistors T along the direction Y. In some embodiments, the conductive pillar 128 and the electrode E1 of the memory pillar 126 in one of the memory cells MC as shown in FIG. 13A separately connect to the source and drain terminals S, D of the transistors T stacked along the direction Z as shown in FIG. 14. Further, the storage element collectively formed by the electrode E1, the electrode E2 and the switching layer SL sandwiched between the electrode E1 and the electrode E2 of the memory pillar 126 in one of the memory cells MC shown in FIG. 13B, FIG. 13C, FIG. 13D is illustrated as a variable resistor R in FIG. 14. As shown in FIG. 14, the drain terminal D of the transistor T is couple to an end of the variable resistor R. As shown in FIG. 14, one transistor T and one variable resistor R connected to the one transistor T collectively form a memory cell MC. As shown in FIG. 14, the gate terminals G of the transistors T in each stack of the memory cells MC are respectively connected to one of the word lines WL. Further, as shown in FIG. 14, the gate terminals G of the adjacent stacks of the memory cells MC along the direction X are respectively connected to different word lines WL. In some embodiments, the source terminals S of the transistors T in each stack of the memory cells MC are connected together by the corresponding conductive pillar 128, and the drain terminals D of the transistors T and the variable resistors R in each stack of the memory cells MC are connected together by the corresponding memory pillar 126. Accordingly, each stack of the memory cells MC may be regarded as being connected by a NOR-flash configuration, and the three-dimensional memory device 10 may be referred as a three-dimensional NOR memory device.

Figure 15:
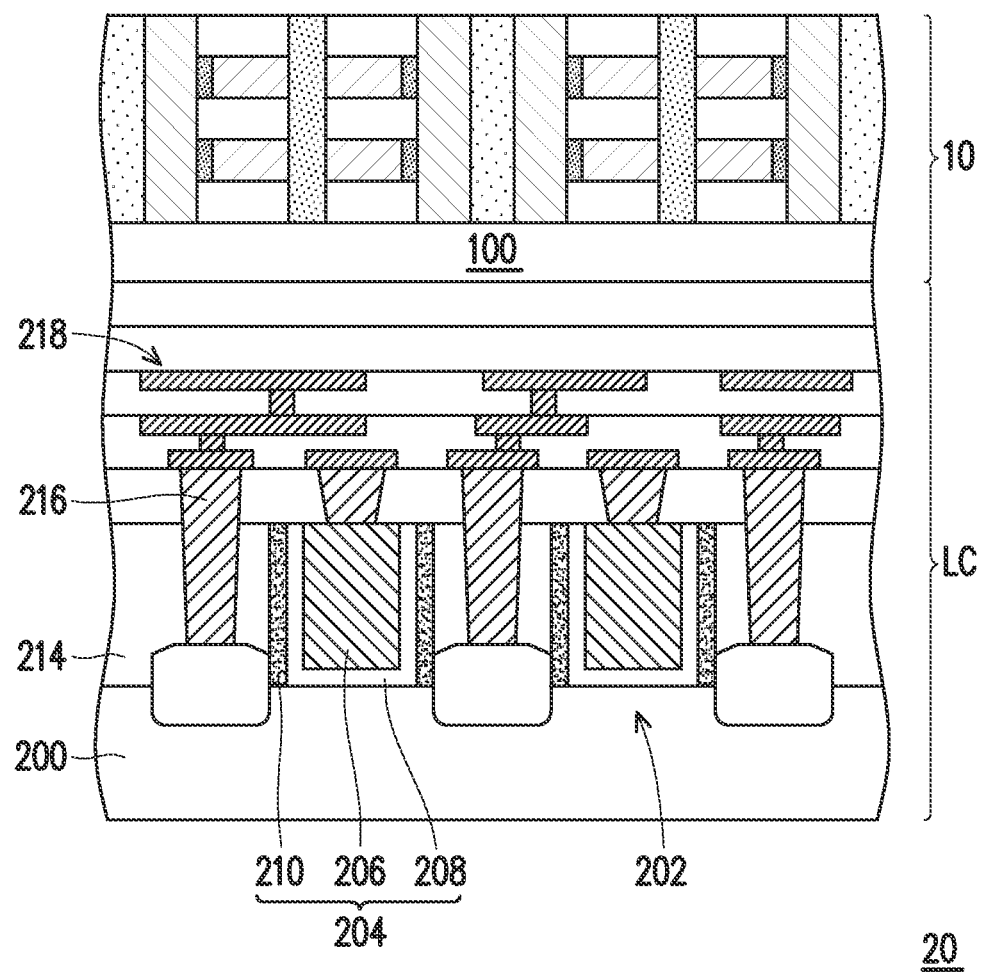
FIG. 15 is a schematic cross-sectional view illustrating a semiconductor structure in accordance with some embodiments of the disclosure.

FIG. 15 is a schematic cross-sectional view illustrating a semiconductor structure 20 in accordance with some embodiments of the disclosure.

Referring to FIGS. 13A-13D and FIG. 15, the semiconductor structure 20 shown in FIG. 15 includes the three-dimensional memory device 10 as described with reference to FIG. 13A-13D. In those embodiments where the substrate 100 of the three-dimensional memory device 10 is an etching stop layer, a CMOS integrated circuit LC may lie under the substrate 100, and the CMOS integrated circuit LC may also be referred as a CMOS-under-array (CUA). Although not shown, the gate layers 118, the memory pillars 126 and the conductive pillars 128 may be routed to the CMOS integrated circuit LC, and the three-dimensional memory device 10 may be controlled by the CMOS integrated circuit LC.

In some embodiments, the CMOS integrated circuit LC is built on a semiconductor substrate 200. The semiconductor substrate 200 may be a semiconductor wafer or a semiconductor-on-insulator (SOI) wafer. The CMOS integrated circuit LC may include active devices formed on a surface region of the semiconductor substrate 200. In some embodiments, the active devices include metal-oxide-semiconductor (MOS) transistors 202. The MOS transistors 202 may respectively include a gate structure 204 formed over the semiconductor substrate 200. In some embodiments, the gate structure 204 includes a gate electrode 206, a gate dielectric layer 208 and a gate spacer 210. The gate dielectric layer 208 may spread between the gate electrode 206 and the semiconductor substrate 200, and may or may not further cover a sidewall of the gate electrode 206. The gate spacer 210 may laterally surround the gate electrode 206 and the gate dielectric layer 208. Further, the MOS transistor 202 may further include source/drain regions 212. The source/drain regions 212 may be formed in the semiconductor substrate 200, and are located at opposite sides of the gate structure 204. In some embodiments, the source/drain regions 212 may be epitaxial structures, and may protrude from a surface of the semiconductor substrate 200. It should be noted that, although the MOS transistors 202 are depicted as planar-type MOS transistors that forms conductive channels (not shown) along the surface of the semiconductor substrate 200, the MOS transistors 202 may alternatively be fin-type MOS transistors (or referred as finFET), gate-all-around (GAA) FETs or the like.

In some embodiments, the CMOS integrated circuit LC further includes dielectric layers 214 stacked on the semiconductor substrate 200, and includes contact plugs 216 and interconnections 218 formed in the stack of dielectric layers 214. A bottommost dielectric layer 214 may laterally surround the gate structures 204, and cover the source/drain regions 212. Some of the contact plugs 216 may penetrate through the bottommost one of the dielectric layers 214, in order to establish electrical connection with the source/drain regions 212, while others of the contact plugs 216 may stand on the gate structures 204 and electrically connect to the gate electrodes 206 of the gate structures 204. The interconnections 218 may spread on the contact plugs 216, and are electrically connected to the contact plugs 216. The interconnections 218 may include conductive traces and conductive vias. The conductive traces respectively lie on one of the dielectric layers 214, whereas the conductive vias respectively penetrate through one or more of the dielectric layers 214 and electrically connect to one or more of the conductive traces.

In some embodiments, the three-dimensional memory device 10 is disposed on the stack of dielectric layers 214. In these embodiments, the gate layers 118, the memory pillars 126, and the conductive pillars 128 of the three-dimensional memory device 10 may be routed to the interconnections 218 in the stack of dielectric layers 214 by conductive paths (not shown) extending through the substrate 100 and the topmost one of the dielectric layers 214. For instance, the gate layers 118 (which may also be referred to as word lines) may be routed to word line drivers formed by some of the active devices interconnected by a portion of the interconnections 218, and the electrodes E2 of the memory pillars 126 and the conductive pillars 128 may be routed to sense amplifiers formed by others of the active devices interconnected by another portion of the interconnections 218.

Figure 16:
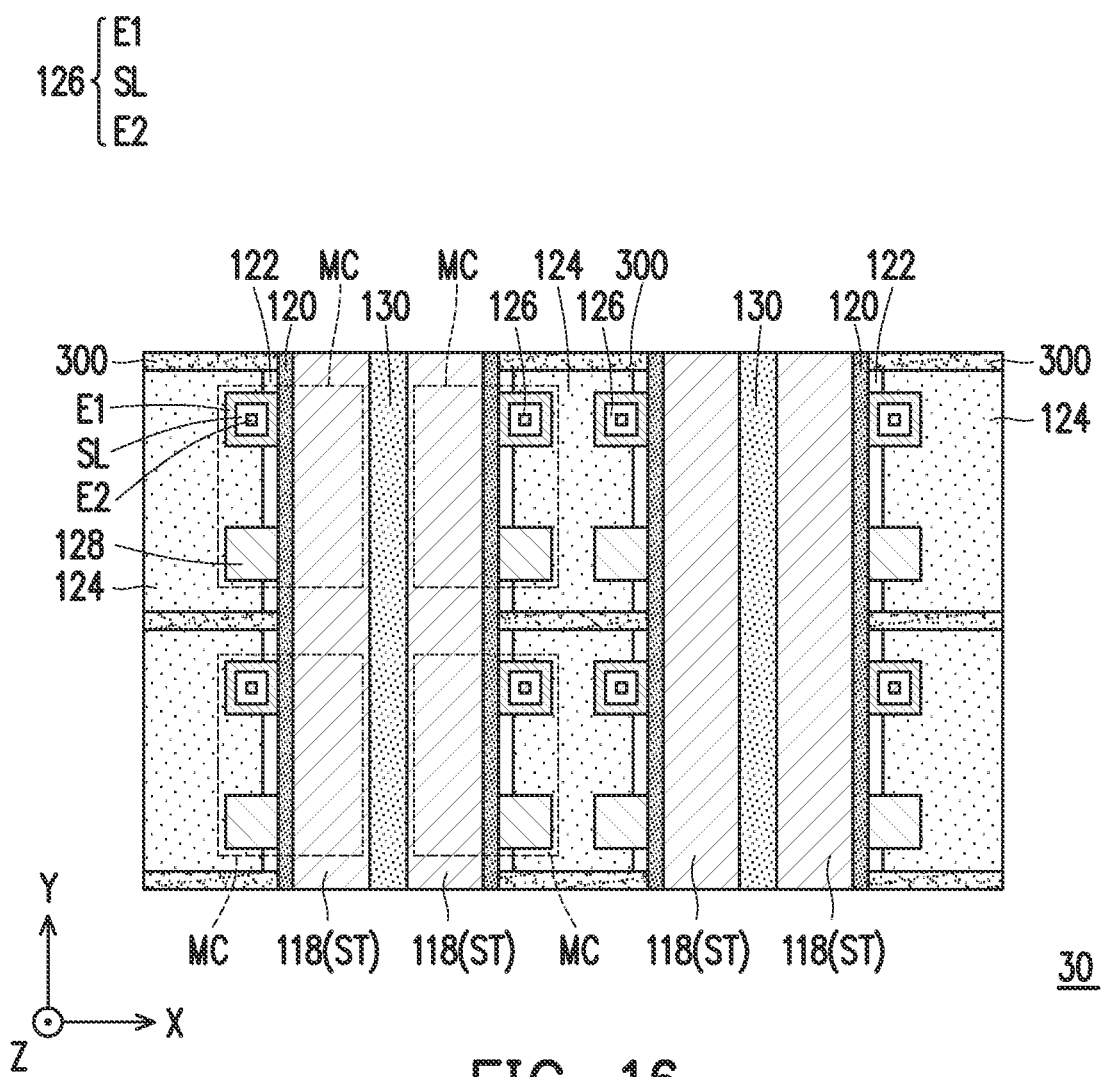
FIG. 16 is a schematic plan view of a three-dimensional memory device in accordance with some alternative embodiments of the present disclosure.

FIG. 16 is a schematic plan view of a three-dimensional memory device 30 in accordance with some alternative embodiments of the present disclosure. The three-dimensional memory device 30 illustrated in FIG. 16 is similar to the three-dimensional memory device 10 illustrated in FIG. 13C, hence the same reference numerals are used to refer to the same or liked parts, and its detailed description will be omitted herein. The differences between the three-dimensional memory device 30 illustrated in FIG. 16 and the three-dimensional memory device 10 illustrated in FIG. 13C will be described below.

Referring to FIG. 16, the three-dimensional memory device 30 further includes insulators 300 penetrating through the dielectric walls 124, the insulating layers 112 and the channel layers 122 along the direction Z. In detail, each insulator 300 vertically extends through the corresponding dielectric wall 124, the corresponding insulating layers 112 and the corresponding channel layers 122. As shown in FIG. 16, each insulator 300 laterally extends to cut off two adjacent channel layers 122 at opposite sides of the corresponding dielectric wall 124 along the direction X. That is to say, the insulator 300 laterally extends between two adjacent stacking structures ST at opposite sides of the corresponding dielectric wall 124 along the direction X. Further, as shown in FIG. 16, the insulator 300 is formed between the laterally adjacent memory cells MC in the column of memory cells MC along the direction Y. In view of this, the channel layers 122 of the laterally adjacent memory cells MC in each column of memory cells MC along the direction Y are separated from each other by one of the insulators 300. That is to say, the channel layers 122 of the laterally adjacent memory cells MC in each column of memory cells MC along the direction Y are physically and electrically separate from each other. In other words, the laterally adjacent memory cells MC in each column of memory cells MC along the direction Y include two separate, independent channel layers 122. Consequently, in the three-dimensional memory device 30, the disturbance between the laterally adjacent memory cells in each column of memory cells MC along the direction Y can be effectively prevented. From another point of view, as shown in FIG. 16, the memory pillar 126 and the conductive pillar 128 in each memory cell MC are disposed between two adjacent insulators 300 along the direction Y. Further, since an insulator 300 laterally extends between two adjacent columns of the memory cells MC at opposite sides of the corresponding dielectric wall 124 along the direction X, the memory pillars 126 and the conductive pillars 128 in two adjacent memory cells MC at opposite sides of one of the dielectric walls 124 are disposed between the same two adjacent insulators 300 along the direction Y. Although nine insulators 300 are presented in FIG. 16 for illustrative purposes, those skilled in the art can understand that the number of the insulators 300 may be more than what is depicted in FIG. 16, and may be designated based on demand and/or design layout.

In the illustrated embodiment, the insulators 300 do not laterally extend through the gate dielectric layers 120 along the direction X. However, the disclosure is not limited thereto. In some alternative embodiments, each insulator 300 further laterally extends to cut off the gate dielectric layers 120 at opposite sides of the corresponding dielectric wall 124 along the direction X.

In some embodiments, the insulators 300 are laterally separated from one another. As shown in FIG. 16, the insulators 300 are separately arranged as having multiple columns extending along the direction Y, and adjacent columns of the insulators 300 are spaced apart from each other along the direction X. In the illustrated embodiment, an insulator 300 is laterally separated from the corresponding memory pillars 126 and/or the corresponding conductive pillars 128. However, the disclosure is not limited thereto. In some alternative embodiments, the insulator 300 may contact the corresponding memory pillars 126 and/or the corresponding conductive pillars 128.

In some embodiments, the method for forming the insulators 300 includes the following steps. First, after the memory pillars 126 and the conductive pillars 128 are formed as described with reference to FIG. 6A to FIG. 9A, FIG. 6B to FIG. 9B, FIG. 6C to FIG. 9C and FIG. 8D to FIG. 9D, trenches penetrating through the dielectric walls 124, the insulating layers 112 and the channel layers 122 along the direction Z are formed by using a lithography process and an etching process. A mask pattern, such as a patterned photoresist, may be formed over the multilayer stack 110. The etching process may then be performed by using the mask pattern as an etching mask to remove portions of the dielectric walls 124, the insulating layers 112 and the channel layers 122 so as to form the trenches. After the etching process is finished, the mask pattern (e.g., patterned photoresist) may be removed by a suitable removal process, such as ashing or stripping. In some embodiments, the etching process is an anisotropic etching process. Next, a dielectric material is formed to fill up in the trenches. The dielectric material may include silicon oxide, silicon nitride, silicon oxynitride, tetraethylorthosilicate (TEOS) oxide, un-doped silicate glass, borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, benzocyclobutene (BCB), SiLK™ (Dow Chemical, Midland, Mich.), polyimide, other low-k dielectric material, or combinations thereof. Herein, the low-k dielectric material used in the insulators 300 between adjacent memory cells MC is able to decrease the crosstalk or the coupling interference between the adjacent memory cells MC, thereby increasing the performance and the reliability of the three-dimensional memory device 30. The dielectric material may be formed by a suitable deposition process such as a CVD process, or an ALD process. After the dielectric material is formed, a planarization process, such as a CMP process, an etching process or a combination thereof, may be performed to remove portions of the dielectric material outside the trenches. In some embodiments, the portions of the dielectric material removed by the planarization process are over the top surface of the topmost insulating layer 112, the top surfaces of the dielectric walls 124, the top surfaces of the memory pillars 126, and the top surfaces of the conductive pillars 128. In some embodiments, the planarization process exposes the multilayer stack 110 and the dielectric walls 124, such that the top surface of the multilayer stack 110 (e.g., the top surface of the topmost insulating layer 112), the top surfaces of the dielectric walls 124 and the top surfaces of the remaining portions of the dielectric material are substantially coplanar or level with one another after the planarization process is complete. The remaining portions of the dielectric material in the trenches form the insulators 300. However, the disclosure is not limited thereto. In some alternative embodiments, the step for forming the insulators 300 may precede the step for forming the memory pillars 126 and the conductive pillars 128.

Figure 17:
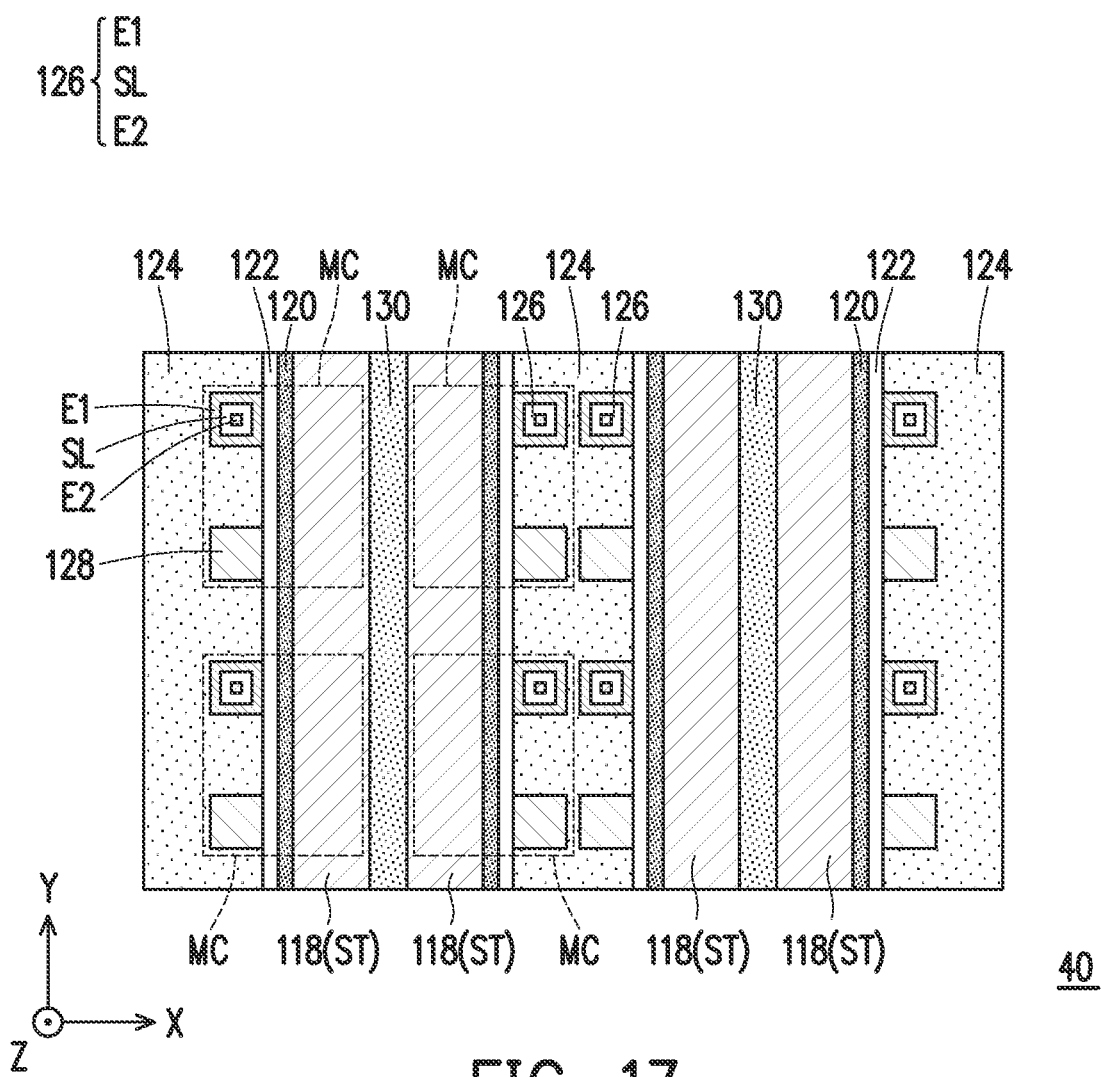
FIG. 17 is a schematic plan view of a three-dimensional memory device in accordance with some alternative embodiments of the present disclosure.

FIG. 17 is a schematic plan view of a three-dimensional memory device in accordance with some alternative embodiments of the present disclosure. The three-dimensional memory device 40 illustrated in FIG. 17 is similar to the three-dimensional memory device 10 illustrated in FIG. 13C, hence the same reference numerals are used to refer to the same or liked parts, and its detailed description will be omitted herein. The differences between the three-dimensional memory device 40 illustrated in FIG. 17 and the three-dimensional memory device 10 illustrated in FIG. 13C will be described below.

Referring to FIG. 17, in the three-dimensional memory device 40, the memory pillars 126 and the conductive pillars 128 penetrate through the dielectric walls 124 along the direction Z without penetrating through the channel layers 122. That is to say, in each memory cell MC, the memory pillar 126 and the conductive pillar 128 are laterally separated from the gate dielectric layer 120 by the channel layer 122. From another point of view, as shown in FIG. 17, each memory pillar 126 is formed to be in lateral contact with one of the corresponding channel layers 122 through one side surface, and each conductive pillar 128 is formed to be in lateral contact with one of the corresponding channel layers 122 through one side surface. In addition, as shown in FIG. 17, the memory pillars 126 and the conductive pillars 128 arranged in the same dielectric wall 124 are laterally separated from one another by such dielectric wall 124. Further, although not shown, the three-dimensional memory device 40 may further include insulators (e.g., 300) between the laterally adjacent memory cells MC along the direction Y as described with reference to FIG. 16.

In the aforesaid embodiments with respect to FIGS. 1A-17, the memory pillars 126 in the same row of the array are all aligned with one another, and the conductive pillars 128 in the same row of the array are all aligned with one another. However, the disclosure is not limited thereto. In some alternative embodiments, the memory pillars 126 may be arranged in a staggered configuration, and the conductive pillars 128 may be arranged in a staggered configuration. Hereinafter, other configurations of the three-dimensional memory device will be discussed in conjunction with FIG. 18.

Figure 18:
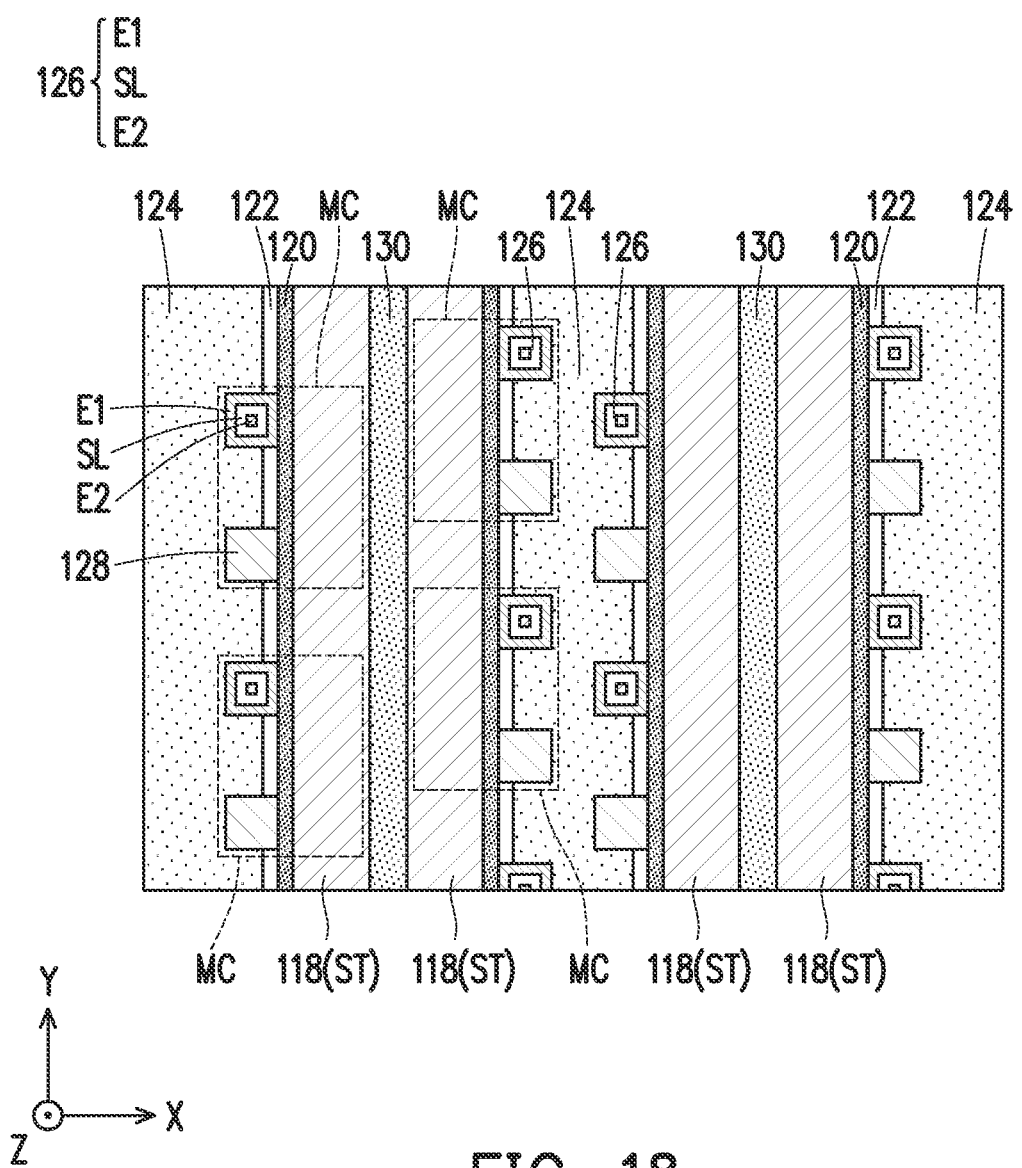
FIG. 18 is a schematic plan view of a three-dimensional memory device in accordance with some alternative embodiments of the present disclosure.

FIG. 18 is a schematic plan view of a three-dimensional memory device in accordance with some alternative embodiments of the present disclosure. The three-dimensional memory device 50 illustrated in FIG. 18 is similar to the three-dimensional memory device 10 illustrated in FIG. 13C, hence the same reference numerals are used to refer to the same or liked parts, and its detailed description will be omitted herein. The differences between the three-dimensional memory device 50 illustrated in FIG. 18 and the three-dimensional memory device 10 illustrated in FIG. 13C will be described below.

Referring to FIG. 18, in three-dimensional memory device 50, the memory pillars 126 are formed in a staggered configuration, and the conductive pillars 128 are formed in a staggered configuration. In detail, the column of the memory pillars 126 and the conductive pillars 128 is offset from the adjacent column of the memory pillars 126 and the conductive pillars 128 along one direction (e.g., the direction Y). For instance, even columns of the memory pillars 126 and the conductive pillars 128 are offset from odd columns of the memory pillars 126 and the conductive pillars 128 along the direction Y. In some embodiments, as shown in FIG. 18, the column of the memory pillars 126 and the conductive pillars 128 is offset from the adjacent column of the memory pillars 126 and the conductive pillars 128 along the direction Y by substantially identical offset amount. In addition, although not shown, the three-dimensional memory device 50 further includes bit lines and source lines electrically connected to the electrodes E2 of the memory pillars 126 and the conductive pillars 128. In some embodiments where columns of the memory pillars 126 and the conductive pillars 128 are alternately offset from others, the electrodes E2 of the memory pillars 126 in adjacent stacks of memory cells MC may be connected to different bit lines, and the conductive pillars 128 in adjacent stacks of memory cells MC may be connected to different source lines. In some embodiments, the source lines and the bit lines all extend above the stacking structures ST. However, the disclosure is not limited thereto. In some alternative embodiments, the bit lines and the source lines are disposed at opposite sides of the substrate 100. Further, although not shown, the three-dimensional memory device 50 may further include insulators between the laterally adjacent memory cells MC along the direction Y as described with reference to FIG. 16.

In the aforesaid embodiments with respect to FIGS. 1A-18, the dielectric walls 130 are disposed to fill up the trenches TR2 in the three-dimensional memory devices 10, 30-50, such that the laterally adjacent memory cells MC at opposite sides of one of the dielectric walls 130 include two separate, independent gate layers 118. However, the disclosure is not limited thereto. In some alternative embodiments, the trenches TR2 are filled up with a conductive material. Hereinafter, other configurations of the three-dimensional memory device will be discussed in conjunction with FIG. 19 and FIG. 20.

Figure 19:
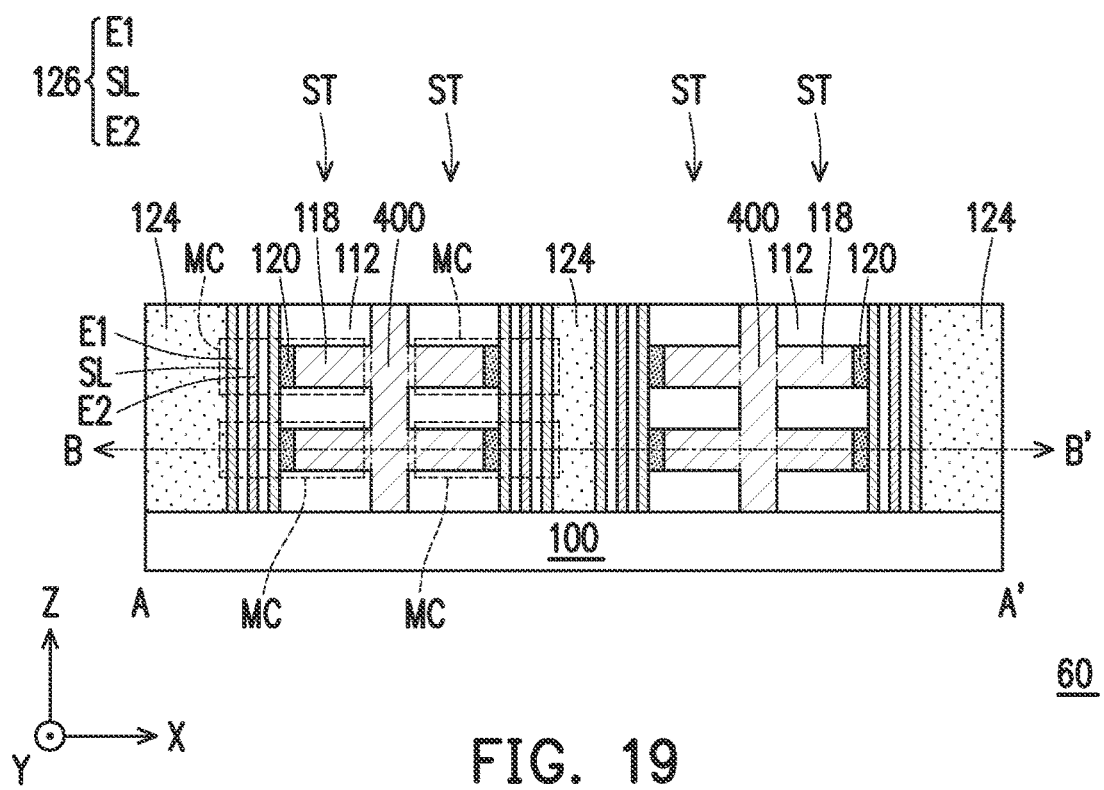
FIG. 19 is a schematic cross-sectional view of a three-dimensional memory device in accordance with some alternative embodiments of the present disclosure.
Figure 20:
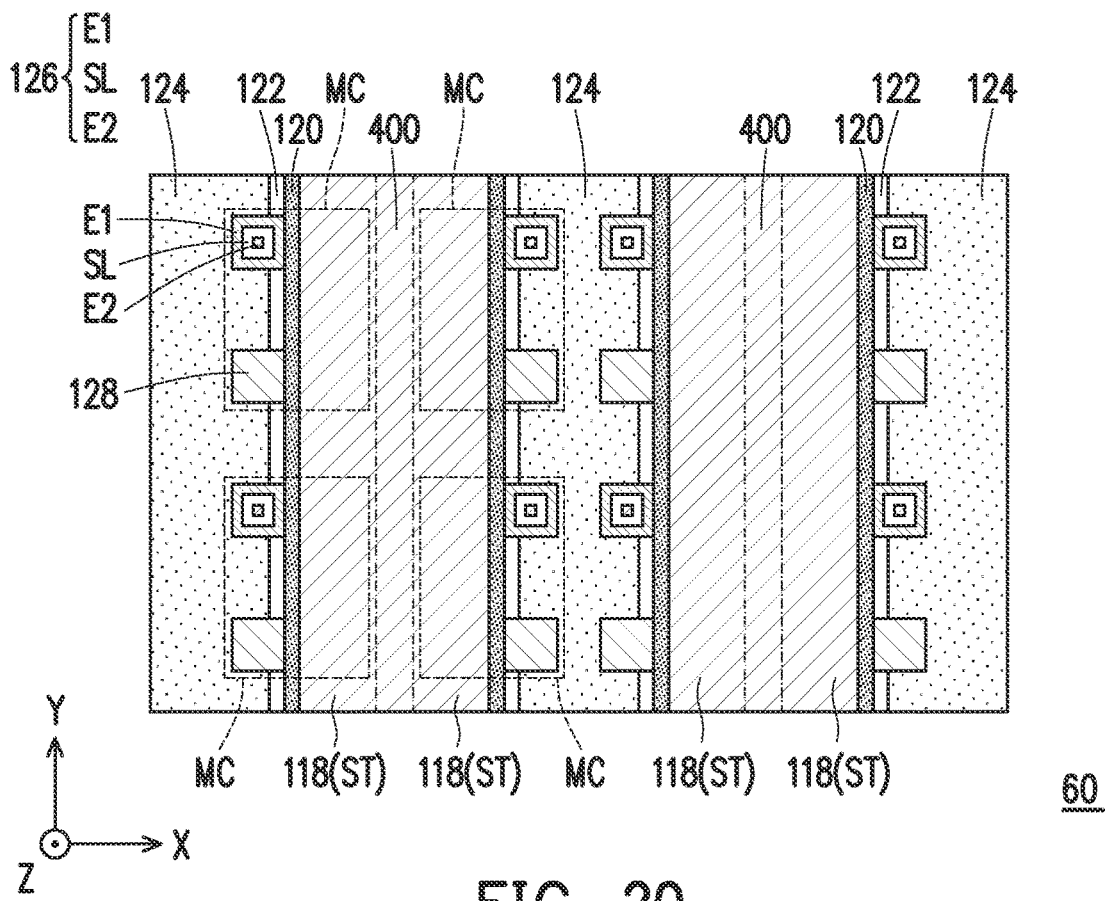
FIG. 20 is a schematic plan view of a three-dimensional memory device in accordance with some alternative embodiments of the present disclosure.

FIG. 19 is a schematic cross-sectional view of a three-dimensional memory device in accordance with some alternative embodiments of the present disclosure. FIG. 20 is a schematic plan view of a three-dimensional memory device in accordance with some alternative embodiments of the present disclosure. FIG. 20 is the schematic plan view along the lines B-B' shown in FIG. 19. The three-dimensional memory device 60 illustrated in FIG. 19 and FIG. 20 is similar to the three-dimensional memory device 10 illustrated in FIG. 13B and FIG. 13C, hence the same reference numerals are used to refer to the same or liked parts, and its detailed description will be omitted herein. The differences between the three-dimensional memory device 60 illustrated in FIG. 19 and FIG. 20 and the three-dimensional memory device 10 illustrated in FIG. 13B and FIG. 13C will be described below.

Referring to FIG. 19 and FIG. 20, conductive walls 400 are formed to fill up the trenches TR2. As shown in FIG. 19 and FIG. 20, the conductive walls 400 are in contact with the side surfaces of the insulating layers 112 exposed by the trenches TR2 and the side surfaces of the gate layers 118 exposed by the trenches TR2. That is to say, a conductive wall 400 is in contact with the side surface of the corresponding insulating layer 112 which is opposite to the another side surface of the corresponding insulating layer 112 in contact with the dielectric wall 124, and in contact with the side surface of the corresponding gate layer 118 which is opposite to the another side surface of the corresponding gate layer 118 in contact with the gate dielectric layer 120. From another point of view, the gate layers 118 of the laterally adjacent memory cells MC at opposite sides of one of the conductive walls 400 are electrically connected with each other by the one of the conductive walls 400. That is to say, the gate layers 118 of the laterally adjacent memory cells MC at opposite sides of one of the conductive walls 400 are not independent.

In some embodiments, the conductive walls 400 and the gate layers 118 are formed in the same process step. In detail, in some embodiments, after the gaps Gp are formed (as described with reference to FIG. 11A, FIG. 11B, FIG. 11C and FIG. 11D), the conductive walls 400 and the gate layers 118 are formed by depositing a gate material over the substrate 100 to fill up the trenches TR2 and the gaps Gp between the insulating layers 112; and then performing a planarization process, such as a CMP process, an etching process or a combination thereof, to remove portions of the gate material outside the trenches TR2. The gate material may be deposited by a CVD process, or an ALD process. In some embodiments, the portions of the gate material removed by the planarization process are over the top surfaces of the topmost insulating layers 112 in the stacking structures ST. That is to say, the planarization process exposes the stacking structures ST such that the top surfaces of the stacking structures ST (e.g., the top surfaces of the topmost insulating layers 112) and the top surfaces of the remaining portions of the gate material are substantially coplanar or level with one another after the planarization process is complete. Some portions of the remaining portions of the gate material covered by the insulating layers 112 and between the insulating layers 112 form the gate layers 118, and the other portions of the remaining portions of the gate material not covered by the insulating layers 112 form the conductive walls 400. In such embodiments, the conductive walls 400 and the gate layers 118 are formed of the same material. However, the disclosure is not limited thereto. In some alternative embodiments, the conductive walls 400 and the gate layers 118 may be formed of different materials. In these embodiments, the conductive walls 400 and the gate layers 118 may be formed in separate process steps.

In accordance with an embodiment, the present disclosure provides a three-dimensional memory device, including: a stacking structure including stacking layers stacked along a vertical direction, wherein each of the stacking layers includes a gate layer, a gate dielectric layer, and a channel layer, wherein the gate layer, the gate dielectric layer, and the channel layer respectively extend along a horizontal direction perpendicular to the vertical direction, and the gate dielectric layer is disposed between the gate layer and the channel layer; memory pillars extending along the vertical direction, laterally separated from one another and in contact with the channel layer of each of the stacking layers, wherein each of the memory pillars includes a first electrode, a switching layer, and a second electrode, the switching layer is disposed between the first electrode and the second electrode, the switching layer wraps around the first electrode, and the second electrode wraps around the switching layer; and conductive pillars extending along the vertical direction, laterally separated from one another and in contact with the channel layer of each of the stacking layers, wherein the memory pillars and the conductive pillars are alternately arranged along the horizontal direction. In some embodiments, the memory pillars penetrate through the channel layer of each of the stacking layers along the vertical direction, and the conductive pillars penetrate through the channel layer of each of the stacking layers along the vertical direction. In some embodiments, the second electrodes of the memory pillars are in contact with the gate dielectric layer of each of the stacking layers, and the conductive pillars are in contact with the gate dielectric layer of each of the stacking layers. In some embodiments, the memory pillars and the conductive pillars are laterally separated from one another by the channel layer of each of the stacking layers. In some embodiments, the memory pillars are laterally separated from the gate dielectric layer of each of the stacking layers by the channel layer of each of the stacking layers, and the conductive pillars are laterally separated from the gate dielectric layer of each of the stacking layers by the channel layer of each of the stacking layers. In some embodiments, the three-dimensional memory device further includes insulators penetrating through the channel layer of each of the stacking layers along the vertical direction, and laterally separated from one another. In some embodiments, one of the memory pillars and one of the conductive pillars adjacent to each other are disposed between two adjacent insulators.

In accordance with an embodiment, the present disclosure provides another three-dimensional memory device, including: a first stacking structure and a second stacking structure disposed on a substrate and laterally spaced apart, wherein the first stacking structure includes first insulating layers and first gate layers vertically alternately stacked, and the second stacking structure includes second insulating layers and second gate layers vertically alternately stacked; a first dielectric wall separating the first gate layers from the second gate layers; first gate dielectric layers beside the first gate layers and each localized between two adjacent first insulating layers; first channel layers beside the first gate dielectric layers and each localized between two adjacent first insulating layers; second gate dielectric layers beside the second gate layers and each localized between two adjacent second insulating layers; second channel layers beside the second gate dielectric layers and each localized between two adjacent second insulating layers; first memory pillars and second memory pillars respectively contacting the first channel layers and the second channel layers, wherein each of the first and second memory pillars includes a first electrode, a second electrode, and a first switching layer between the first and second electrodes; and first conductive pillars and second conductive pillars respectively and laterally alternating with first memory pillars and the second memory pillars and further respectively contacting the first and second channel layers. In some embodiments, the first dielectric wall is in contact with first side surfaces of the first insulating layers, first side surfaces of the second insulating layers, first side surfaces of the first gate layers, and first side surfaces of the second gate layers. In some embodiments, second side surfaces of the first gate layers are laterally recessed from second side surfaces of the first insulating layers, the first gate dielectric layers are respectively in contact with the second side surfaces of the first gate layers, the second side surfaces of the first gate layers are opposite to the first side surfaces of the first gate layers, and the second side surfaces of the first insulating layers are opposite to the first side surfaces of the first insulating layers; and second side surfaces of the second gate layers are laterally recessed from second side surfaces of the second insulating layers, the second gate dielectric layers are respectively in contact with the second side surfaces of the second gate layers, the second side surfaces of the second gate layers are opposite to the first side surfaces of the second gate layers, and the second side surfaces of the second insulating layers are opposite to the first side surfaces of the second insulating layers. In some embodiments, the three-dimensional memory device further includes: a second dielectric wall on the substrate and in contact with the second side surfaces of the first insulating layers and side surfaces of the first channel layers; and a third dielectric wall on the substrate and in contact with the second side surfaces of the second insulating layers and side surfaces of the second channel layers. In some embodiments, the first memory pillars and the first conductive pillars vertically penetrate through the second dielectric wall and the first channel layers, and the second memory pillars and the second conductive pillars vertically penetrate through the third dielectric wall and the second channel layers. In some embodiments, the first conductive pillars vertically penetrate through the second dielectric wall without penetrating through the first channel layers, and the second conductive pillars vertically penetrate through the third dielectric wall without penetrating through the second channel layers. In some embodiments, the three-dimensional memory device further includes: first insulators on the substrate, vertically penetrating through the second dielectric wall and the first channel layers, and laterally separated from one another; and second insulators on the substrate, vertically penetrating through the third dielectric wall and the second channel layers, and laterally separated from one another. In some embodiments, one of the first memory pillars and one of the first conductive pillars adjacent to each other are disposed between two adjacent first insulators; and one of the second memory pillars and one of the second conductive pillars adjacent to each other are disposed between two adjacent second insulators. In some embodiments, each of the first gate layers, each of the second gate layers, each of the first gate dielectric layers, each of the first channel layers, each of second gate dielectric layers, and each of the second channel layers laterally extend over the substrate along a first direction; each of the first gate layers is disposed laterally between the first dielectric wall and one of the first gate dielectric layers along a second direction perpendicular to the first direction; each of the first gate dielectric layers is disposed laterally between one of the first gate layers and one of the first channel layers along the second direction; each of the second gate layers is disposed laterally between the first dielectric wall and one of the second gate dielectric layers along the second direction; and each of the second gate dielectric layers is disposed laterally between one of the second gate layers and one of the second channel layers along the second direction.

In accordance with an embodiment, the present disclosure provides a manufacturing method of a three-dimensional memory device, including: forming a multilayer stack on a substrate, wherein the multilayer stack includes insulating layers and sacrificial layers vertically alternately stacked on the substrate; forming a first trench vertically penetrating through the multilayer stack; removing portions of the sacrificial layers exposed by the first trench to form recesses, wherein each of the recesses is formed between two adjacent insulating layers; forming gate dielectric layers in the recesses to cover side surfaces of remaining portions of the sacrificial layers exposed by the recesses; forming channel layers in the recesses to be in contact with the gate dielectric layers; filling up the first trench with a dielectric material to form a dielectric wall; forming memory pillars vertically penetrating through the dielectric wall, wherein each of the memory pillars includes a first electrode, a switching layer, and a second electrode, the switching layer wraps around the first electrode, and the second electrode wraps around the switching layer; forming conductive pillars vertically penetrating through the dielectric wall; and replacing the remaining portions of the sacrificial layers by gate layers. In some embodiments, the insulating layers and the sacrificial layers include materials with different etching selectivities. In some embodiments, the manufacturing method further includes forming insulators vertically penetrating through the dielectric wall and the channel layers. In some embodiments, the replacing of the remaining portions of the sacrificial layers by the gate layers includes: forming second trenches vertically penetrating through the multilayer stack; removing the remaining portions of the sacrificial layers via the second trenches to form gaps, wherein each of the gaps is formed between two adjacent insulating layers; and forming the gate layers in the gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional memory device, comprising:
   a stacking structure comprising stacking layers stacked along a vertical direction, wherein each of the stacking layers comprises a gate layer, a gate dielectric layer, and a channel layer, wherein the gate layer, the gate dielectric layer, and the channel layer respectively extend along a horizontal direction perpendicular to the vertical direction, and the gate dielectric layer is disposed between the gate layer and the channel layer;
   memory pillars extending along the vertical direction, laterally separated from one another and in contact with the channel layer of each of the stacking layers, wherein each of the memory pillars comprises a first electrode, a switching layer, and a second electrode, the switching layer is disposed between the first electrode and the second electrode, the switching layer wraps around the first electrode, and the second electrode wraps around the switching layer; and
   conductive pillars extending along the vertical direction, laterally separated from one another and in contact with the channel layer of each of the stacking layers, wherein the memory pillars and the conductive pillars are alternately arranged along the horizontal direction.

2. The three-dimensional memory device according to claim 1, wherein the memory pillars penetrate through the channel layer of each of the stacking layers along the vertical direction, and the conductive pillars penetrate through the channel layer of each of the stacking layers along the vertical direction.

3. The three-dimensional memory device according to claim 2, wherein the second electrodes of the memory pillars are in contact with the gate dielectric layer of each of the stacking layers, and the conductive pillars are in contact with the gate dielectric layer of each of the stacking layers.

4. The three-dimensional memory device according to claim 2, wherein the memory pillars and the conductive pillars are laterally separated from one another by the channel layer of each of the stacking layers.

5. The three-dimensional memory device according to claim 1, wherein the memory pillars are laterally separated from the gate dielectric layer of each of the stacking layers by the channel layer of each of the stacking layers, and the conductive pillars are laterally separated from the gate dielectric layer of each of the stacking layers by the channel layer of each of the stacking layers.

6. The three-dimensional memory device according to claim 1, further comprising:
   insulators penetrating through the channel layer of each of the stacking layers along the vertical direction, and laterally separated from one another.

7. The three-dimensional memory device according to claim 6, wherein one of the memory pillars and one of the conductive pillars adjacent to each other are disposed between two adjacent insulators.

8. A three-dimensional memory device, comprising:
   a first stacking structure and a second stacking structure disposed on a substrate and laterally spaced apart, wherein the first stacking structure comprises first insulating layers and first gate layers vertically alternately stacked, and the second stacking structure comprises second insulating layers and second gate layers vertically alternately stacked;
a first dielectric wall separating the first gate layers from the second gate layers;
first gate dielectric layers beside the first gate layers and each localized between two adjacent first insulating layers;
first channel layers beside the first gate dielectric layers and each localized between two adjacent first insulating layers;
second gate dielectric layers beside the second gate layers and each localized between two adjacent second insulating layers;
second channel layers beside the second gate dielectric layers and each localized between two adjacent second insulating layers;
first memory pillars and second memory pillars respectively contacting the first channel layers and the second channel layers, wherein each of the first and second memory pillars comprises a first electrode, a second electrode, and a first switching layer between the first and the second electrodes; and
first conductive pillars and second conductive pillars respectively and laterally alternating with the first memory pillars and the second memory pillars and further respectively contacting the first and second channel layers.

9. The three-dimensional memory device according to claim 8, wherein the first dielectric wall is in contact with first side surfaces of the first insulating layers, first side surfaces of the second insulating layers, first side surfaces of the first gate layers, and first side surfaces of the second gate layers.

10. The three-dimensional memory device according to claim 9, wherein
second side surfaces of the first gate layers are laterally recessed from second side surfaces of the first insulating layers, the first gate dielectric layers are respectively in contact with the second side surfaces of the first gate layers, the second side surfaces of the first gate layers are opposite to the first side surfaces of the first gate layers, and the second side surfaces of the first insulating layers are opposite to the first side surfaces of the first insulating layers; and
second side surfaces of the second gate layers are laterally recessed from second side surfaces of the second insulating layers, the second gate dielectric layers are respectively in contact with the second side surfaces of the second gate layers, the second side surfaces of the second gate layers are opposite to the first side surfaces of the second gate layers, and the second side surfaces of the second insulating layers are opposite to the first side surfaces of the second insulating layers.

11. The three-dimensional memory device according to claim 10, further comprising:
a second dielectric wall on the substrate and in contact with the second side surfaces of the first insulating layers and side surfaces of the first channel layers; and
a third dielectric wall on the substrate and in contact with the second side surfaces of the second insulating layers and side surfaces of the second channel layers.

12. The three-dimensional memory device according to claim 11, wherein the first memory pillars and the first conductive pillars vertically penetrate through the second dielectric wall and the first channel layers, and the second memory pillars and the second conductive pillars vertically penetrate through the third dielectric wall and the second channel layers.

13. The three-dimensional memory device according to claim 11, wherein the first conductive pillars vertically penetrate through the second dielectric wall without penetrating through the first channel layers, and the second conductive pillars vertically penetrate through the third dielectric wall without penetrating through the second channel layers.

14. The three-dimensional memory device according to claim 11, further comprising:
first insulators on the substrate, vertically penetrating through the second dielectric wall and the first channel layers, and laterally separated from one another; and
second insulators on the substrate, vertically penetrating through the third dielectric wall and the second channel layers, and laterally separated from one another.

15. The three-dimensional memory device according to claim 14, wherein
one of the first memory pillars and one of the first conductive pillars adjacent to each other are disposed between two adjacent first insulators; and
one of the second memory pillars and one of the second conductive pillars adjacent to each other are disposed between two adjacent second insulators.

16. The three-dimensional memory device according to claim 8, wherein
each of the first gate layers, each of the second gate layers, each of the first gate dielectric layers, each of the first channel layers, each of second gate dielectric layers, and each of the second channel layers laterally extend over the substrate along a first direction;
each of the first gate layers is disposed laterally between the first dielectric wall and one of the first gate dielectric layers along a second direction perpendicular to the first direction;
each of the first gate dielectric layers is disposed laterally between one of the first gate layers and one of the first channel layers along the second direction;
each of the second gate layers is disposed laterally between the first dielectric wall and one of the second gate dielectric layers along the second direction; and
each of the second gate dielectric layers is disposed laterally between one of the second gate layers and one of the second channel layers along the second direction.

17. A manufacturing method, comprising:
forming a multilayer stack on a substrate, wherein the multilayer stack comprises insulating layers and sacrificial layers vertically alternately stacked on the substrate;
forming a first trench vertically penetrating through the multilayer stack; removing portions of the sacrificial layers exposed by the first trench to form recesses, wherein each of the recesses is formed between two adjacent insulating layers;
forming gate dielectric layers in the recesses to cover side surfaces of remaining portions of the sacrificial layers exposed by the recesses;
forming channel layers in the recesses to be in contact with the gate dielectric layers;
filling up the first trench with a dielectric material to form a dielectric wall;
forming memory pillars vertically penetrating through the dielectric wall, wherein each of the memory pillars comprises a first electrode, a switching layer, and a second electrode, the switching layer wraps around the first electrode, and the second electrode wraps around the switching layer;

forming conductive pillars vertically penetrating through the dielectric wall; and replacing the remaining portions of the sacrificial layers by gate layers.

18. The manufacturing method according to claim 17, wherein the insulating layers and the sacrificial layers comprise materials with different etching selectivities.

19. The manufacturing method according to claim 17, further comprising forming insulators vertically penetrating through the dielectric wall and the channel layers.

20. The manufacturing method according to claim 17, wherein the replacing of the remaining portions of the sacrificial layers by the gate layers comprises:

forming second trenches vertically penetrating through the multilayer stack;

removing the remaining portions of the sacrificial layers via the second trenches to form gaps, wherein each of the gaps is formed between two adjacent insulating layers; and forming the gate layers in the gaps.

* * * * *